(12) United States Patent
Cronin et al.

(10) Patent No.: US 9,922,713 B2
(45) Date of Patent: Mar. 20, 2018

(54) MEMORY DEVICE

(71) Applicant: The University Court of the University of Glasgow, Glasgow, Strathclyde (GB)

(72) Inventors: Leroy Cronin, Strathclyde (GB); Asen Asenov, Strathclyde (GB)

(73) Assignee: The University Court of the University of Glasgow (GB)

( * ) Notice: Subject to any disclaimer, the term of this patent is extended or adjusted under 35 U.S.C. 154(b) by 0 days.

(21) Appl. No.: 15/033,558

(22) PCT Filed: Oct. 30, 2014

(86) PCT No.: PCT/GB2014/053231
§ 371 (c)(1),
(2) Date: Apr. 29, 2016

(87) PCT Pub. No.: WO2015/063492
PCT Pub. Date: May 7, 2015

(65) Prior Publication Data
US 2016/0254058 A1 Sep. 1, 2016

(30) Foreign Application Priority Data

Oct. 31, 2013 (GB) .................................. 1319262.0
Sep. 3, 2014 (GB) .................................. 1415583.2

(51) Int. Cl.
*G11C 11/00* (2006.01)
*G11C 16/10* (2006.01)
(Continued)

(52) U.S. Cl.
CPC .......... *G11C 16/10* (2013.01); *G11C 16/0466* (2013.01); *G11C 16/34* (2013.01);
(Continued)

(58) Field of Classification Search
CPC ..... G11C 16/10; G11C 16/0466; G11C 16/34; H01L 21/28273; H01L 29/42332; H01L 29/7883
(Continued)

(56) References Cited

U.S. PATENT DOCUMENTS 7,501,315 B2 * 3/2009 Heald .................... B82Y 10/00
257/E21.209
2003/0027052 A1 * 2/2003 Huang .............. H01M 10/0562
429/304
(Continued)

OTHER PUBLICATIONS

PCT Search Report for PCT Application No. PCT/GB2014/053231 dated Apr. 1, 2015.
(Continued)

*Primary Examiner* — Viet Q Nguyen
(74) *Attorney, Agent, or Firm* — Colin P. Cahoon; James H. Ortega; Carstens & Cahoon, LLP

(57) ABSTRACT

Provided is an electronic device, such as a flash memory device and/or a write-once-read-once memory device, where the device has a polyoxometallate that is capable of providing and/or accepting one or more electrons. The polyoxometallate may have a Wells-Dawson structure and the polyoxometallate may comprise a cage and optionally one or more guests. Also provided is a method of using the memory device, the method comprising the step of providing to or accepting from the polyoxometalate one or more electrons to provide a polyoxometalate in a reduced or oxidized state.

18 Claims, 27 Drawing Sheets

(51) Int. Cl.
| | |
|---|---|
| H01L 21/28 | (2006.01) |
| G11C 16/04 | (2006.01) |
| G11C 16/34 | (2006.01) |
| H01L 29/423 | (2006.01) |
| H01L 29/788 | (2006.01) |
| H01L 51/00 | (2006.01) |
| H01L 51/05 | (2006.01) |

(52) U.S. Cl.
CPC .. H01L 21/28273 (2013.01); H01L 29/42332 (2013.01); H01L 29/7883 (2013.01); H01L 21/28282 (2013.01); H01L 51/0084 (2013.01); H01L 51/0529 (2013.01)

(58) Field of Classification Search
USPC .................................................. 365/151, 63
See application file for complete search history.

(56) References Cited

U.S. PATENT DOCUMENTS

| | | | |
|---|---|---|---|
| 2008/0118755 A1 | 5/2008 | Whiteford et al. | |
| 2008/0191256 A1* | 8/2008 | Bidan | B82Y 10/00 257/298 |
| 2012/0040181 A1* | 2/2012 | Barattin | B82Y 10/00 428/336 |
| 2012/0091448 A1* | 4/2012 | Ueno | H01L 51/506 257/40 |

OTHER PUBLICATIONS

V.P. Georgiev, et al.; Molecular-Metal-Oxide-nanoelectronicS (M-MOS): Achieving the Molecular Limit; Society for Micro-and Nanoelectronics; Jun. 4, 2013; pp. 128-129.
V.P. Georgiev, et al.; Multi-Scale Computational Framework for the Evaluation of Variability in the Programing Window of a Flash Cell with Molecular Storage; 2013; pp. 230-233.
Nicoleta Joo; New Functionalized Polyoxometalates (POMs) for Molecular Memory Devices Compatible with a CMOS Processing; Sep. 3, 2010; University Joseph-Fourier.
Laia Vila-Nadal, et al.; Towards Polyoxometalate-Cluster-Based Nano-Electronics; Chemical European Journal; Dec. 2, 2013; pp. 16502-16511.
GB Search Report for GB Application No. 1319262.0 dated Apr. 11, 2014.
G. Chaidogiannos, et al.; Tunneling and Negative Resistance Effects for Composite Materials Containing Polyoxometalate Molecules; MicroElectronic Engineering; 2014; pp. 746-751; vol. 73-74.
N. Glezos, et al.; Tunneling Transport in Polyoxometalate Based Composite Materials; Applied Physics Letters; 2003; pp. 488-490; vol. 83 No. 3.
Haisheng Xu, et al.; Synthesis Structures and Properties of Two Novel Charge-Transfer Complexes with the Ratio of Ferrocenyl: POM of 1:1, (Bu4N)[CpFeCpCH2N(C2H5)3][M6O19]; 2010; Solid State Sciences; pp. 1332-1336; vol. 12 No. 8.
Shaoqin Liu, et al.; Polyoxometalate-Based Functional Nanostructured Files: Current Progress and Future Prospects; 2010; Nano Today; pp. 267-281; vol. 5.
3D Vertical NAND Flash Memory; Memory Strategies International; www.memorystrategies.com; Jul. 2013.
De-Liang Long, et al.; Confined Electron-Transfer Reactions within a Molecular Metal Oxide "Trojan Horse"; Angew. Chem. Int. Ed.; 2005, pp. 3415-3419; vol. 44.
De-Liang Long, et al.; Reactions of a {Mo16}-type Polyoxometalate Cluster with Electrophiles: a Synthetic, Theoretical and Magnetic Investigation; Dalton Trans; 2005; pp. 1372-1380; vol. 50.
D.-L. Long; et al.; Towards Polyoxometalate-Integrated Nanosystems; Chem. Eur. J.; 2006; pp. 3698-3706; vol. 12.
L. Cronin et al.—Angew. Chem. Int. Ed. 2002, 41, 2805-2808.
L. Cronin—"The Potential of Pentagonal Building Blocks in Inorganic Chemistry Highlights", Wiley-VCH, Weinheim, 2002, pp. 113-121.
L. Cronin—High Nuclearity Clusters: Iso and Heteropolyoxoanions and Relatives in Comprehensive Coordination Chemistry II, vol. 7, 2004, Elsevier, pp. 1-57.
D.-L. Long et al.—Angew. Chem. Int. Ed. 2004, 43, 1817.
D.-L. Long et al.—Angew. Chem. Int. Ed. 2006, 45, 4798-4803.
D.-L. Long et al.—Chem. Soc. Rev. 2007, 36, 105-121.
D.-L. Long et al.—Angew. Chem. Int. Ed. 2008, 47, 4384-4387.
D.-L. Long et al.—Angew. Chem. Int. Ed. 2010, 49, 1736-1758.
C. Ritchie et al.—Chem. Commun. 2007, 468-470.
R. Tsunashima et al.—Phys. Chem. Chem. Phys. 2011, 13, 7295-7297.
L. Vilà-Nadal et al.—Dalton Trans. 2012, 41, 2264-2271.
L. Vilà-Nadal et al.—Angew. Chem. Int. Ed. 2013, 52, 9695-9699.
L. Vilà-Nadal et al.—Chem. Eur. J. 2013, 19, 16502-16511.
J. Yan et al.—Angew. Chem. Int. Ed. 2009, 48, 4376-4380.
V. P. Georgiev et al.—IEEE Trans. Electron Dev. 2014, 61, 2019-2026.

* cited by examiner

MEMORY DEVICE

RELATED APPLICATIONS

The present application claims the benefit and priority of GB 1319262.0 filed on 31 Oct. 2013, and GB 1415583.2 filed on 3 Sep. 2014, the contents of both of which are hereby incorporated by reference in their entirety.

FIELD OF THE INVENTION

The present invention relates to electronic devices comprising a polyoxometalate, for example a memory cell comprising a polyoxometalate. Also provided are polyoxometalate compounds.

BACKGROUND TO THE INVENTION

Memory cells, especially flash memory and corresponding flash memory cells, are at the heart of many electronic products. Flash memory is now popular consumer memory for smart phones, cameras, memory sticks and so on, and are important especially for portable electronics. Over the last few decades, such memory cells have undergone aggressive scaling to achieve a dramatic reduction in cell size. Recently, the 20 nm half pitch (F) mark has been reached for flash memory cells (ITRS, 2012). This has been accompanied by reduction of tunnel oxide thickness to improve programming/erasing performance. Furthermore, the interpoly dielectric thickness has been reduced to keep the capacitance coupling ratio at an almost constant value, thereby achieving acceptable ratios between the voltages of the control gate and the floating gate (FG). Downscaling of metal-oxide-semiconductor (MOS) flash memory to below 10 nm faces challenges, because alternative molecules proposed to replace MOS flash memory (Joachim et al., 2000) suffer from low electrical conductivity, high resistances, low device yields and finite thermal stability. This limits their ability to integrate into current MOS technologies. There are a number of significant barriers to the realisation of devices within conventional MOS technologies (H. Zhu et al., 2013, P.-C. Chen et al., 2008, J. Shaw et al., 2012, M.-L. Seol et al., 2012, S. J. Tans et al., 1998).

Examples of metal-oxide-semiconductor field effect transistors (MOSFETs) can be found in US 2013/0049140.

Molecular electronics was first conceived in 1973 when Aviram and Ratner speculated about employing organic molecules as components in electronic circuits (A. Aviram and M. Eatner, 1974). The first molecular-based random access memory (RAM) used rotaxanes (J. E. Green et al., 2007). A concentrated effort has been associated with developing novel molecular materials with electron-transport and/or electron-storage properties for decreasing the size of components of future electronic devices to nanometer and sub-nanometer dimensions or for novel applications (C. Joachim et al., 2000; J. E. Green, et al., 2007; A. H. Flood et al., 2004; S. J. Tans et al., 1998). It is generally thought that using individual molecules as the electrical elements in devices has the potential to revolutionize modern technologies, and is necessary for decreasing the size of the components of future electronic devices down to nanometer and sub-nanometer dimensions.

Chemical synthesis in combination with molecular self-assembly of redox-active molecules can yield a very regular distribution (spatially and energetically) of charge-storage centres (T. Pro et al., 2009) and allow scaling of a floating gate in a memory cell down to a few nanometers, as shown using organic redox-active molecules based on ferrocene and porphyrin (J. Shaw et al., 2011). However, these molecules display low retention time due to the small associated redox potentials. Organic molecular electronics also suffer from high resistance, low power and low performance, as well as problematic fabrication, integration into current technology, reproducibility and reliability. Organic molecules are not compatible with the high temperatures required to manufacture optimised MOS technologies with high performance, high density and small real estate.

Conventional memory devices use poly-silicon as the charge storage FG layer. Silicon-oxide-nitride-oxide-silicon (SONOS) non-volatile molecular memories (NVMMs) have a nitride layer of $Si_3N_4$ as FG but suffer significant variability due to the random number and position of traps and trapped charges. Specifically, nitride cells have poorer program/erase properties than other cell types (Memory Strategies International, 2013).

Trap-rich dielectrics and metallic nano-clusters have also been suggested for use in electronic devices. However, both technologies exhibit problems. Charge-trap memories show large variation in trap-density and trap-energy (B. Kumar et al., 2006). The size and density of nano-clusters is difficult to control, which precludes their ultimate miniaturisation (J. Shaw et al., 2009). It is desirable to avoid such non-uniformity in electronic devices. It is especially desirable to avoid non-uniformity in flash memory cells, because it limits the yield and necessitates complex writing protocols.

The further scaling of NAND flash memory devices, for example, faces significant challenges, including:
(i) strong coupling between the poly 1 gates that can result in cross-talk and errors in write and read operation, particularly in multilevel devices; and
(ii) charge loss from the poly 1 gate due to trap assisted tunneling in the tunneling oxide, which is exacerbated in the write/erase cycling process.

These challenges highlight the need for an alternative to traditional floating gate technology. Of particular importance is the hard limit to scaling of the poly 1 to poly 1 pitch along the word line, due to the oxide/nitride/oxide (ONO) thickness on the floating gate side wall. One attempt at solving the above problems was proposed using charge trapping memories (ITRS, 2012), and is based on storing charge inside a silicon nitride of a high-k dielectric. Although the charge trapping approach has had some success, for example suppression of floating gate to floating gate disturbance, immunity to localized defects in the tunneling oxide and corresponding charge leakage, simple integration for embedded memory applications and good scalability, the approach has some significant limitations. Among these problems is that the random number and position of the traps creates significant variability in the threshold voltage of the programmed flash cells, particularly in the case of multilevel operation. This problem occurs despite progressive adaptive writing algorithms (S. M. Amoroso et al., 2010). The problem will be increasingly difficult to overcome as the size decreases.

The use of microcrystal memories has also been suggested as an alternative approach to charge trapping memory cells. In these devices, the charge is stored on semiconductor microcrystals embedded in the cell gate dielectric (L. Forbes, U.S. Pat. No. 5,852,306). Although multiple charges can be stored on a single microcrystal, these sorts of memory also suffer from acute statistical variability due to the size distribution of the microcrystals (typically in the range 2-5 nm). So, different preparation conditions, such as different injection conditions, must be used for microcrystals with different sizes. There is also variation in the memory cell behavior due to the variation in size, number and position of the microcrystals. In combination with the size of the microcrystals, these problems make it difficult to scale memory cells below the 20 nm half pitch mark.

SUMMARY OF THE INVENTION

The present inventors have realised that it is possible to use polyoxometalates (POMs) to receive and give one or more electrons for receiving, storing and imparting information or data in the form of electrons. It is of interest to be able to store electronic information in many fields. To date, the components of electronic devices have not been entirely suitable for purpose, as explained above. One of the advantages of POMs includes, for example, tunability in terms of number of bits of information that can be stored. They are highly redox active and can be doped with electronically active heteroatoms and so present high tunability. Another general advantage is compatibility with present device substrates. POMs could offer a fundamentally better electronic complementarity with $SiO_2$ substrates used in electronic devices than organic molecules due to their oxidic nature. For example, POMs have greater chemical compatibility because they are based upon metal-oxygen bonds, as is $SiO_2$. The integration of various POMs with $SiO_2$ has been experimentally demonstrated using different deposition and self-assembly techniques, achieving regular arrays of controllable POM densities of up to $5$-$7\times10^{13}$ $cm^{-2}$ (A. M. Douvas et al., 2008; B. Fleury et al., 2011; C. Musumeci et al., 2011), which the inventors have also recognised as relevant for flash-type memory cells.

The present inventors have also recognised that POMs provide better integration with the standard gate-stack materials and processing used in contemporary flash-memory technology.

The present invention has been devised in order to address at least one of the problems of the prior art as described above. Preferably, the present invention reduces, ameliorates, avoids or overcomes at least one of the above problems.

In a general aspect, the present invention provides polyoxometalates for use in electronic devices and electronic devices comprising a polyoxometalate.

In a first preferred aspect, the invention provides a memory device comprising a polyoxometalate, wherein the polyoxometalate is capable of providing and/or accepting one or more electrons.

In one embodiment, the memory device has a floating gate (FG) and the FG comprises the polyoxometalate. In one embodiment, the POM is contained within or forms at least part of the FG of the memory device. In one embodiment, the FG is POM. In one embodiment, the memory device is a transistor. In one embodiment, the memory device is a non-volatile molecular memory (NVMM) device. In one embodiment, the memory device is a flash memory device. In one embodiment, the memory device is a NAND memory device. In one embodiment, the memory device is a planar flash device. In one embodiment, the memory device is a 2z or 1x generation planar flash memory device. In one embodiment, the memory device is a 3D flash memory device. In one embodiment, the memory device is a flash random access memory (RAM) device.

In one embodiment, the POM is contained within or forms at least part of the FG of a planar flash memory transistor. In one embodiment, the POM is contained within or forms at least part of the FG of a transistor of a 3D flash memory device. POMs have high tunability, in particular in respect of their redox properties, which may be advantageously exploited in these sorts of memory device.

Particular advantages of using POMs in flash memory applications include: (i) storage of multiple bits corresponding to different redox states; (ii) better compatibility with the gate stack materials typically used in flash memory fabrication and better stability which enables them to better withstand high temperature processing than organic molecules (POMs can be stable at temperatures ranging up to 300° C.); (iii) better electronic complementarity with $SiO_2$ substrates used in electronic devices than organic molecules due to their oxidic nature; and (iv) better uniformity of the storage media can be achieved through self-assembly of the POMs, which leads to a corresponding reduction of the flash cell statistical variability. Initial studies have shown POM cluster stability on metallic and oxide surfaces, and so are expected to be compatible with gate materials of these types. POMs have a regular structure and can be self-assembled in regular arrays, which is valuable for the precise and repeated preparation of memory devices according to the invention. Their greater retention time on metal-oxide surfaces also leads to improved storage of information.

In a second preferred aspect, the invention provides an electronic device incorporating the memory device of the first aspect.

In a third preferred aspect, the invention provides use of POMs in memory devices according to the first and/or second aspects. In one embodiment, the POM is used as a providing and/or donating agent in the memory devices according to the first and/or second aspects.

In a fourth preferred aspect, the invention provides a method of writing and deleting information from a memory device, the method comprising providing and/or accepting one or more electrons from the POM.

In a further aspect there is provided a polyoxometalate of formula $[M_{18}O_{54}(SeO_j)_2]^{4-}$, where j is 3 or 4, and M is W or Mo. In one embodiment, the POM has the formula $[W_{18}O_{54}(SeO_3)_2]$. In one embodiment, the $[W_{18}O_{54}(SeO_3)_2]$ POM is the α-form.

In one embodiment, the POM is capable of providing and/or accepting two or more electrons. POMs with multiple redox configurations are advantageous because the greater electron providing and/or accepting capability translates in the device to greater information storage potential.

In one embodiment, the polyoxometalate has a cage and optionally one or more guests. In one embodiment, the one or more guests comprise a heteroatom. In one embodiment, the polyoxometalate has a Wells-Dawson structure. Guest-containing POMs are generally more stable in the solid state than other types, e.g. those without guests because there are more polar bonds supporting the inside of the oxide structures, and advantageously can offer greater scope for electron provision and/or acceptance, potentially leading to multi-bit information storage. Wells-Dawson POMs have better redox properties compared to prior art molecules.

In one embodiment, the cage is capable of providing and/or accepting one or more electrons under a potential of between −2,500 mV and 1,500 mV. In one embodiment, each guest is capable of providing and/or accepting one or more electrons under a potential of between −2,500 mV and 1,500 mV. In one embodiment, each of the cage and the one or more guests is independently capable of providing and/or accepting one or more electrons under a potential of between −2,500 mV and 1,500 mV. In one embodiment, each of the cage and the one or more guess is independently capable of providing and/or accepting two electrons under a potential of between −2,500 mV and −1,500 mV. This advantageously allows controllable switching and greater scope for multi-bit storage while maintaining space-efficiency. Potentials may be determined using cyclic voltammetry against an Ag electrode.

In one embodiment, the memory device has a single POM molecule. This may be desirable because it leads to ultimate miniaturization and is therefore cost and space-efficient. A monolayer arrangement in particular provides a safeguard against variability in the FG configuration.

In one embodiment, the memory device has a plurality of POM molecules, which may be arranged in a plurality of layers. This arrangement leads to greater electron movement and therefore potential for information storage.

Other aspects and embodiments of the invention are described in further details below.

DESCRIPTION OF THE FIGURES

FIG. 2 (a) is a schematic representation of a single-transistor NVMM cell with an FG comprising a layer of POMs. A single POM in the FG between the oxide layers is shown in the enlarged portion.

FIG. 2 (b) shows transfer characteristics (source-drain current/versus the control gate bias or gate voltage V) of the device of FIG. 2 (a). Line E is the erased cell and line P is the programmed cell.

FIG. 2 (c) is a schematic cross-section of two POM-based NAND flash cells with minimum feature size (cell pitch and half-cell pitch).

DETAILED DESCRIPTION OF THE INVENTION

Figure 1:
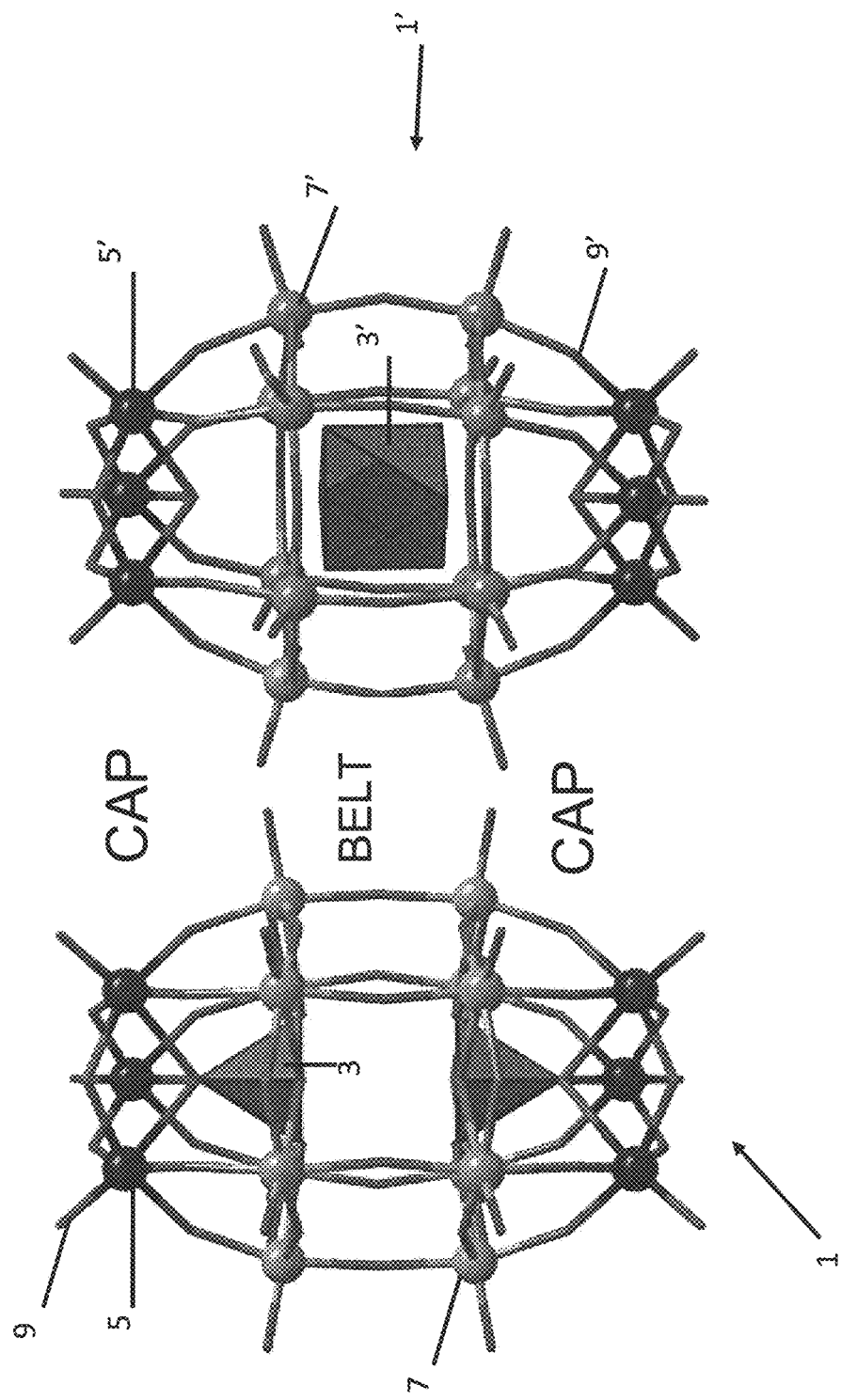

The present inventors realised that having molecular charge storage memory solutions compatible with standard silicon flash manufacturing would be advantageous, and that these solutions would ideally be suitable for both single- and multi-level devices, while overcoming one or more of the above-described deficiencies within present devices.

In general, transition metal oxides exhibit a rich collection of electronic properties and have many practical applications in areas such as catalysis and ultra-high-density magnetic data storage. Therefore, the present inventors consider that the development of switchable molecular transition metal oxides has potential for the engineering of single-molecule devices and nano-scale electronics. The electronic properties of transition metal oxides can be tailored through the irreversible introduction of dopant ions, modifying the electronic structure by either injecting electrons or core holes. The present inventors have previously considered that use of polyoxometalates (POMs) in nano-systems or nano-devices to realise POM-based functional or integrated nano-systems presents considerable developmental challenges (D.-L. Long and L. Cronin, 2006). That work proposed the use POMs for semipermeable inorganic membranes. Also proposed was the use of POMs for hybrid devices having both POM molecules and organic conductors and polymers.

In addition, it was been suggested to exploit those POMs with thermochromic and thermal switching capabilities in nanodevices. There was no suggestion to use POMs in memory devices, and no supporting analysis for such was foreseen. In particular, there was no suggestion that POMs might be exploited for potential use in storing data as charge.

The present inventors have realised that POMs can form the semiconducting and metallic states essential for low power electronics (see for example D.-L. Long et al., Angew. Chem. Int. Ed., 2005; D.-L. Long et al., Dalton Trans., 2005), and furthermore that the chemistry of the POMs, being oxygen rich clusters (molecular metal oxides), could lead to good complementarity with silicon substrates in electronic devices.

The present inventors have devised and implemented a robust model that demonstrates the suitability of different types of POM molecule for use in an electronic device. This modelling, described herein, allows the present inventors to make predictions about the behaviour of POMs in an electronic device based on solid experimental evidence.

The ability to fabricate large CMOS-based device arrays incorporating electronically active and chemically compatible molecules is currently lacking. Herein is described an integrated, scalable and complementary metal-oxide-semiconductor (CMOS)-compatible metal oxide clusters as functional components for electronic memory devices which can scale down to the nanoscale. The present inventors show that a metal oxide molecule is compatible with current technology and highly configurable at the atomic-level with atom-by atom control of the switching properties. Using a combination of theoretical modelling, molecular nano-scale design (embedding in individual functional atoms into a metal oxide cage cluster) supramolecular chemical design and synthesis strategies, device modelling, and device fabrication (Lewis et al., 2005), the inventors have prepared molecular metal oxide memory devices, such as a flash memory. Two devices are presented as representative of the uses for a metal oxide in an electronic device.

A molecular metal oxide flash memory is exemplified, and the function of this memory device is made possible by the n-type behaviour of, for example, selenium a metal oxide cluster and also an unprecedented new type of memory behaviour: 'write-once-read-once' memory. Such has potential as a new super-secure storage space that can only be read once by the intended recipient and which exploits the p-type function of the clusters with the embedded metal atoms, such as selenium atoms in the +4 oxidation state. Further the inventors show that the source of the p-type function is the identification of a new oxidation state for metals such as selenium, a +5 oxidation state, and that the devices are easily fabricated and do not require individual molecular-level control of the orientation of the clusters within the electrode architecture.

POM

Polyoxometalates or polyoxometallates (also known as polyoxometalate clusters, polyoxometalate cluster molecules, and abbreviated as POMs, POM clusters or POM cluster molecules) are discrete metal oxide units formed from metal ions linked by oxo bridges. In one embodiment, the POM is anionic. In one embodiment, the POM is an oxo-anion of a transition metal cluster. In one embodiment, the POM is an acidic POM. In one embodiment, the POM is an alkaline POM. References to a POM include references to hydrated forms.

The large number of structural types in POM chemistry (M. T. Pope, 1987) can be broadly split into three classes, any of which may be suitable for use in the device of the present invention:
  (i) heteropolyanions, which include heteroions such as $SO_4^{2-}$ and $PO_4^{3-}$ of which Keggin $[XM_{12}O_{40}]$ and Wells-Dawson $[X_2M_{18}O_{54}]$ (in which M=W or Mo) anions are fundamental examples;
  (ii) isopolyanions, which do not have a guest; and
  (iii) Mo-blue and Mo-brown reduced Mo-based POM clusters.

As a family, POMs provide a structurally diverse range of molecules, having useful physical properties. They are generally anionic, range in size over several length scales from nano- to macro-molecular (D.-L. Long and L. Cronin, 2006), and can be prepared by self-assembly processes under "one-pot" reaction conditions (L. Cronin, 2004) which makes them attractive for precise applications. POMs also show exceptional thermal stability, e.g. up to around 600° C.

POM-based materials have many interesting physical properties (R. Neumann et al., 1998; D. E. Katsoulis, 1998; T. Yamase, 1998; T. Rüther et al., 2003; T. M. Anderson et al., 2004; A. Müller et al., 2003), such as their versatile structures, their ability to delocalise electrons over the surface of the clusters, their ability to incorporate heteroanions, electrophiles and ligands, and to encapsulate guest molecules within a metal oxide based cage. POMs have been shown to exhibit superacidity and catalytic activity (R. Neumann et al. 1998), photochemical activity, bistability, cooperative electronic phenomena, and ionic conductivity (D. E. Katsoulis, 1998; T. Yamase 1998), reversible redox behaviour (T. Rüther et al., 2003), the ability to stabilise highly reactive species (T. M. Anderson et al., 2004) and extensive host-guest chemistry (A. Müller et al., 2003). Ligands and electrophiles can also be grafted or incorporated (D.-L. Long and L. Cronin, 2006).

Broadly, a POM suitable for use in the invention is a charge carrier. The POM may be described as a charge acceptor and/or donor. POMs that are suitable for use in the electronic devices of the present invention are redox-active. That is, they are capable of undergoing at least one-electron reduction and oxidation. In this way, the charge retained and/or accepted and/or provided by the POM may be in the form of electrons. In one embodiment, the reduction or oxidation of the POM may be associated with the gain or loss of $H^+$ (a proton) from or to the POM. Thus one cluster molecule may retain one or more protons. The present invention makes use of a POM that has (at least) two different oxidation states, which oxidation states may be accessed by oxidation or reduction from one state to the other. In one embodiment the POM is thermally and oxidatively stable in both the oxidised form and the reduced form. In one embodiment, the POM is capable of providing and/or accepting one or more electrons. In one embodiment, the POM is capable of providing and/or accepting two or more electrons.

In one embodiment, a reference to a POM is a reference to a reduced POM. Such a POM may therefore be oxidised (to give an oxidised POM). In one embodiment, a reference to a POM is a reference to an oxidised POM. Such a POM may therefore be reduced (to give a reduced POM). In context it will be apparent whether reference is intended to be to the reduced or oxidised POM.

In one embodiment, the POM is capable of undergoing controllable multi-electron transfers; that is, capable of being oxidized or reduced by one electron at a time, to oxidation states of two, three, four or more, for example. The redox properties of the POM used in the invention advantageously confers the ability to hold and/or release electrons thereby allowing the storage and optionally transfer of information.

Multiple redox states (e.g. can be multiply reduced or multiply oxidized) may be particularly suited in the present invention because they can be exploited as a safeguard against variability or to realise multi-bit storage cells.

In one embodiment, the POM shows an "n-type" semiconductor activity (behaviour). In one embodiment, the POM shows a "p-type" semiconductor activity. Preferably, the POM shows both n-type and p-type semiconductor behaviour.

In one embodiment, reduction and/or oxidation is reversible. In one embodiment, the POM can undergo reversible reduction and/or oxidation multiple times.

In one embodiment, the POM has a reduction and/or oxidation potential between −2,500 mV and 1,500 mV. In one embodiment, the POM has a reduction and/or oxidation potential between −2,250 mV and 1,000 mV, between −2,000 and −500 mV, between −1,750 mV and −700 mV. In one embodiment, the POM has a reduction and/or oxidation potential between −1,500 mV and −800 mV. In one embodiment, the POM has a reduction and/or oxidation potential of between −2,500 mV and −250 mV. In one embodiment, the POM has a reduction and/or oxidation potential of at least 1,500 mV, at least 1,300 mV, at least 1,000 mV, at least 250 mV, at least −250 mV, at least −300 mV, at least −400 mV, at least −450 mV, at least −475 mV. In one embodiment, the POM has a reduction and/or oxidation potential of at most −2,500 mV, at most −2,450 mV, at most −2,400 mV, at most −2,350 mV, at most −2,300 mV, at most −2,275 mV.

In one embodiment, the POM shows reversible oxidation and reduction cycles.

In one embodiment, the POM shows two-electron reduction and/or oxidation. In one embodiment, one-electron reduction and/or oxidation occurs independently of the second electron reduction and/or oxidation. In one embodiment, the first and second reduction and/or oxidation potentials are separated by around 1,000-1,200 mV, by around 550-750 mV. In one embodiment, the first- and second-reduction and/or oxidations are separated by around 500 mV.

In one embodiment the POM has a first reduction and/or oxidation at around −1,600 to −1,000 mV and a second reduction and/or oxidation at around −1,000 to −500 mV. In one embodiment, the POM has a first reduction and/or oxidation at around −1,500 to −1,100 mV and a second reduction and/or oxidation at around −1,100 to −750 mV.

In one embodiment, the POM has a first oxidation and/or reduction potential of at least −800 mV, at least −850 mV, at least −900 mV, at least −950 mV, at least −975 mV. In one embodiment, the POM has a first oxidation and/or reduction potential of at most −1,800 mV, at most −1,750 mV, at most −1,700 mV, at most −1,650 mV, at most −1,625 mV. In one embodiment, the POM has a first oxidation and/or reduction potential at between −1,800 to −800 mV.

In one embodiment, the POM has a second oxidation and/or reduction potential of at least −300 mV, at least −350 mV, at least −400 mV, at least −450 mV, at least −475 mV. In one embodiment, the POM has a second oxidation and/or reduction potential of at most −1,700 mV, at most −1,650 mV, at most −1,600 mV, at most −1,550 mV, at most −1,525 mV. In one embodiment, the POM has a second oxidation and/or reduction potential of between −1,700 to −300 mV.

The oxidation and/or reduction potentials may generally refer to oxidation and/or reduction potentials as measured using cyclic voltammetry, with an Ag reference electrode in tetrabutylammonium hexafluorophosphate.

In one embodiment, the POM has a reduction energy of between −8 and −1 eV, between −6.5 and −1.5 eV, between −6 and 2.5 eV, between −5.5 and −3.7 eV. In one embodiment, the POM has a reduction energy of at least −1 eV, at least −1.5 eV, at least −2 eV, at least −2.5 eV, at least −3 eV, at least −3.5 eV. In one embodiment, the POM has a reduction energy of at most −8 eV, at most −7.5 eV, at most −7 eV, at most −6.5 eV, at most −6 eV, at most −5.5 eV.

The reduction energy may refer to reduction potentials theoretically estimated by calculating the free energy associated with the process of reducing a fully oxidised POM, and replacing the entropic and vibrational contributions by the electronic contribution in solution.

In one embodiment, the POM has an absolute value for the first cathodic peak ($E_{1/2}$) (vs. $Fc^+/Fc$) of between 1.5 and −3 V, between 1.0 and −2.5 V, between 0.5 and −1.5 V, between 0 and −0.5 V, between −0.005 and −0.4 V, between −0.01 and −0.35 V. In one embodiment, the POM has an $E_{1/2}$ (vs $Fc^+/Fc$) of at least 0, at least −0.001, at least 0.003, at least 0.005, at least 0.007, at least 0.001. In one embodiment, the POM has an $E_{1/2}$ (vs. $Fc^+/Fc$) of at most −1.00 V, at most −0.85 V, at most −0.75 V, at most −0.65 V, at most −0.50 V.

The cathodic peaks for Dawson clusters may generally be determined using a potentiostat with a three-electrode set-up of a working electrode, a reference electrode and a counter electrode, for example.

In one embodiment, the HOMO and LUMO energies of the POM are separated by between around 0.5 and 5 eV, by between around 0.75 and 3 eV, by between around 0.8 and 2.5 eV, by between around 0.88 and 2.27 eV. In one embodiment, the POM has a gap between the energies of the HOMO and LUMO of between 0.5 and 1 eV.

In one embodiment, the energy of the HOMO is at least −5.5 eV, at least −5.75 eV, at least −6 eV. In one embodiment, the energy of the HOMO is at most −8 eV, at most −7.75 eV, at most −7.5 eV, at most −7.25 eV, at most −7 eV. In one embodiment, the energy of the HOMO is between around −5.8 eV to −7.3 eV, between around −5.9 to −7.1 eV, between around −6 to −6.9 eV.

In one embodiment, the energy of the LUMO is at least −4 eV, at least −4.2 eV, at least −4.4 eV, at least −4.6 eV. In one embodiment, the energy of the LUMO is at most −6 eV, at most −5.75 eV, at most −5.5 eV, at most −5.25 eV. In one embodiment, the energy of the LUMO is between around −4.25 to −5.8 eV, between around −4.5 to −5.3 eV, between around −4.6 eV to −5.2 eV.

The HOMO and LUMO energies may generally be determined experimentally using discrete Fourier transform (DFT) using the atomic coordinates of a POM determined by X-ray spectroscopy.

Unless stated otherwise, references to metal atoms, oxygen atoms and metal oxide refer to the POM cluster and not to any guest or ligand that may be attached to the POM. The metal oxide portion may be a cage.

The metal oxide of POM molecules is sometimes ascribed the general formula of $(MO_x)_y$. The number of oxygen atoms x is determined by the metal atoms present in the POM and the particular structure adopted by the cluster. The number of metal atoms y should be more than one. In one embodiment, the POM molecule has between 2 and 400 metal atoms, between 5 and 300 metal atoms, between 10 and 200 metal atoms, between 15 and 100 metal atoms. In one embodiment, the POM has 2, 3, 5, 6, 7, 8, 9, 10, 12, 14, 16, 18, 24, 36, 48, 72, 132, 148, 154, 256, or 368 metal atoms. In one embodiment, the POM molecule has 5, 6, 9, 10, 12, 18, or 36 metal atoms. In one embodiment, the POM molecule has 12 or 18 metal atoms. In one embodiment, the POM molecule has at least 2, at least 10, at least 12, at least 16 metal atoms. In one embodiment, the POM molecule has at most 400, at most 154, at most 24, at most 18 metal atoms.

The number of oxygen atoms in the cluster can be correspondingly derived. The number of oxygen atoms may be dependent on the redox state of the metal atom. In one embodiment, x may be any one of 4, 5, 6 or 7. In one embodiment, the POM has 40 oxygen atoms. In one embodiment, the POM has 54 oxygen atoms. In one embodiment, the POM has between 10 and 3,000 oxygen atoms, between 12 and 2,500 oxygen atoms, between 12 and 1,500 oxygen atoms. In one embodiment, the POM has at least 8, at least 10, at least 12, at least 14, at least 20 oxygen atoms. In one embodiment, the POM has at most 3,000 oxygen atoms, at most 2,600 oxygen atoms, at most 2,000 oxygen atoms, at most 1,500 oxygen atoms.

In one embodiment, the POM has the general formula $[M_aO_bG_c]^{m-}$, wherein M is W or Mo, a is 12, 18 or 36, b is 40, 54 or 62, G is a guest molecule as detailed below, c is 0, 1 or 2, and m is between 2 and 10, for example 2, 3, 4, 5, 6, 7, 8, 9 or 10. In one embodiment, the POM may have the formula $[M_{12}O_{40}G]^{m-}$. In one embodiment, the POM may have the formula $[M_{18}O_{54}G_2]^{m-}$. In one embodiment, the POM may have the formula $[M_{18}O_{62}G_2]^{m-}$.

In one embodiment, the metal atoms of the metal oxide each have the same valence number. In one embodiment, the metal oxide has mixed valence metal atoms; that is, the POM has metal atoms with a different valence number to other metal atoms in the metal oxide.

In one embodiment, the metal atoms of the metal oxide are one of W, Mo, V, Nb, Mn, Ti and Fe or any combination thereof. In one embodiment, the metal oxide comprises one of W, Mo, V, and Nb atoms or any combination thereof. In one embodiment, the metal atoms are Mo and/or W. In one embodiment, the metal oxide has only one type of metal atom. In one embodiment, the metal oxide has more than one type of metal atom. In these embodiments, the metal oxide refers to the POM metal oxide (in some embodiments a cage) without any encapsulated guest or attached ligand.

In one embodiment, the POM has a cage structure. In one embodiment, the POM has a ring topology. In one embodiment, the POM has a wheel shape. In one embodiment, the POM has a spherical shape. In one embodiment, one or more POM $MO_x$ units are absent giving a defective structure (lacunary structure).

In one embodiment, the POM has any one of a Lindqvist structure, a Strandberg structure, an Anderson structure, an Allman-Waugh structure, a Weakley-Yamase structure, a Dexter structure, a Keggin structure, or a Wells-Dawson structure. In one embodiment, the POM has a Keggin structure. In one embodiment, the POM has a Wells-Dawson structure.

In one embodiment, the POM is a Wells-Dawson POM. In one embodiment, the POM is a conventional Wells-Dawson POM. In one embodiment the conventional (classical) 18 metal ion Wells-Dawson has a general formula $[M_{18}O_{54}(XO_4)_2]^{m-}$. In one embodiment, M is Mo and/or W. In one embodiment, X is P, As and/or S.

In one embodiment, the POM is a non-conventional (non-classical or non-classic) Wells-Dawson POM. Non-conventional Wells-Dawson POMs may be ascribed general formula $[M_{18}O_{54}Y]^{m-}$ where Y represents a non-tetrahedral ion. In one embodiment, the ion is pyramidal. In one embodiment, the ion is octahedral.

Classical and non-classical Wells-Dawson POMs generally have substantially higher redox potentials compared to organic redox-active molecules. Having a great number of redox states is one reason why POMs are better candidates than organic molecules for use in memory devices.

In one embodiment, the POM has any one of the above structures when the POM is in an oxidised form. In one embodiment, the POM has any one of the above structures when the POM is in a reduced form.

In one embodiment, the POM has a theoretical M-O-M interatomic angle of between 130 to 175°, between 140 to 170°, or between 145 to 165°. In one embodiment, the POM has a theoretical M-O-M interatomic angle of at least 128°, at least 130°, at least 132°, at least 135°, at least 137°, or at least 140°. In one embodiment, the POM has a theoretical M-O-M interatomic angle of at most 178°, at most 176°, at most 174°, at most 172°, or at most 168°.

Theoretical M-O-M interatomic angles may be determined by using x-ray diffraction techniques to identify atomic positions to create a three-dimensional image or model of the structure. Interatomic angles can then be calculated.

Broadly, the POM for use in an electronic device may have any metal oxide structure. The POM may have one or more grafted ligands. In one embodiment, the ligand is grafted onto the cage.

In one embodiment, POMs having a cage structure have one or more guests inside the cage. In one embodiment, POMs having a cage structure do not have a guest inside the cage.

As used below, references to metal atoms, oxygen atoms and other atoms refer to the guest atoms unless stated otherwise.

In one embodiment, the POM comprises a cage and optionally one or more guests. In one embodiment, the POM comprises a cage and one or more guests. In one embodiment, the cage surrounds the one or more guests. In one embodiment the guest does not comprise a heteroatom; that is, the guest has no atoms different to the atoms of the cage. In one embodiment, the guest comprises a heteroatom; that is, the guest comprises one or more atoms that are different from the atoms making up the cage. In one embodiment, the guest comprises one or more heteroatoms.

One advantage of using a POM with a guest molecule is that it may provide a compact route to obtaining a variety of redox states.

In one embodiment, the cage is capable of providing and/or accepting one or more electrons under a potential of between −2,250 mV and −500 mV. In one embodiment, the guest is capable of providing and/or accepting one or more electrons under a potential of between −2,250 mV and −500 mV. In one embodiment, each of the cage and the one or more guests is independently capable of providing and/or accepting one or more electrons under a potential of between −2,250 mV and −500 mV. Potentials may be determined using cyclic voltammetry against an Ag/AgCl electrode.

In one embodiment the guest is not redox active (it is redox inactive or redox inert). Generally, such a guest will not accept or donate electrons or holes unless a potential greater than 0 V, for example greater than 10 V, is applied. In one embodiment the guest is redox active. That is, the guest may have (at least) two different oxidation states, which oxidation states may be accessed by oxidation or reduction from one state to the other. In one embodiment, the guest has more than two different oxidations states, which may be accessed by oxidation or reduction from one state to another state.

In one embodiment the guest and cage have independent redox activity. That is, the cage and guest each have (at least) two different oxidation states which are accessible by oxidation or reduction from one state to the other, and each of the oxidation states of the cage and guest can be accessed independently of the oxidation state of the other. In some embodiments this leads the guest to undergo a change in coordination number in a mechanochemical transformation.

In one embodiment, the POM has a cage/guest structure, wherein the guest(s) in the cage are capable of undergoing redox activity independent of the cage. In one embodiment, the POM can electrochemically access at least five electronic states. In one embodiment, the guest(s) display n-type behaviour. In one embodiment, the POM displays p-type behaviour. In one embodiment, the POM displays n- and p-type behaviour.

An advantage of having independent redox activity is the ability to access greater numbers of oxidation and/or reduction states in the POM while using minimum space in the memory device.

In one embodiment, a POM shows a UV absorption having a maximum at around 600 to 800 nm. In one embodiment, the UV absorption can be observed when the POM is in a reduced state. In one embodiment, a one-electron-reduced POM shows a broad absorption centred around 600 to 800 nm. In one embodiment, a two-electron-reduced POM shows a broad absorption centred around 600 to 800 nm. In one embodiment, a POM does not show a broad absorption centred around 600 to 800 nm when one-electron reduced, but does show a broad absorption centred around 600 to 800 nm when further reduced, for example, when two- and/or three-electron reduced. Where a reduction is measured using cyclic voltammetry, but no absorption is found, it can be concluded that the guest has been reduced. Where a reduction is measured using cyclic voltammetry, and absorption is seen, it can be concluded that the cage has been reduced.

In one embodiment, the POM produces an EPR spectrum with one or more g-values of between 1.6 and 2.1, between 1.7 and 2.0, between 1.75 and 1.95. In one embodiment, the g-value is at least 1.6, at least 1.65, at least 1.7, at least 1.75. In one embodiment, the g-value is at most 2.1, at most 2.05, at most 2.0, at most 1.95. In one embodiment, the g-value is at least one of 1.82, 1.92, 1.78, 1.87, 1.83 and 1.75.

In one embodiment, the POM produces an EPR spectrum with a $B_0$ (G) value in the range 2,500-4,500 at between −1000 mV and +70 mV, especially between 4,250 and 3,000 G between −900 mV and 50 mV. In one embodiment, a POM in a one-electron-reduced state produces an EPR spectrum with a peak in the range 3,000-4,000 G at 50-100 V, such as at 70 V. In one embodiment, a POM in a two-electron-reduced state produces an EPR spectrum with a peak in the range 3,000-4,250 G at −300 to −350 mV, such as at −320 mV. In one embodiment, a POM in a three-electron-reduced state produces an EPR spectrum with a peak in the range 3,000-4,000 G at −900 to −850 mV, such as at −872 mV.

In one embodiment, DPV measurements of POM microcrystals show multiple peaks in the range −3 to 1 V (all potential values V given vs Fc/Fc$^+$). In one embodiment, the POM shows up to 7, up to 6, up to 5, up to 4, up to 3, up to 2 peaks, at least one peak in that range. In one embodiment, the POM shows a peak in the range 0 to −0.5 V, for example at around −0.25 V, a peak in the range −0.5 to −1 V, for example at around −0.65 V, a peak in the range −1 to −1.5 V, for example at around −1.25 V, a peak in the range −1.5 to −2 V, for example at around −1.65 V or −1.7 V, a peak in the range −2 to 2.5 V, for example at around −2.1 V or −2.15 V or −2.4 V, a peak in the range −2.5 to −3 V, for example at around −2.55 V or −2.65 V. One or more of these peaks may be present in the DPV of the POM. One or more peaks may be present in each range. The peaks may be present in one or both of the oxidation and reduction cycles.

The number of guests that can be accommodated within the metal oxide depends on a number of factors including the size of the metal oxide, the size of the guest, and potentially the coordination number of the guest. In one embodiment, the cage holds 0, 1, 2, 3, or 4 guests. In one embodiment, the cage holds 1 or 2 guests. In one embodiment, the guests of a POM are the same. In one embodiment, the guests of a POM have the same chemical structure. In one embodiment, the guests of a POM have the same oxidation state. In one embodiment, the guests of the POM have the same chemical structure but different oxidation states. In one embodiment, the guests of a POM are different. In one embodiment, the guests of a POM have different chemical structure. Such structures are known and have been described in, for example, L. Vilà-Nadal et al., Angew. Chem., 2013.

The structure of the guest must be of a size that can be accommodated in the cage. In one embodiment, the guest has at most 10 atoms. In one embodiment, the guest has at most 7 atoms. In one embodiment, the guest has at most 5 atoms. In one embodiment, each guest structure may be represented by a general formula $(X_nY_m)^{p-}$. n is generally 1 or 2, but may be 3, 4, 5, 6, 7, 8 or more. m is generally 0, 3, 4, 5, 6, 7, 8 or 12. p is generally 1, 2, 3, 4, 5 or 6. X is generally a metal atom, and/or may be an atom from group 13, 14, 15, 16 or 17. Y is generally 0.

In one embodiment, X is a metal. In one embodiment, X is not a metal. In one embodiment, each guest has at least one of Al, As, Bi, Ce, Co, Cr, Cu, Fe, Ge, Hg, Mo, Mn, Nb, Ni, Pb, Sb, Se, Sn, Te, Ti, U, V, W, Zn atoms, and alternatively or additionally includes one or more of Cl, I, P, Si and S atoms. In one embodiment, each guest has more than one atom of the same type. In one embodiment, each guest has one or more different atoms.

In one embodiment, each guest has one or two different types of atom. In one embodiment, each guest has at least one oxygen atom.

In one embodiment, the guest has an octahedral structure. In one embodiment, the guest has a tetrahedral structure. In one embodiment, the guest has a square antiprism structure. In one embodiment, the guest has an icosahedral structure. In one embodiment, the guest is a single ion. In one embodiment, the guest comprises a metal atom. In one embodiment, the guest does not comprise a metal atom. In one embodiment, the guest comprises a 4-coordinate heteroatom. In one embodiment, the guest comprises a 6-coordinate heteroatom. In one embodiment, the guest comprises an 8-coordinate heteroatom. In one embodiment, the guest comprises a 12-coordinate heteroatom.

In one embodiment, the guest is located centrally within the cage. In one embodiment, the guest is located substantially non-centrally within the cage. In one embodiment, the location of the guest is determined when the guest is in a reduced state. In one embodiment, the location of the guest is determined when the guest is in an oxidised state. In one embodiment, the location of the guest changes according to the oxidation state of the guest. In one embodiment, a change in the oxidation state of the guest causes the guest to move within the cage. For example, two tetrahedral guest $[S^{IV}O_3]^{2-}$ ions may be present in a cage in a non-central location when in an oxidised form. Reduction of the guest causes a change in the coordination of the S atoms and the guests shift to a more central location within the cage.

In some embodiments, the POM has a guest atom selected from one or more of S, P, W, I and Te.

Examples of redox-inactive guests include $[S^{VI}O_4]^{2-}$, $[P^{V}O_4]^{3-}$, and $[W^{VI}O_6]^{6-}$. Examples of redox-active guests include $[S^{IV}O_3]^{2-}$, $[Se^{IV}O_3]^{2-}$, $[Se^{III}O_3]^{3-}$, $[I^{VII}O_6]^{5-}$, and $[Te^{VI}O_6]^{6-}$. Examples of other guests include, $[As^{V}O_4]^{3-}$, $[BiO_3]^{3-}$, $[AsO_3]^{3-}$ and $[P_2O_7]^{4-}$.

Arrangement of the elements making up a POM 1, 1' are shown schematically in FIG. 1 (only one of each is labelled for clarity). $[S^{IV}O_3]^{2-}$, $[P^{V}O_4]^{3-}$, and $[As^{V}O_4]^{3-}$ guests 3 are present in a conventional Wells-Dawson cluster 1 in the cage in tetrahedral units. Two of these guests 3 can be accommodated in the cage. By contrast, $[I^{VII}O_6]^{5-}$, $[Te^{VI}O_6]^{6-}$, and $[W^{VI}O_6]^{6-}$ guests 3' are present as octahedral units in non-conventional Wells-Dawson units 1', and only one guest 3' can be accommodated in the cage. In this figure, the six polar metal positions 5, 5' are labelled (CAP) at the top and bottom, and the twelve equatorial metal sites 7, 7' are labelled (BELT) in the middle. These represent two distinct types of metal site. An example of the metal in these clusters is W. Examples of X in guest molecules 3 of conventional Wells-Dawson clusters 1 include $P^V$, $S^{IV}$, and $As^V$. Examples of X in guest molecules 3' of non-conventional Wells-Dawson clusters 1' include $I^{VII}$, $Te^{VI}$ and $W^{VI}$. The $\{W_{18}O_{54}\}$ and $\{W_{18}O_{56}\}$ frameworks are shown as ball (W) and stick (O) representations. Accordingly, it can be seen that the O atoms 9, 9' bridge the metal sites, extend out from the molecule and also extend inwards towards the guest(s) 3, 3'. The heteroatom guests 3, 3' are shown in a polyhedral representation.

Methods of making POMs suitable for use in the present invention will be discussed below (see 'Methods' section).

Device

The incorporation of POMs into CMOS technologies offers a fundamentally better way to design and engineer new types of data storage devices, due to better electronic complementarity of POMs with $SiO_2$ and the multiple redox states accessible to POMs. It is thought that dopants used in core-shell type POMs could allow control over the electronic behaviour at the molecular level.

Figure 2:
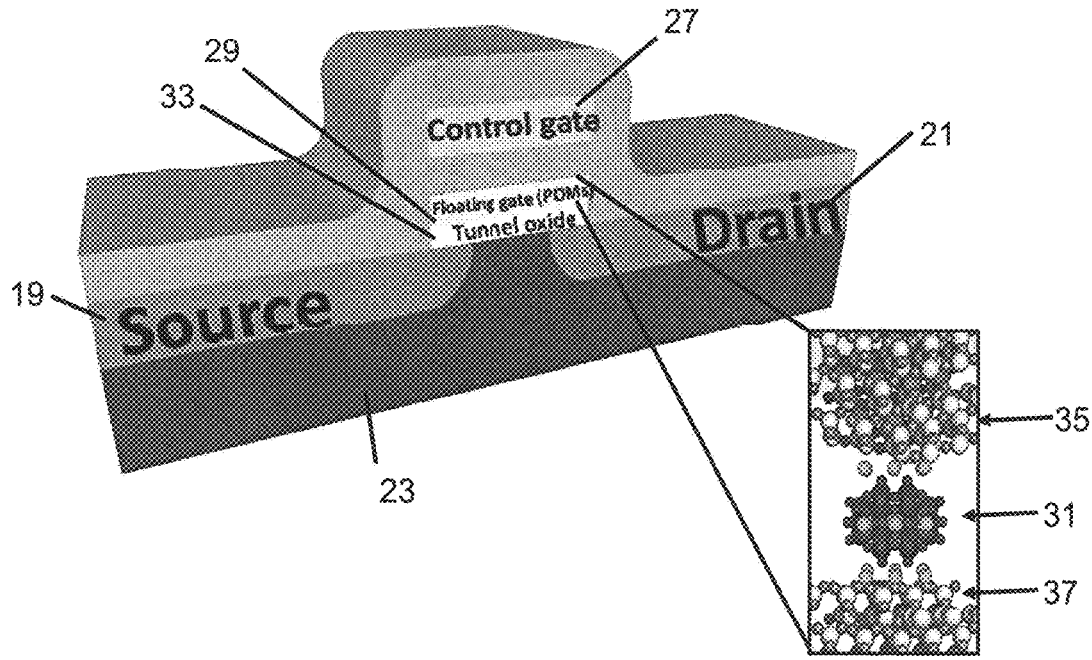
FIG. 2 shows structural representations of two POMs. (i): Conventional Wells-Dawson cluster with two tetrahedral guests $[M_{18}O_{54}(XO_4)2]^{m-}$.
(ii): Non-conventional Wells-Dawson cluster with one octahedral guest $[H_nM_{18}O_{56}(XO_6)]^{m-}$.
Figure 2:
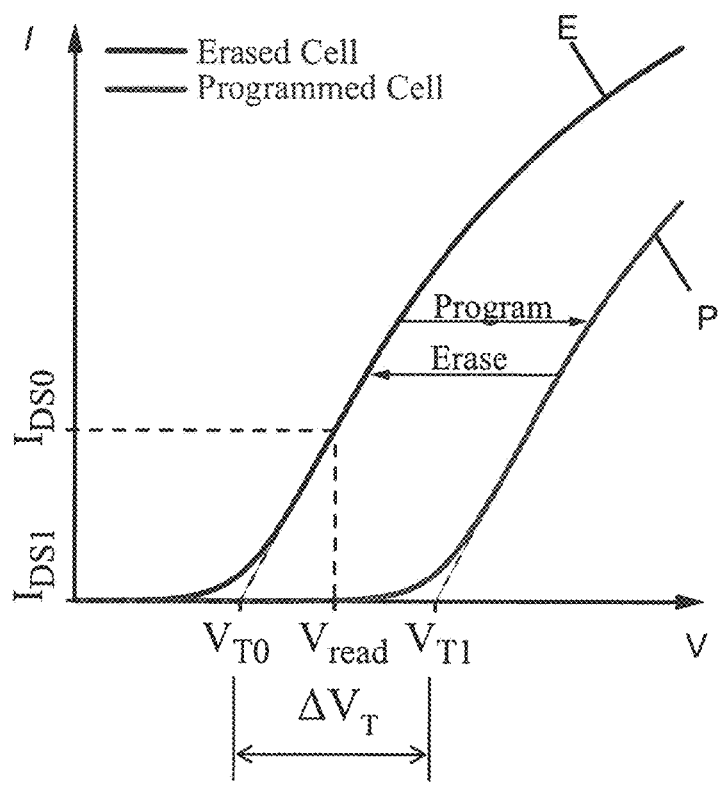
Figure 2:
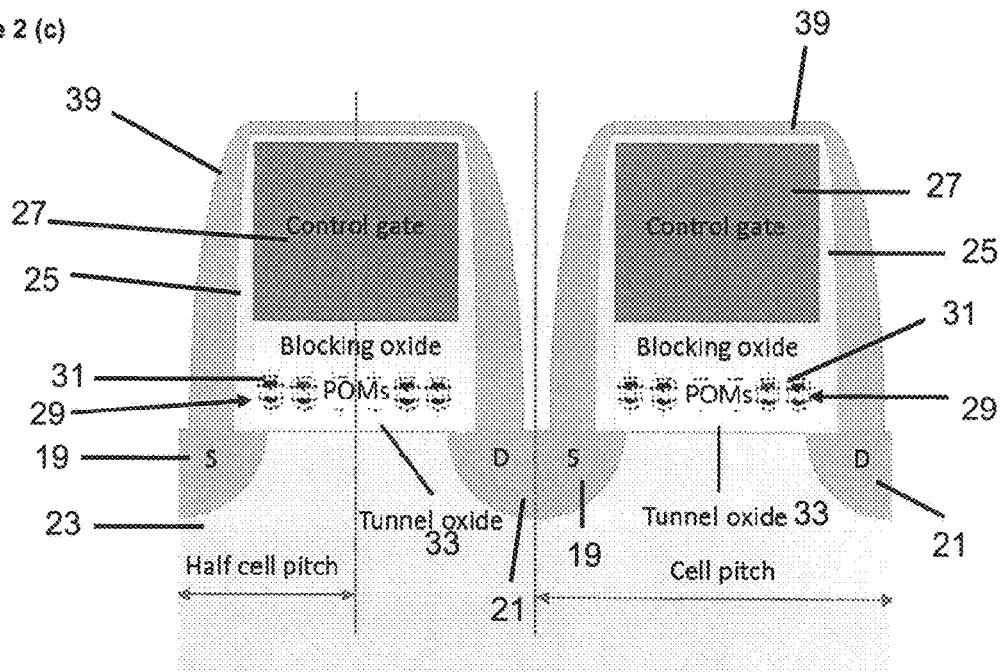

The present invention provides a polyoxometalate in an electronic device. In one embodiment, the electronic device is a transistor. In one embodiment, the electronic device is a memory device. In one embodiment, the electronic device is a non-volatile molecular memory (NVMM) device. In this context, non-volatile means that the electronic charge state is retained even when the power is turned off. In NVMMs, the logical state of the memory cell may be determined by the amount of net charge, or the charge polarization, in a layer of molecules in a particular reduction or oxidation state. The charge embedded in the gate dielectric controls the threshold voltage and the conductivity of a transistor channel. The readout signal is the change in channel-current that corresponds to a change in the redox state of the molecules, as schematically illustrated in FIG. 2 (b). SONOS FG memories work on a similar principle (M. White et al., 1998; J. Lee et al., 2002).

In one embodiment, the electronic device is a flash memory device. In one embodiment, the electronic device is a flash random access memory (RAM) device. Flash memory can be electrically programmed, erased and reprogrammed. In one embodiment, the electronic device is a NAND type flash memory; that is, multiple bytes may be programmed together. In one embodiment, the electronic device is a NOR-type flash memory; that is, a single byte may be programmed independently of other bytes.

As used herein, flash memory may be one or an array of memory cells comprising floating gate transistors. In some embodiments, the memory cells store only one bit of information (single-level cell devices). In one embodiment, more than one bit can be stored per cell (multi-level cell devices), for example double level cell devices.

In one embodiment, the electronic device comprises a plurality of transistors, and/or a plurality of memory devices and/or a plurality of NVMM devices and/or a plurality of flash memory devices and/or a plurality of flash RAM devices and/or a plurality of NAND and/or NOR type flash memory devices described above. In one embodiment, the devices are linked in electrical communication. In one embodiment, the electronic device comprises a plurality of memory devices.

In one embodiment, the difference in gate voltage at a particular drain current between a programmed device and erased device may between around 0.1 to 10 V, between around 3 to 8 V, between around 3 to 5 V, between around 0.2 to 5 V, between around 0.3 to 2 V. In one embodiment at a particular read voltage, the difference in drain current between a programmed device and an erased device is around $10^{-3}$ to $10^{-1}$ A/µm.

In one embodiment, the device can act as a flash memory device. In one embodiment, the device is a flash memory device and contains a POM which demonstrates "n-type" behaviour. In one embodiment, the programming window of the flash memory device is greater than 0.8 V, greater than 1.0 V, or greater than 1.2V. In one embodiment, the programming window is less than 2.0 V, less than 1.8 V or less than 1.5 V. In one embodiment, the programming window is in a range between any combination of those values. In one embodiment, the device is a flash memory device comprising a selenium-templated POM.

In one embodiment, the device has a write-once-read-once (WORO) memory behaviour. In one embodiment, the device has a WORO memory behaviour and contains a POM which demonstrates "p-type" activity. In one embodiment, the device has a WORO memory and comprises a selenium-templated POM.

In one embodiment, the device shows hysteresis between upwards and downwards voltage sweeps. In one embodiment, the hysteresis gap is between around 0.1-0.5 V, between around 0.1-0.3 V, such as for example around 0.2 V. In one embodiment, the hysteresis gap is more than around 0.1 V, more than around 0.15 V. In one embodiment, the hysteresis gap is less than around 1.0 V, less than around 0.75 V, less than around 0.5 V.

In general, the use of redox-active molecules in an FG offers several very important advantages over using a conventional polysilicon (polycrystalline silicon) FG, (M. White et al., 1998; J. Lee et al., 2002) or using alternatives like trap-rich dielectrics (e.g. $Si_3N_4$) (C.-Y. Lu et al., 2008) or metallic nano-clusters (S. Tiwari et al., 1995). In particular, using POM-based FGs means the charge storage is very localised, thus minimising cross-cell capacitive coupling (arising from charge redistribution on the sides of a poly-Si FG, and being one of the most critical issues with flash memories). In addition, POMs can be made consistently and reproducibly, so there is no variability that can be problematic. Furthermore, the chemistry of the POMs, being oxygen rich clusters (molecular metal oxides), would provide better integration compared to organic redox-active molecules with the standard gate-stack materials and processing used in contemporary flash-memory technology.

FIG. 2 (b) illustrates the effect of programming (reducing) a POM layer. In this embodiment a reduction of the current in the semi-conductive channel between the source and drain results. The magnitude of the source-drain current at a given bias of the control gate represents the readout signal. In this way the logic state can be determined because it is modulated by the presence or absence of charge stored in the FG. That is, the device is 'programmed' when the charge is present on the FG. Often, this is a logic "0". When the charge is not present on the FG, it is a logic "1". The programming happens by forcing an electrical charge onto the FG where it is stored. An electric field is created using the control gate. Holes generated in the substrate between the source and drain and below the floating gate cause electrons to pass through the oxide by, for example, tunnelling (specifically, Fowler-Nordheim tunnelling) or hot electron injection. In this way, the charge is conferred on the FG. Once the electrons are trapped in the FG, they modify the threshold of the transistor.

In one embodiment, there is a single POM molecule in the electronic device. In one embodiment, the device has a plurality of POMs. In one embodiment, the plurality of POMs are all the same. In one embodiment, the plurality of POMs have the same chemical structure. In one embodiment, the plurality of POMs have the same chemical structure and the same oxidation state. In one embodiment, the plurality of POMs are not all the same. In one embodiment, the plurality of POMs have different chemical structures. In one embodiment, the plurality of POMs have the same chemical structure and different oxidation states. In one embodiment, the plurality of POMs are all different. In one embodiment, the plurality of POMs all have different chemical structures. In one embodiment, the plurality of POMs all differ by at least one of their chemical structure and oxidation state.

In one embodiment, the plurality of POMs are arranged in a plurality of layers. In one embodiment, there may be one or more layers (strata) of POM molecules in the device of the invention. A single POM is considered to be a monolayer with one molecule in the layer. More than one POM may be arranged in a monolayer, so that each POM is located at a substantially equal distance from a substrate surface. In one embodiment, the plurality of POMs have (are arranged in) a regular lateral distribution. In one embodiment, each layer of POMs has the POMs arranged in a regular repeating pattern. In one embodiment, the POMs in a layer are arranged in a cubic close-packed arrangement. In one embodiment, the POMs in a layer are arranged in a hexagonal close-packed arrangement. Other arrangements are also contemplated.

In one embodiment, where more than one POM is present, the POMs may be arranged in multiple layers. That is, the POMs are arranged in a stacked formation, so that one or more POMs in a first layer are substantially less distance from the upper surface of the substrate than POMs in a second layer. In one embodiment, POMs in a second layer are positioned above POMs in a first layer. POMs in a layer are substantially the same distance from the substrate. Further layers can be derived accordingly.

In one embodiment, there are between 1 to 1,000 layers, between 1 to 500 layers, between 1 to 100 layers, between 2 to 50 layers, between 10 to 50 layers of POMs in an FG.

In one embodiment, the POMs are all of a single type. In one embodiment, different POM structures are used. In one embodiment, each POM in a layer is of the same chemical structure. In one embodiment, each layer comprises a POM with a different chemical structure to a POM in other layers.

Work in the production of thin films of polyoxometalate clusters (S. Liu et al., 2002) and the use of POM clusters in "nanocasting" (S. Polarz et al., 2000) are examples in which the cross disciplinary approach is beginning to utilise the potential of this class of clusters. One possible approach to the fabrication of POMs may, for instance, utilise lithographic techniques to prepare patterned substrates for the formation of "functional" polyoxometalate clusters, or even utilise the POM cluster in the growth of nanoscale moieties that can be directed to individual electrodes patterned by using lithography (H. Abbas et al., unpublished results).

Accordingly, in one embodiment a POM layer is prepared by thin-film techniques. In one embodiment a POM layer is prepared by lithography. In one embodiment a POM layer is prepared by nanocasting. In one embodiment, a POM layer is prepared by electrodeposition. In one embodiment, a POM is applied singly or in a layer using dip coating, for example using organic solvent(s).

In general terms, POMs can be constructed that bridge large-length scales and lithographic techniques (top-down) can be used to direct the positioning of clusters, which can be built by using self-assembly processes (bottom-up).

Figure 3:
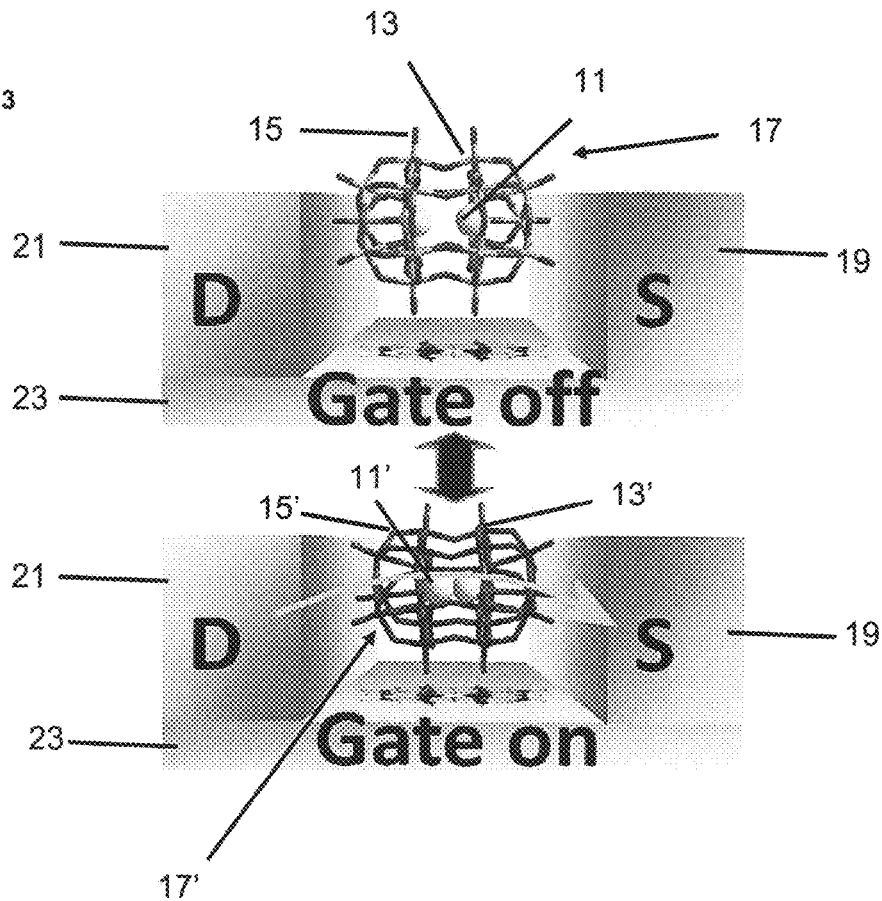
FIG. 3 is a schematic diagram showing a theoretical simulation of how an electronic device could operate. A POM-FET device based upon field induced S—S bond formation (when the gate is 'on') in the cluster cage resulting in switching the cluster cage by two electrons to a semiconducting state from a non-conducting state. Guests are represented by balls. Reversibility is indicated by the arrow.

FIG. 3 shows schematically a portion of an electronic device contemplated by the invention. In FIG. 3, A POM-FET device based upon field induced S—S bond formation 11' (when the gate is 'on') in the cluster cage resulting in switching the cluster cage by 2 electrons to a semi-conducting state (lower figure, see single headed arrow) from a non-conducting state (upper figure). Oxidised Mo atoms 13 are shown lighter than reduced Mo atoms 13'; oxygen atoms 15, 15' make up the other cage sites. Guests 11, 11' (sulfur) are represented by balls. Reversibility is indicated by the double headed arrow. In this example, a single POM 17, 17' is located between the source 19 and drain 21 over the substrate 23.

In one embodiment, the POM is in the FG of a memory device. In one embodiment, the POM is contained within a floating gate. Arrangements of the components for the electronic device according to the invention will be known to the skilled person. Exemplary arrangements are set out below with reference to FIG. 2 (a), FIG. 2 (c) and FIG. 5 (discussed in more detail below), but other arrangements of the components of the electronic device may be within the scope of the invention.

In one embodiment, there is a single POM molecule in the FG. In one embodiment, there is more than one POM molecule in the FG. In one embodiment, there are one or more layers of POM molecules. The chemical structure of the POMs in each layer may be the same or different to POMs in the same layer or to POMs in a different layer.

In one embodiment, the device is operated by generating an electric field.

In one embodiment the electronic device has a substrate. In one embodiment the substrate comprises a p-type substrate. In one embodiment the substrate comprises an n-type substrate. The substrate may be a p- or n-type semiconductor. In one embodiment, the substrate comprises silicon. In one embodiment the substrate comprises polycrystalline silicon. In one embodiment, the substrate comprises SiGe. Accordingly, when a voltage is applied an electric field causes electronic holes (positive or negative, i.e. electron-rich or electron-deficient) to form in the substrate close to the surface nearest the FG, at the interface between the substrate and the insulator. This is an inversion layer or inversion channel. In one embodiment, the channel is doped to produce an n- or p-type semiconductor.

In one embodiment, the electronic device has a source and a drain. In one embodiment, charge carriers flow from the source. In one embodiment, the drain receives charge carriers. In one embodiment a voltage is applied across the source and drain. In one embodiment, the device is operated by applying a voltage across the source and drain components. In one embodiment, the source and drain are n-type. In one embodiment the source and drain are p-type. The source and drain are opposite in type to the substrate. In one embodiment, the source and drain are doped to produce an n- or p-type semiconductor. In one embodiment, the source comprises silicon. In one embodiment, the drain comprises silicon. In one embodiment, both source and drain comprise silicon. In one embodiment, the devices are n channel devices.

In one embodiment, an n channel device is doped with phosphorous. In one embodiment, an n channel device is doped with arsenic. In one embodiment, the device is a flash memory device and is an n channel device, optionally suitably doped with phosphorous and/or arsenic.

In one embodiment the electronic device has a control gate. Suitable materials and dimensions and configurations for such control gates will be known to the skilled person. In general, the control gate is located in the vicinity of the FG. In one embodiment, at least a portion of the control gate is located above the FG; that is, at least a portion of the control gate is located a distance further from the substrate than the FG. In one embodiment, at least a portion of the control gate is located alongside the FG; that is, at least a portion of the control gate lies at a substantially similar distance from the substrate as the FG.

In one embodiment, the electronic device has an insulating layer. In one embodiment, an insulating layer lies between the FG and the substrate; that is, the FG is separated from the substrate by the insulating layer. In one embodiment, an insulating layer substantially surrounds the FG. In one embodiment, the FG is located within an insulating layer. In one embodiment, an insulating layer lies between the FG and a control gate, so that the control gate and the FG are separated by the insulating layer. In one embodiment, an insulating layer substantially surrounds the FG and the control gate, so that the control gate and FG are separated by the insulating layer. In one embodiment the insulating layer comprises an oxide. Suitable materials for use as the insulating layer will be known to the skilled person and is commonly an oxide such as silicon dioxide or silicon oxynitride. Accordingly, insulating material between the substrate and the FG is sometimes called 'gate oxide', and insulating material over other parts of the substrate may be called 'field oxide'.

In one embodiment, the insulating layer has a thickness below the FG of between 0.2 nm and 500 nm, and may be between 0.5 nm and 100 nm, and may be between 1 and 2 nm. In one embodiment, the insulating layer has substantially the same thickness across the substrate. In one embodiment, the insulating layer has a variable thickness.

In one embodiment, the insulating layer spans across the substrate between the source and drain. In one embodiment, the insulating layer extends over the source and drain. In one embodiment, the insulating layer does not extend over the source and/or drain.

In one embodiment, electrons are caused to tunnel through the insulating layer from the substrate to the FG.

In one embodiment, the device comprises a floating gate and a control gate, wherein the control gate is insulated from the floating gate, and wherein the floating gate comprises a POM. In one embodiment, the device comprises a substrate, a source and a drain on the substrate, and an insulating layer on the substrate and separating the substrate from the floating gate. In one embodiment, the device comprises a substrate, a source and a drain on the substrate, an insulating layer on the substrate and separating the substrate from a floating gate, and a control gate, wherein the control gate is insulated from the floating gate, and wherein the floating gate comprises a POM.

In one embodiment, there is provided an electronic device comprising the memory device as described above.

In one embodiment, the device has an ON-/OFF-current ratio between 1 and 15 orders of magnitude. In one embodiment, the ON-/OFF-current ratio is between 1.5 and 12 orders of magnitude. In one embodiment, the ON-/OFF-current ratio is around 2 orders of magnitude, around 5 orders of magnitude, around 11 orders of magnitude.

FIG. 2 (a) shows a typical arrangement of a memory device according to the present invention. According to this figure, a substrate 23 is a lower layer, and the source 19 and drain 21 are located atop the substrate 11 with a portion of the substrate 11 separating them. There is an oxide layer 25 atop the source 19 and drain 21 and separating portion of substrate 11. This oxide layer 25 also separates the control gate 27 and FG 29. In this embodiment, the insulating layer 25 encloses both the FG 29 and the control gate 27. The FG 29 is formed on a channel region of the substrate 11. In this embodiment, the FG 29 comprises a POM 31 as shown in the enlargement. There is a region below the FG 29 which is the tunnel oxide 33, which is where electrons are provided to and/or received from the POM 31 in the FG 29 according to the invention. It can be seen in the enlarged portion that an upper 35 and lower layer 37 of oxide encloses a POM 31 in the FG 29.

FIG. 2 (c) is an alternative depiction of a memory device according to the invention, highlighting the cell pitch (right) and half cell pitch distances (left). The source 19 (S) and drain 21 (D) portions are shown as half-semicircles in pink. These are separated by and supported on the substrate 11. The control gate 27 is located above a blocking oxide and tunnel oxide 33. The FG 29 is located between the blocking oxide and tunnel oxide 33. There is a single layer of POMs 31 (in this embodiment, six POM molecules 31 are shown) included in the FG 29.

An example of a configuration conceived by the inventors is now discussed. The circuit of the device uses aluminium or copper interconnects, and charge detection is done using an integrated electrometer that is configured using an FG transistor integrated into conventional CMOS. The surface of the insulator is in contact with the POMs capable of charge storage and these are deposited according to methodologies such as Langmuir-Blodgett deposition and spin coating. In this way if the surface charge is modified then the potential of the FG can adjust to accommodate the change and, therefore, the molecules are able to directly modify the properties of the CMOS POM-FG which can itself provide efficient impedance transformation from the nanoscale to a conventional electronic environment. This leads to a device similar to that found in DRAM, where the transistor circuit is quite large but the storage node may be much smaller, and leads in turn to an information density increase. To achieve deposition of molecules to create MOS flash memory using the POM clusters as the charging elements, wafers are obtained and the mask is removed and the clusters deposited onto the oxy-nitride insulator. This is similar to gate replacement technology used in the present 45 nm CMOS processes.

Methods of Preparing POMs and Electronic Devices According to the Invention

Methods of preparing POMs are known, see for example D.-L. Long et al., 2010; C. L. Hill, 1998; M. T. Pope and A. Müller, 1991; and A. Müller and S. Roy, 2004.

In one embodiment, a method of making a POM is carried out in a 'one-pot' reaction. In one embodiment, a method of making a POM is carried out in multiple stages. In one embodiment, a method of making a POM employs POM building blocks as synthons. For example, using bulky cations such as organic cations can be used to isolate structure types by encapsulating building blocks and inhibiting the cluster from reorganizing into other structure types. In one example, hexamethylenetetramine (HMTAH$^+$) can be used as a counter ion to stabilize and isolate a highly charged POM anion (see D.-L. Long et al., Dalton Trans., 2005).

In one embodiment, a method of making a POM having a cage structure and one or more guests includes the steps of co-dissolving a salt of the metal oxide together with a salt of the guest, adjusting the pH and collecting a precipitate.

One particular method has been developed to allow replacement of the normally inert hetero anions within the cluster cage with redox-active guests (D.-L. Long et al., 2008; J. Yan et al., 2009). This has been facilitated by use of high resolution mass spectrometry to 'screen' the correct reaction conditions and it is considered that this method could be used for the synthesis of a POM with any heteroatomic guest. Using this approach it has been possible, for example, to 'trap' $[I^{VII}O_6]^{5-}$ in a $\{W_{18}\}$ 'rugby-ball' cage thereby engineering a cluster able to be up to 4-electron reduced. Mass spectrometry has also been used to monitor the insertion of the redox active guests and/or the grafting of a ligand to the surface of the cluster (D.-L. Long et al., 2008; J. Yan et al., 2009). This has allowed, in a general sense, the development of POM synthesis in a modular fashion, whereby it is possible to define the cluster precisely in terms of the cage, guest, and any grafted ligand. In one embodiment, this method is employed to prepare a POM suitable for use in the electronic device of the invention.

One feature of POM cluster chemistry is that the building blocks are conserved between structures and they are thought to have intrinsic properties of high and variable charge (for example, $[Mo_{132}]$ has a charge of −72, while $[Mo_{116}]$ has a charge of −46) and flexible ligand coordination modes that facilitate the self-assembly of clusters containing many thousands of atoms in solution. In mixed-valance Mo-POM systems, the use of pentagonal-type building groups, with different symmetries, play a key role in the synthesis of these systems and the construction of nano-scale architectures (L. Cronin, 2002). The work of Müller et al. (A. Müller et al., 1995., A. Müller et al., 1998; L. Cronin et al., 2002; A. Müller et al., 2002) has demonstrated that Mo-based pentagonal building blocks allow the generation of very large clusters with nuclearities between 36 and 368 metal atoms in a single cluster molecule.

The manufacture of electronic devices, including substrate, insulating layer, source, drain and control gate components and their assembly will be known to the skilled person. A polyoxometalate may be included in the device, for example, in the floating gate, and are provided for suitable electrical communication with relevant device components.

Methods of the Invention

The invention generally provides a method of programming and erasing information from a memory device. The methods comprise providing and/or accepting one or more electrons from the POM; that is, they comprise causing a change in the redox state of a POM within the memory device of the invention.

A POM may be present within a gate to store information or data in the form of electronic charge. Accordingly, methods of the invention involve oxidizing and/or reducing a POM in electronic devices to facilitate the storage and/or transfer of information in the form of charge (electrons). In one embodiment, the method includes the step of providing to or accepting from the POM one or more electrons to provide a POM in a reduced or oxidised state. In one embodiment, the method includes the step of reducing and/or oxidising a POM within the memory device to provide a POM in a reduced or oxidised state.

The step of providing to and/or accepting from the POM one or more electrons according to the invention may be carried out according to methods known and understood to the skilled person. For example, suitable charge transfer components (electron or hole transfer components) may be positioned in the vicinity of the POMs.

In one embodiment, data or information to be stored is programmed into a POM in the form of one or more electrons or holes. In one embodiment, the electron or hole is provided by applying an electrical field. In one embodiment, the electron or hole is provided by an electrode. In one embodiment, one electron or hole is transferred to the POM. In one embodiment, one electron or hole is transferred to each POM. In one embodiment, one electron or hole is transferred to some POMs in the device.

In one embodiment, more than one electron or hole is transferred to the POM. In one embodiment, more than one electron or hole is transferred to each POM. In one embodiment, more than one electron is transferred to some POMs in the device. In one embodiment, some POMs receive one electron or hole, and other POMs receive more than one electron or hole. In one embodiment, some POMs receive no electrons or holes. Corresponding embodiments relating to electron- or hole-transfer from the POM or POMs can be derived accordingly.

In one embodiment, the cage and guest are both redox active. In one embodiment, the cage is reduced or oxidized, and, separately, the guest is also induced to change oxidation state.

In one embodiment, the POM is reduced or oxidised and subsequently the reduced POM is further reduced or the oxidised POM is further oxidised to provide a multiply reduced or multiply oxidised POM.

In one embodiment, an oxidised or reduced POM is subsequently reduced or oxidised, respectively, to return to a previous redox state.

At least three switching scenarios according to the invention can be derived: (i) cage redox change; (ii) guest redox change; and (iii) coupled guest-cage redox change. Accordingly, in one embodiment the step of providing and/or receiving electrons to or from the POM is carried out by providing electrons to and/or receiving electrons from the cage. In one embodiment, the step of providing and/or receiving electrons to or from the POM is carried out by providing electrons to and/or receiving electrons from the guest. In one embodiment, the step of providing and/or receiving electrons to or from the POM is carried out by providing electrons to and/or receiving electrons from the cage and guest independently. In one embodiment, this step involves coupled guest-cage electron transfer to and/or from the POM.

Figure 4:
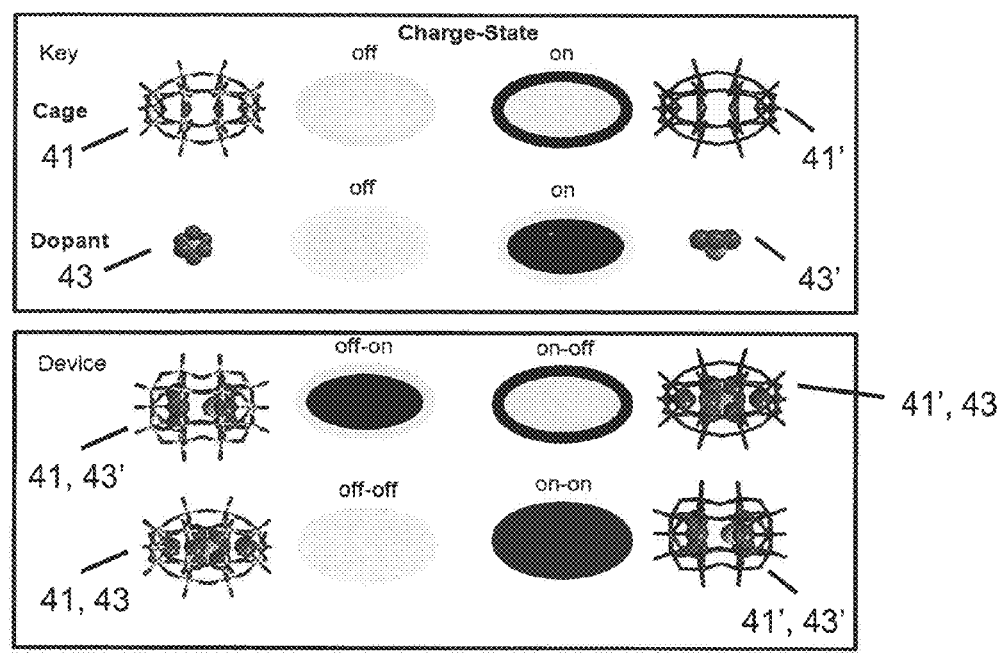
FIG. 4: schematic model for molecular memory showing how both the cluster cage and dopant can be switched on and off.

By having a cluster cage and guest that can both be switched independently or even together, the present inventors have devised a new model for molecular memory. This is shown schematically in FIG. 4. Accordingly, in one embodiment, as shown in FIG. 4, the cage 41 and guest 43 (dopant) are treated as separate parts of the whole POM. Therefore, the charge-state of the cage can be 'off' 41 or 'on' 41' (outer elliptical ring). Correspondingly, the charge-state of the dopant can be 'off' 43 or 'on' 43' (inner ellipse). The molecular structures shown in FIG. 4 highlight the potential change in shape of the POM cage and guest following change of redox state of the guest. In one embodiment, the POM cage undergoes a structural change as a result of oxidation and/or reduction of a guest. In one embodiment, the POM guest undergoes a structural change as a result of oxidation and/or reduction of a guest. In one embodiment, both a guest and cage undergo structural change as a result of oxidation and/or reduction of a guest.

Accordingly, in one embodiment, the method of using the electronic device includes the step of providing to and/or accepting from the POM one or more electrons. In one embodiment, the method includes reducing and/or oxidising a POM. In one embodiment, the method comprises reducing and/or oxidising the cage. In one embodiment, the method comprises reducing and/or oxidising one or more guests. In one embodiment, the method comprises the steps of reducing and/or oxidising the cage and subsequently reducing and/or oxidising the one or more guests. In one embodiment, the method comprises the steps of reducing and/or oxidising the one or more guests and subsequently reducing and/or oxidising the cage. In one embodiment, the method comprises reducing or oxidising the POM to provide a reduced POM or an oxidised POM and subsequently further reducing the reduced POM or oxidising the oxidised POM to provide a multiply reduced or multiply oxidised POM. In one embodiment, the subsequent reduction or oxidation step may be carried out one or more times. In one embodiment, subsequent or further reduction or oxidation step(s) are carried out on the cage. In one embodiment, subsequent or further reduction or oxidation step(s) are carried out on the one or more guests. In one embodiment, the method further comprises the step of subsequently returning the POM to a previous oxidation state. In this way, it is possible to take advantage of the reversible redox nature of the POM. Where one or more POMs are included in the device of the invention, any of these steps may be carried out on one or more POMs together or separately.

In one embodiment, therefore, there are (at least) four possible charge-states for the resulting POM: (i) 'off-on' 41, 43', where the cage is 'off' and the guest is 'on'; (ii) 'off-off' 41, 43, where the cage and guest are both 'off'; (iii) 'on-off' 41', 43, where the cage is 'on' and the guest is 'off'; and (iv) 'on-on' 41', 43', where both the cage and guest are 'on'. In FIG. 4, these ring/ellipse representations are supplemented by ball-and-stick representations of an example POM ($[H_3Te^{VI}W_{18}O_{62}]^{7-}$ and $[H_3Te^{IV}W_{18}O_{60}]^{5-}$ (J. Yan et al., 2009). The metal centres of the cage are pale blue in the 'off' state and dark blue in the 'on' state. The red represents oxygen. The guest is represented as red and green balls, whose configuration changes between the 'off' and 'on' states. In the device, the configuration of the cage may also change between the 'off' and 'on' states, to accommodate the changes to the guest configuration.

Using the modular cluster assembly approach, the present inventors consider, without wishing to be bound by theory, that there are three fundamentally new ways to develop new bi-stable and switchable clusters whereby both the cluster framework, and the guest, can be independently switched from one redox state to the other. Generally, bi-stable means that the POM is able to retain either two electrons or two protons without undergoing decomposition or significant rearrangement. These three ways involve (i) having the charge trapped in the cage; (ii) having the charge trapped in the heteroatom; and (iii) having the charge trapped in both the cage and the heteroatom.

In one embodiment, redox-active hetero ions are inserted within the cluster cage (e.g. P, Si, I, S, Te, Fe, V, Sb and Se etc.). In an effort to produce clusters which have many accessible electronic states, it is possible to target the assembly of cages embedded with redox active ions. This has been achieved by synthesising $\{M_{18}O_{54}\}$ (where $M=Mo^{VI}$ or $W^{VI}$) embedded with redox active guests. Not only can the redox state of the cage be controlled, e.g. $\{M_{18}O_{54}\}^{1-/2-/3-/4-}$ (i.e. zero to four electron reduced), but also the redox state of the hetero-atom can be controlled whilst it is inside the cage, see FIG. 4. The present inventors have demonstrated the success of this approach for the introduction of Te, I, Se, Sb, and V into POM cages, and have shown that the heteroatom-incorporated POM is able to switch between various states. Furthermore they have isolated each of these in a range of oxidation states for both the cluster cage and the central guest ion. Electrochemical and spectroelectrochemical studies have shown the stability and switchability of the POMs in solution with respect to both redox processes relating to the POM cage and the guest (see below).

The present inventors have also been able to prepare a POM cage containing guest Se atoms that can form radicals. This new POM also is a potential candidate for this new scheme. It is discussed in detail in the sections which follow.

The POMs do not have to pass charge, but the change in charge distribution could be used to form a type of switchable, non-conducting oxide device. Accordingly, in one embodiment, the POM undergoes a change in charge distribution on application of an electric field.

In preliminary studies the present inventors have deposited a bi-stable cluster on a range of conducting, semiconducting, and insulating substrates and shown that it is possible to control activation or switching of the cluster via the influence of a local electric field and by temperature control (C. Fleming et al., 2008).

Other Preferences

Each and every compatible combination of the embodiments described above is explicitly disclosed herein, as if each and every combination was individually and explicitly recited.

Various further aspects and embodiments of the present invention will be apparent to those skilled in the art in view of the present disclosure.

"and/or" where used herein is to be taken as specific disclosure of each of the two specified features or components with or without the other. For example "A and/or B" is to be taken as specific disclosure of each of (i) A, (ii) B and (iii) A and B, just as if each is set out individually herein.

Unless context dictates otherwise, the descriptions and definitions of the features set out above are not limited to any particular aspect or embodiment of the invention and apply equally to all aspects and embodiments which are described.

Where values are described as "at most" or "at least", it is understood that any of these values can be independently combined to produce a range.

Unless indicated otherwise, the values provided are generally recorded at room temperature; that is, within the range 20-30° C., for example 20° C.

Where non-SI units are provided, it will be understood that these can be converted easily into SI units by the skilled person (e.g. 1 eV=1.602 176 565×10$^{-19}$ J).

Certain aspects and embodiments of the invention will now be illustrated by way of example and with reference to the figures described above.

Experimental

First, theoretical simulations are described that substantiate the suitability of POMs for use in electronic devices especially memory devices. Then, details of experiments are provided showing that certain POMs have guests that are independently redox-active from the cage. These molecules find particular suitability in the devices of the invention. Finally, novel POM compounds suitable for use in the devices of the invention are described.

Theoretical Simulations

Molecular Simulation Methodology

Calculations were carried out using DFT methodology with the program package ADF (Amsterdam Density Functional) (ADF 2008; G. te Velde et al., 2001). Gradient-corrected functionals of Becke and Perdew for the exchange and correlation energies, respectively, were used to improve the description of the electronic density provided by the local density approximation (X-alpha functional for the exchange part and Vosko-Wilk-Nusair functional for the correlation part) (S. H. Vosko et al., 1980). The valence electrons for all atoms were described with Slater-type basis function of triple-ζ plus polarization quality. The inner electrons have been kept frozen. Scalar relativistic corrections were included by means of the zeroth-order regular approximation (ZORA) formalism (S. Faas et al., 1995). The spin-unrestricted formalism was applied to open-shell species. The present computational settings, BP86/TZP, have been demonstrated to be a satisfactory methodology for describing the electronic structure of polyoxometalates (X. López et al., 2004). All the structures discussed were fully optimized taking into account the solvent effects by means of a continuous model. Conductor-like Screening Model (COSMO) (A. Klamt and G. J. Schüürmann, 1993) was used as implemented in ADF (C. C. Pye and T. Ziegler, 1999) program package. To define the cavity that surrounds the molecules the solvent accessible surface (SES) method and a fine tesserae was used. To obtain the electron density in solution, first it was converged in the gas phase and afterward the COSMO model was turned on to include the solvent effects variationally. The ionic radii of the atoms, which defined the dimensions of the solvent cavity surrounding the molecule, were chosen to be 1.26 Å for W and Mo, 1.52 for O. The dielectric constant E was set to 78 so as to model water as solvent.

Device Simulation Methodology

Taking as input the atomic coordinates of a POM cluster, DFT provided the electronic structure and charge distribution of the POM simulated at different redox-states. From the perspective of the flash-cell simulations, the geometry of the device was required, describing the material domains and their properties, as well as the doping distribution. The domain of the storage media (the FG) of the flash-cell contains a distribution of fixed charge, corresponding to a given spatial arrangement of POMs at a given redox state. This charge distribution was constructed by the Simulation Domain Bridge, from the DFT simulation output. One of the challenges was that of translating the charge density from the fine grid used in DFT, to the coarser grid used in device simulations. This was overcome by the cloud-in-cell assignment, routinely used for accounting of discrete impurities in device simulations (G. Roy et al., 2006). An additional challenge was the accounting for the balancing cations, in the POM-layer illustrated in FIG. 13. It was modelled as a uniform density corresponding to the net-positive charge held by the cations within the storage media domain of the memory cell. The 3D numerical simulations of the flash-cell were performed with the commercial simulator GARAND, which deploys the drift-diffusion transport formalism and includes quantum-corrections by means of the density-gradient approach (Gold Standard Simulations Limited (GSS Ltd.), The University of Glasgow, Glasgow, United Kingdom (http://www.GoldStandardSimulations.com). Quantum corrections are essential for the accurate modelling of decananometer devices (A. Asenov et al., 2001). The capabilities of the simulator were extended to allow the incorporation of arbitrary fixed charge distribution in the gate oxide, to model the storage media of the flash-memory cell.

Discussion

A nanoscale molecular cluster was selected with a $\{M_{18}^{VI}O_{54}\}$ (M=W, Mo) shell encapsulating charge-bearing anions, which has an interior cavity large enough to include two active sulphite $[S^{IV}O_3]^{2-}$ anions or two inert sulphate $[S^{VI}O_4]^{2-}$ anions. Both anions are electronically interesting, especially $[S^{IV}O_3]^{2-}$ because the sulfur atoms are in an intermediate oxidation state and possess a vacant coordination site, a lone pair of electrons, and can change oxidation state and coordination number. In contrast, $[SO_4]^{2-}$ is not redox active (it is redox inactive). The electronic structure description of the clusters by means of DFT calculations is discussed first and, then a new methodology is presented that allows the simulation of POMs integrated to a flash-cell memory.

One of the fundamental challenges faced by researchers is the interpretation of the electrochemical data: cyclic voltammetry provides an unambiguous indicator of a redox event, but not its localisation within the molecule. By incorporating an appropriate solvent model, the present inventors have computed ab initio the redox potentials of known and unknown species, one aim being to identify species such that might be influenced by an appropriate gate potential. Preliminary work on the bisulphite clusters showed that the reorganization of charge can be triggered by supporting the cluster on a gold surface. The mirror charges below the surface provide an electric field gradient that draws the electron density into the conduction band (C. Fleming et al., 2008). The calculations aimed to address whether appropriately substituted POMs were competent to perform the electronic tasks (i.e. conduction and rectification) that would make them viable components of a flash memory cell.

POMs are easily reducible chemical species and are often referred to as a reservoir of electrons. POMs in their fully oxidized state are structurally stable in the solid state as well as in solution, in the presence of countercations to balance their negative charge. In general, the highest occupied molecular orbitals (HOMOs) are oxygen p-like (oxo band), and the set of lowest unoccupied orbitals (LUMOs) are metal d-like (metal band) (J. A. Fernández et al., 2007). The terms 'oxo band' and 'band of unoccupied orbitals', respectively, are frequently used to describe the HOMO and the LUMO. These sets of orbitals do not form a band in the strict sense, since the orbital energies are separated by discrete energies in these medium-sized clusters (X. López et al., Chem. Soc. Rev., 2003).

Figure 5:
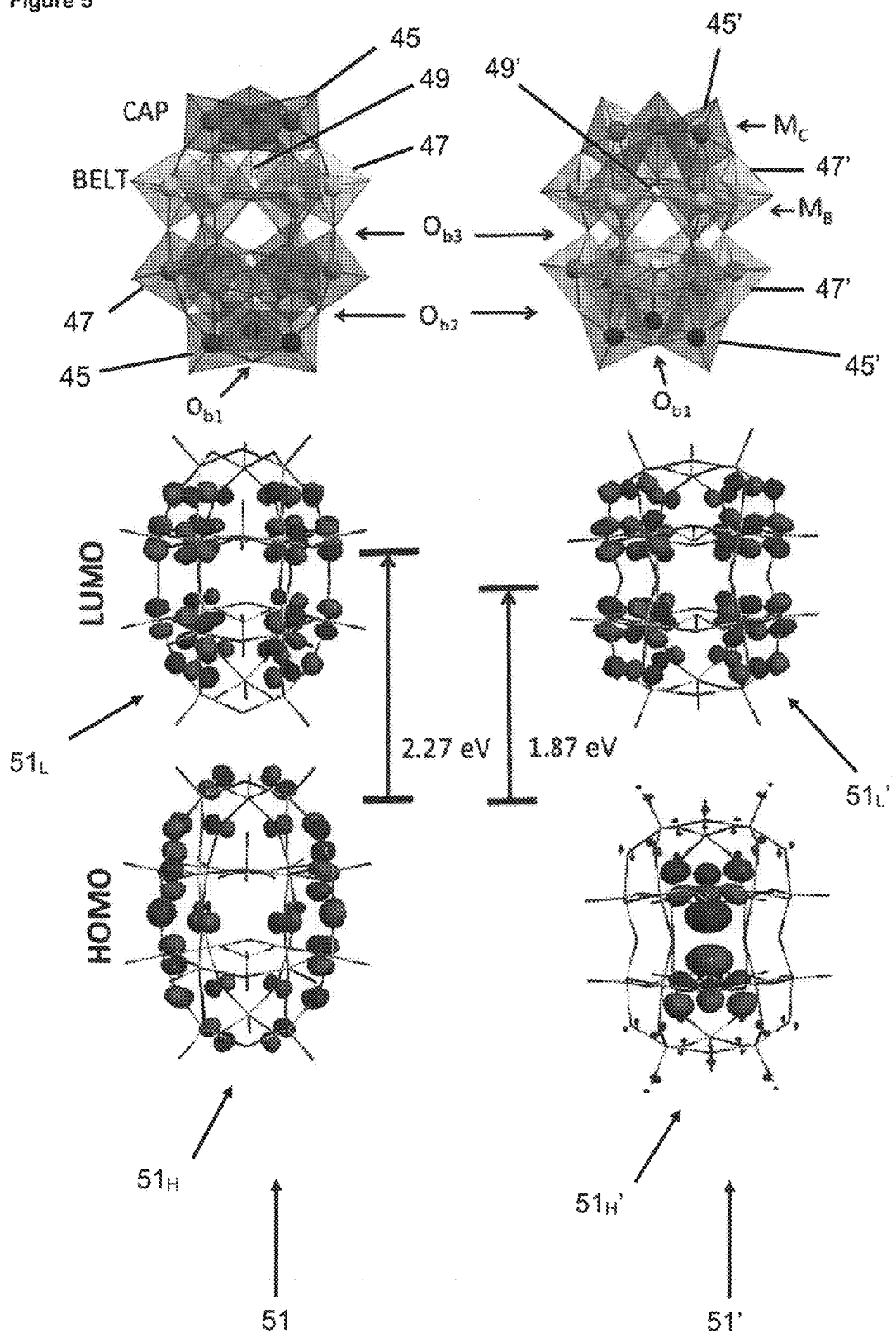
FIG. 5: top-left: polyhedral representation of the $\alpha$-$[X_2W_{18}O_{62}]^{n-}$ conventional Wells-Dawson anion. Top-right: polyhedral representation of the $\alpha$-$[X_2W_{18}O_{60}]^{n-}$ non-conventional Wells-Dawson anion.

In the conventional Wells-Dawson clusters (cylinder-shaped) the HOMO is mainly delocalized over oxygen atoms (see FIG. 5), whereas for the non-conventional clusters (hourglass-shaped) is delocalized over $[SO_3]^{2-}$ moiety. In FIG. 5, two identical fragments or hemispheres are easily identifiable, each composed of one $[M_3O_6]$ triad 45, 45' (labelled 'cap') and one $[M_6O_{18}]$ equatorial belt 47, 47' with six $WO_6$ octahedra (labelled 'belt'). X=heteroatom units 49, 49. Relevant positions are labelled and discussed below. The lower part of FIG. 5 shows a graphical representation comparing the HOMO-LUMO gap in eV for the conventional $[W_{18}O_{54}(SO_4)_2]^{4-}$ 51 (left) and the non-conventional 51' (right) Wells-Dawson anion $[W_{18}O_{54}(SO_3)_2]^{4-}$. The subsequent molecular orbitals 51$_L$, 51$_L$' (LUMO) belong to the equatorial metals in both cases. So, in both cases the LUMO is delocalized over metal centres that are connected to each other by large M-O-M angles (X. López et al., 2002) with values ranging from ~145° to 165°, see Table 1 for details. Table 1 presents the values for the HOMO 51$_H$, 51$_H$' and LUMO 51$_L$, 51$_L$' orbitals of the optimized conventional $[M_{18}O_{54}(SO_4)_2]^{4-}$ 51 and the non-conventional $[M_{18}O_{54}(SO_3)_2]^{4-}$ 51' Wells-Dawson anions, for M=W, Mo.

Figure 6:
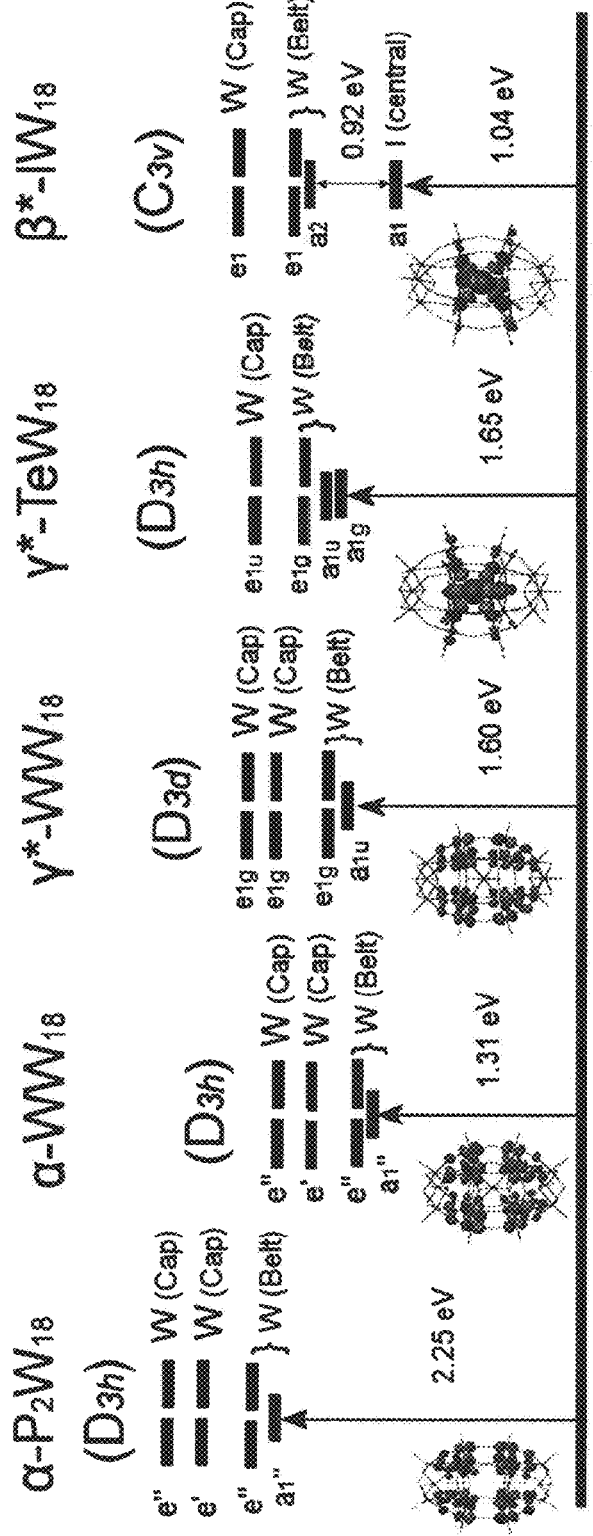
FIG. 6 is a diagram of the molecular orbitals of $\alpha$-$[W_{18}O_{54}(PO_4)_2]^{6-}$, $\alpha$- and $\gamma^*$-$[W_{18}O_{56}(WO_6)]^{10-}$, $\gamma^*$-$[W_{18}O_{56}(TeO_6)]^{10-}$, $\beta^*$-$[W_{18}O_{56}(IO_6)]^{9-}$, which are abbreviated, from left to right, $\alpha$-$P_2W_{18}$, $\alpha$-$WW_{18}$, $\gamma^*$-$WW_{18}$, $\gamma^*$-$TeW_{18}$ and $\beta^*$-$IW_{18}$.

In Wells-Dawson-like clusters, the first reduction occurs in the equatorial (belt) region. The reduction of the cluster does not change the net charge on the internal heteroatom since the additional electrons go to addenda symmetry-adapted orbitals (X. López et al., 2001). The energy of the lowest unoccupied orbitals must be low enough to accept the incoming electron. The crystal field in the solid state and the solvent molecules in dilute solutions stabilize the anion, placing the molecular orbitals at the appropriate level (A. W. A. Mariotti et al., 2007). The redox properties of a POM are closely related to the relative energy and composition of the LUMO. As depicted in FIG. 6, the metallic orbitals in $[W_{18}O_{54}(SO_4)_2]^{4-}$ and $[W_{18}O_{54}(SO_3)_2]^{4-}$ have both an antibonding character between the metal and oxygen orbitals but also between two adjacent metals. The present inventors calculated tungsten clusters under $D_{3h}$ and molybdenum clusters under $D_{3h}$ and $D_3$ symmetry constraints. Previous studies demonstrated that alternating short and long bond length distortions are particularly pronounced in the molybdates relative to the tungstates and exert influence on POM reduction potentials (L. Yan et al., 2008). Reduction potentials may be estimated theoretically by calculating the fully oxidized molecule and its one-electron reduced partner (J. A. Fernández et al., 2007). It is possible to theoretically estimate the redox potential of a given POM by determining the free energy associated with the process (where q is charge and e is electron):

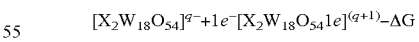
$$[X_2W_{18}O_{54}]^{q-}+1e^-[X_2W_{18}O_{54}1e]^{(q+1)-}-\Delta G$$

The reduction process of a POM involves the addition of one electron to an almost nonbonding orbital, thus the entropic and vibrational contributions to ΔG in above equation can be replaced by its electronic contribution in solution, the reduction energy (RE) (J. A. Fernández et al., 2007). In the present study, the RE is defined as the energy difference between the one-electron reduced and oxidized forms of the WD anion. Since the anion charges of the reduced and oxidized forms differ, the RE must be computed in the presence of a solvent model (COSMO) (I.-M. Mbomekallé et al., 2010) otherwise, energies would not be reliable for comparison with experimental values (A. W. A.

Mariotti et al., 2007). As in electrochemical data in which the normal hydrogen electrode (NHE) is taken as the zero on the relative scale, the theoretical values need to be referred to an absolute theoretical zero. Cramer et al. (A. Lewis et al., 2004) have recently recalculated this absolute zero to be 4.36 eV for the free energy change in the NHE reaction:

$$\tfrac{1}{2}H_2 \rightarrow H^+ + e^-$$

Table 1 summarizes the first one-electron reduction energies for the four clusters studied here and their relationship with the experimental first reduction peaks. Half-wave potentials vs. NHE and theoretical estimates of the reduction energy are shown in the last two columns. With the equation $E° = -\Delta G°/nF$ and the Cramer value 4.36 eV, the present inventors have determined the cathodic peaks (Ec) clusters. Reduction energies were more negative (more favourable) for Mo clusters despite theoretical values of tungsten clusters are in better agreement with experimental ones. Despite the experimental structure of Mo clusters being better reproduced with calculations carried out with $D_3$ symmetry, this had a minor impact in their RE values. Nevertheless, lowering the symmetry from $D_{3h}$ to $D_3$ had a great impact in the value of H-L gap, see the case of $[Mo_{18}O_{54}(SO_3)_2]^{4-}$ where the value was enlarged from 0.88 to 1.12 eV.

al. 2011) and was similar to a contemporary flash-cell studied by other authors (S. M. Amoroso et al., 2011). The average acceptor doping in the channel of the transistor was around $5 \times 10^{18}$ cm$^{-3}$. The high level of doping was necessary in order to maintain good electrostatic integrity at this ultra-short channel length. Alternatively, the impact of the charge stored in the FG on the channel potential (hence drain current) may be reduced by the drain bias, even if the bias is low. The gate dielectric (assumed to be hafnia with a dielectric constant of 20.8) was 4 nm thick (distance from substrate to the control gate), and the POM layer was 1.5 nm above the Si substrate. A larger distance between the control gate and the FG increased the impact of the charge stored in the latter, but degraded the electrostatic integrity. Optimisation of the gate stack with regards to the program/erase and retention characteristics of the memory cell can also be done (though was not carried out here). All simulations were performed on a device with a square gate (W/L=1) and at low drain bias (VDS=50 mV).

4×4 POM Arrangement

An 18 nm×18 nm square gate n-channel flash memory cell was designed. The gate dielectric was assumed to be $SiO_2$ with a thickness of 20 nm. The POM layer was 4.5 nm

TABLE 1

Orbital energies (eV); experimental ($E_{1/2}$), theoretical ($E_c$) and absolute values for the first cathodic peaks (V); and relevant theoretical interatomic distances (Å) and angles (degree) for the COSMO-optimized classical $[M_{18}O_{54}(SO_4)_2]^{4-}$ and the non-classical Wells-Dawson anion $[M_{18}O_{54}(SO_3)_2]^{4-}$. M = W, Mo. RE = reduction energy. Mo compounds are optimized for $D_{3h}$ and $D_3$ symmetry; W compounds for $D_{3h}$ symmetry.

| | | | Relevant distances and angles[a] | | | | | | | | | |
|---|---|---|---|---|---|---|---|---|---|---|---|---|
| $[X_2M_{18}O_{54}]^{4-}$ M | sym $X_2$ | | $M_C$-$O_{b1}$ | $M_C$-$O_{b2}$ | $M_B$-$O_{b3}$ | $M_B$-$O_{b3}$-$M_B$ | $E_{HOMO}$ | $E_{LUMO}$ | $\Delta E_{H-L}$[b] | $E_{1/2}$ vs (Fc$^+$/Fc) | RE (eV) | $E_c$ vs (NHE)[c] | $\Delta(E_{1/2} - E_c)$[d] |
| W | $SO_4^{2-}$ | $D_{3h}$ | 1.94 (1.91)[e] | 1.92 (1.89) | 1.92 (1.89) | 164.61 (161.19) | −6.89 | −4.62 | 2.27 | −0.27[i] | −4.44 | −4.64 | 0.20 |
| W | $SO_3^{2-}$ | $D_{3h}$ | 1.92 (1.89)[f] | 1.93 (1.93) | 1.92 (1.92) | 147.55 (145.58) | −6.48 | −4.61 | 1.87 | −0.35[j] | −4.37 | −4.55 | 0.18 |
| Mo | $SO_4^{2-}$ | $D_{3h}$ | 1.94 (1.93)[g] | 1.92 (1.87) | 1.92 (1.87) | 164.44 (164.58) | −6.77 | −5.15 | 1.62 | −0.10[k] | −5.08 | −4.81 | 0.27 |
| | | $D_3$ | 1.87 | 1.93 | 1.94 | 164.78 | −6.80 | −5.07 | 1.73 | | −5.04 | −4.81 | 0.23 |
| Mo | $SO_3^{2-}$ | $D_{3h}$ | 1.93 (1.96)[h] | 1.94 (1.81) | 1.94 (1.95) | 146.94 (145.79) | −6.06 | −5.18 | 0.88 | −0.01[l] | −5.10 | −4.90 | 0.19 |
| | | $D_3$ | 1.94 | 1.95 | 1.95 | 147.97 | −6.18 | −5.06 | 1.12 | | −5.00 | −4.90 | 0.09 |

[a]Metal and oxygen sites' notation is given in FIG. 5. Averaged experimental values are shown in parentheses.
[b]$\Delta E_{H-L} = E_{LUMO} - E_{HOMO}$ (eV).
[c]Predicted absolute potential vs NHE using Cramer corrected absolute zero potential.
[d]Difference between computed and experimental potentials.
[e]A. W. A. Mariotti et al., 2007;
[f]D.-L. Long et al., Angew. Chem. Int. Ed., 2005;
[g]J. Xie et al., 2008; D. L. Long et al., 2004;
[h]J. Zhang et al., 2004;
[i]N. Fay et al., 2007;
[k]D. M. Way et al., 1997;
[l]B. Carole et al., 2007.

Flash Cell Design

Figure 13:
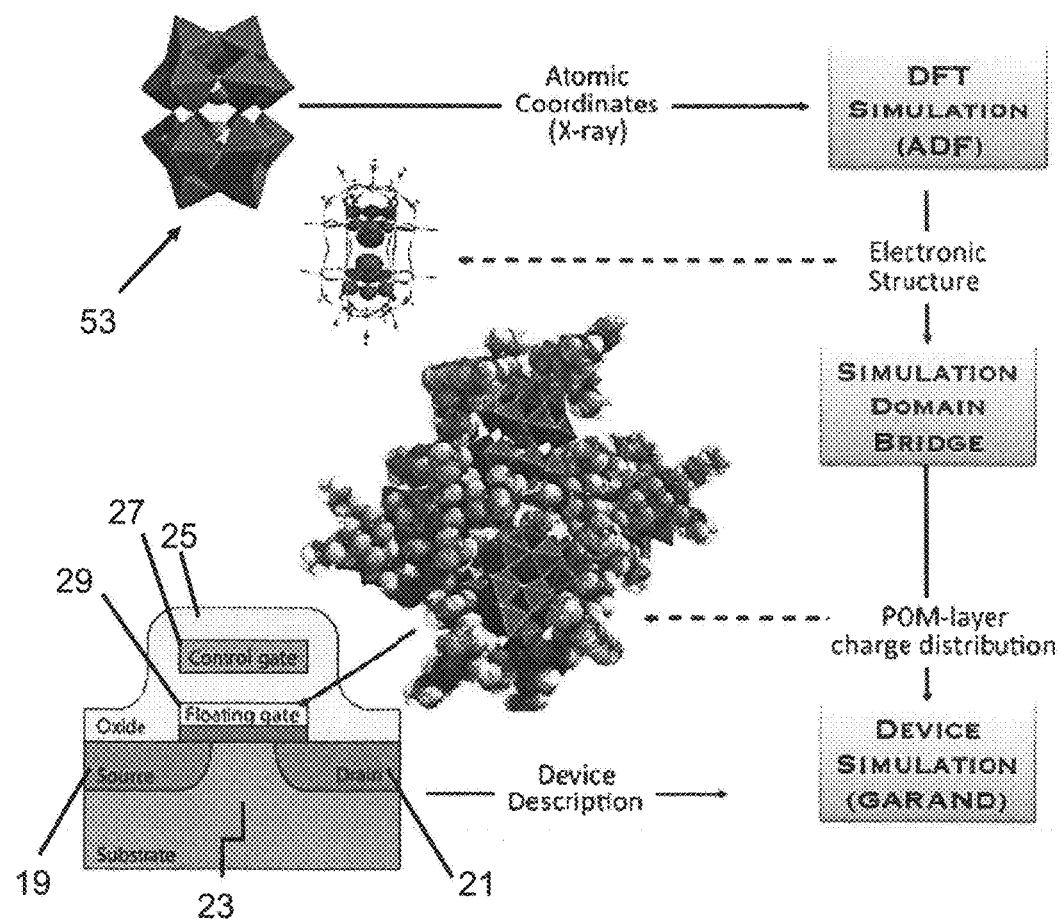
FIG. 13 is a simplified block diagram of a simulation methodology used as a model for the present invention, linking discrete Fourier transform (DFT) and flash-cell modelling.

In order to evaluate the suitability of Wells-Dawson POM clusters for the realization of FG in an NVMM, the present inventors developed a simulation flow that linked density functional theory (DFT) results to three-dimensional (3D) numerical flash cell simulations. The simplified block diagram is illustrated in FIG. 13. Central to this flow was the custom-built Simulation Domain Bridge, connecting the two distinct modelling domains—DFT for the molecular part, and mesoscopic device modelling.

3×3 POM Arrangement

An n-channel flash memory cell with an 18 nm by 18 nm square gate was designed for this study. It was based on a previously studied template 18 nm transistor (S. Markov et above the Si substrate, where 3 nm was $SiO_2$ and 1.5 nm was balancing cation from the insulation barrier. The molecular layer had a 4×4 rectangular planar arrangement of POMs.

Simulation Results

Figure 7:
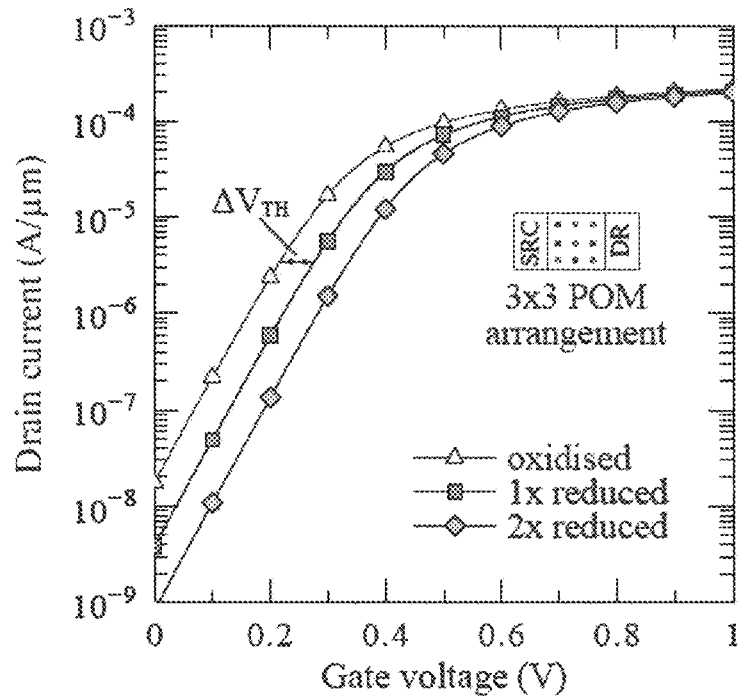
FIG. 7 is a graph of drain current (A/μm) against gate voltage (V) for a 3×3 layer of POMs when oxidized (triangles), 1e⁻ reduced (squares) and 2e⁻ reduced (diamonds).

Taking the $[W_{18}O_{54}(SO_3)_2]^{4-}$ POM as an example, FIG. 7 shows the impact of consecutively reducing the clusters in the POM layer by one and by two electrons on the drain current of the flash memory cell. According to FIG. 7, there is a lowering of the source-drain current (sub-threshold region, indicating also threshold voltage shift $\Delta VTH$) corresponding to the reduction of each POM simultaneously by 1 (square) and 2 (diamond) electrons. Nine POMs in a 3×3 matrix comprise the FG, as illustrated; the centres of all POMs are 1.5 nm above the substrate. The POM layer consisted of nine clusters, centrally arranged in a regular three-by-three array. The centre of each POM was located 1.5 nm above the Si-substrate. The assumption was that all POMs within the layer were simultaneously reduced by one or two electrons. Reducing the POMs added negative charge to the FG, which thus repelled electrons from the channel of the transistor. This in turn reduced the drain current, clearly evident in the sub-threshold region (linear part of the semi-log plot in FIG. 7), which was directly influenced by the electron density distribution in the channel of the transistor.

Figure 8:
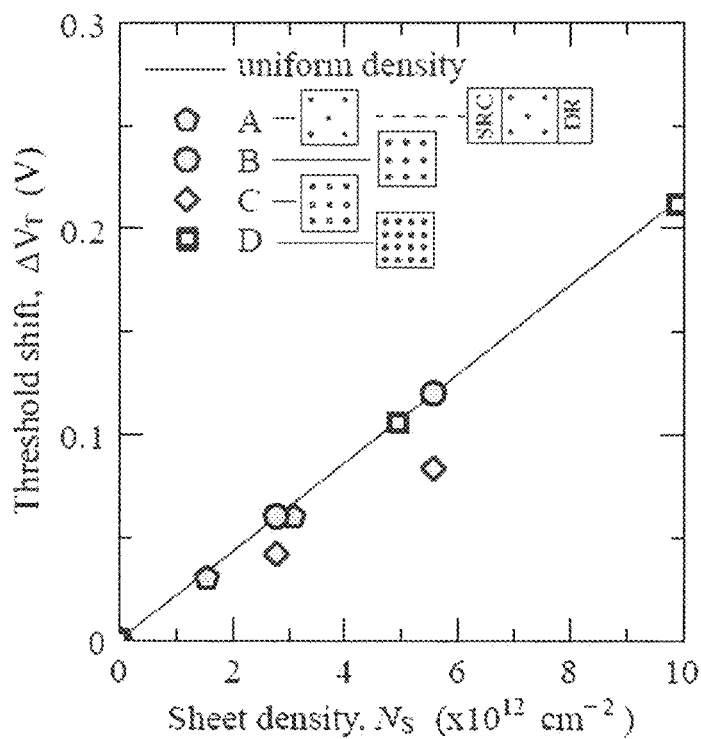
FIG. 8 is a graph showing a comparison of the threshold voltage shift ΔVT (V) versus sheet density (Ns(×10⁻¹² cm⁻²) due to idealised sheet charge in the oxide (line), and due to a POM-FG (symbols), versus sheet charge density (normalised by the electron charge). Pentagons represent five POMs in a mono-layer, circles represent nine POMs in a monolayer, diamonds represent nine POMs in two layers, and squares represent sixteen POMs in a monolayer.

To obtain a quantitative measure of the impact of the oxide charge on the flash-cell characteristics, the present inventors considered the shift in threshold voltage ΔVTH (i.e. the increase in VTH), when POMs were reduced (see FIGS. 7 and 8). According to FIG. 8, the different lateral configurations of the POMs are schematically illustrated. POMs represented by filled circles reside 1.5 nm above the Si-body; POMs represented by empty circles are 3 nm above the Si body. Therefore in configuration C four of the POMs have reduced impact on the potential and electron density in the channel of the transistor, hence on ΔVTH. The threshold voltage was defined in the subthreshold region of the IDVG characteristics, as the gate voltage (VG) needed to obtain drain current ID of 2 µA/µm. The threshold voltage shift is illustrated in FIG. 7. FIG. 8 shows the increase in threshold voltage, ΔVTH, as a function of the sheet-charge density (normalised by the electron charge $q=1.6\times10^{-19}$ C). The line represents the analytical dependence relating a uniform sheet-charge density qNS placed at a distance z away from the Si/oxide interface in an oxide of thickness tOX: $\Delta V_{TH}=qN_S(t_{OX}-z)/\in_{OX}$, where $\in_{OX}$ is the permittivity of the oxide, where tOX=4 nm, z=1.5 nm, and $\in$OX=20.8$\in$0.48. The symbols in FIG. 8 correspond to the 3D flash-cell simulations for different lateral configuration of POMs, as indicated schematically in the legend. POMs represented by filled circles resided 1.5 nm above the Si-substrate (e.g. z=1.5 nm), while the POMs represented by empty circles were placed 3 nm above the Si. The increase of sheet charge density (NS) for a given configuration was achieved by simultaneously reducing the POMs twice. For a mono-layer arrangement and regular lateral distribution of POMs, ΔVTH agreed well with the idealised analytical model. Moreover, reducing each POM by two electrons produced the same impact on VTH as doubling the sheet density in the analytical dependence. Therefore, multi-bit storage could be realised with a POM-FG. A deviation of the POM distribution from a mono-layer had a significant impact on ΔVTH and therefore on the readout signal.

Figure 9:
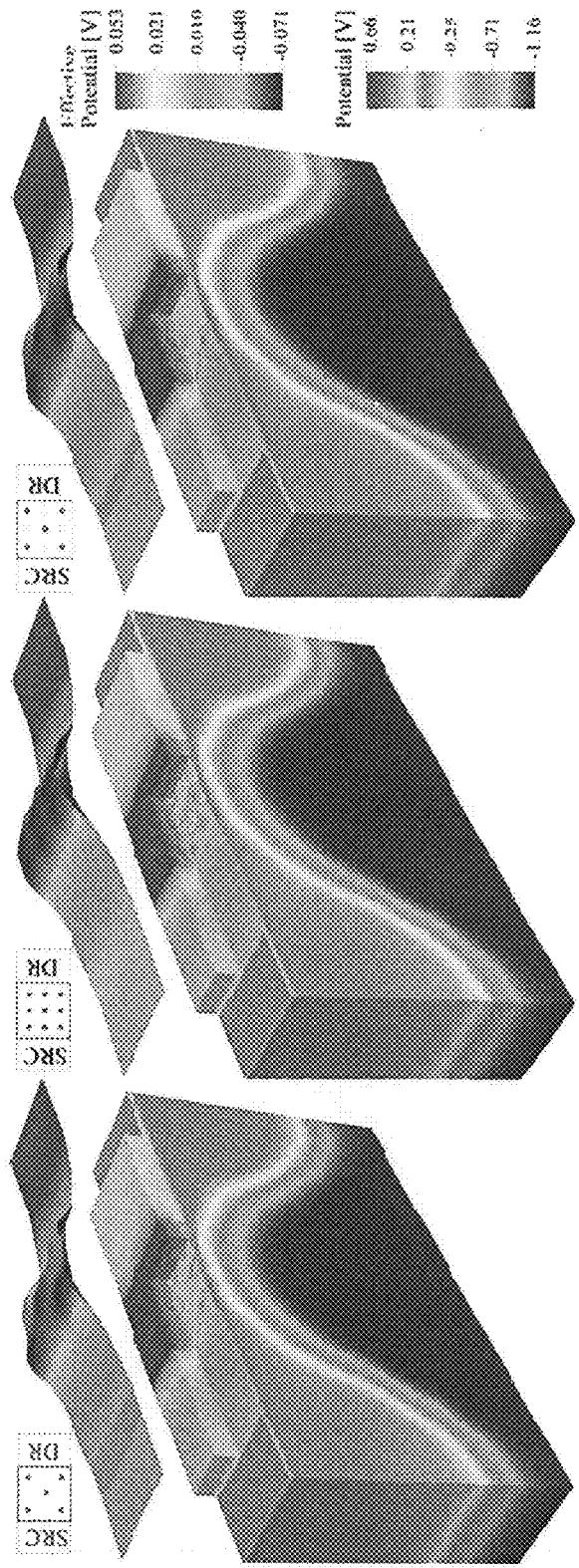
FIG. 9 shows the potential barrier profile along the channel of a flash cell (2D elevated plot) and distribution of the electrostatic potential (V) of the simulated device (3D); part of the tunnel oxide is cut away, exposing the local modulation of the potential, due to the charge stored in the nine POMs that form the floating gate. From left to right, the profiles correspond to five POMs in a monolayer, nine POMs in a monolayer, and nine POMs in two layers.

The results of FIG. 8 can be understood by comparing the potential barrier profiles along the channel of the transistor, for the three configurations studied. These are presented in FIG. 9, showing the surface potential barrier as an elevated 2D plot. Since the simulation conditions were the same in each case (Vds=50 mV and Vgs=0.6 V), the relative height of the barrier is indicative of the relative change in the drain current ID (hence VTH). Overall, the barrier was highest for the flat configuration of nine POMs in a 3×3 matrix (configuration B), and lowest for the 5-POM configuration (A). This was explained by noting that configuration A corresponded to a lower surface charge density, hence a relatively larger number of electrons were induced in the channel. However, configuration C corresponded to the same surface number density as configuration B and still had lower $V_{TH}$. This was explained as being because four of the POMs, being more distant from the Si-substrate, had substantially reduced impact on the potential and electron density in the channel. The reduced impact was clearly seen both in the 2D surface plot, and in the equi-potential contour lines. While this aspect of the simulation results indicated a sensitivity to statistical variability in the redox state and spatial distribution of the POMs, FIG. 7 also suggested the advantage of POMs being multiply-reducible. In particular, the $\Delta V_{TH}$ for the five POMs in configuration A, reduced twice, almost equalled the $\Delta V_{TH}$ due to the nine POMs in configuration C, reduced once. Therefore the multiple-reducibility of the POMs enabled the use of incremental-step-pulse programming (ISPP) algorithm (K.-D. Suh et al., 1995) to overcome statistical variability.

Wells-Dawson POMs can undergo multiple reduction steps under the influence of an applied electric field, accepting more than one electron, without dramatic changes to their geometry. Moreover, it has been shown that the process is reversible—the POMs can be brought back to their initial redox-state by applying a field in the opposite direction. This property presents an opportunity for their use as charge-storage centres of a multi-bit memory cell. The present inventors have established a simulation methodology that goes beyond the modelling of individual POM clusters, and allowed the evaluation of their potential as a FG in non-volatile memories.

Four Wells-Dawson clusters were considered—$[X_2M_{18}O_{54}]^{4-}$, where M is W or Mo, and X is $[SO_4]^{2-}$ or $[SO_3]^{2-}$—the electronic structure of which is well known and whose reduction potentials can be understood from both experimental and theoretical points of view. These anions appeared to be promising candidates to be incorporated as an FG in a non-volatile memory cell. In particular, their small size (~1 nm), and multiple reducibility in a reversible manner, allows for highly localised charge storage. From a device perspective, this means the provision of a mono-disperse energy level (the LUMO) within the band-gap of the gate dielectric, even at relatively high number-density of integrated POMs (~$10^{13}$ cm$^{-3}$). Hierarchical device simulations, incorporating the output of DFT simulations in a model memory cell, confirmed the viability of a POM-FG in a multi-bit memory. Specifically, it was shown that the first and second reductions of the clusters in the gate dielectric imparted distinct reductions in the drain current, and thus manifest changes in the logic state of the memory cell.

The hierarchical modelling framework permitted the exploration of one of the major issues with non-volatile memory miniaturisation—statistical variability. The present inventors found that a variation in the number and spatial configuration of the POM-FG could compromise the readout signal and hence the determination of the logic state, if multi-bit storage per cell is targeted. Therefore the usage of POMs as a FG offers two alternatives. First, if chemical synthesis in combination with self-assembly or controlled deposition can yield a nearly perfect mono-layer of POMs, multi-bit memory cell is possible. Alternatively, the multiple reducibility of the POMs offers a safeguard against variability in the configuration of the FG, allowing the desired net stored charge density to be achieved even if perfect regularity of the POM-layer is not achievable.

Atomic-level DFT simulation approaches provided a deep insight into the structure and electronic properties of polyoxometalates. At the same time, device modelling at a mesoscopic level proved to be an indispensable tool in the design and optimisation of novel devices, especially when account for the statistical variability at the nanoscale is vital. The synergy of the two approaches exploited allowed the theoretical evaluation of a novel memory cell device incorporating POMs. Substantial efforts are devoted to the extension of the hierarchical modelling framework to allow transport calculation through the tunnelling oxide, with the aim of evaluating the programming and retention capabilities of a device with POM-FG. One aim is to provide informed guidance for both chemical synthesis and device design and fabrication, with the knowledge derived from device modelling and DFT calculations.

Figure 10:
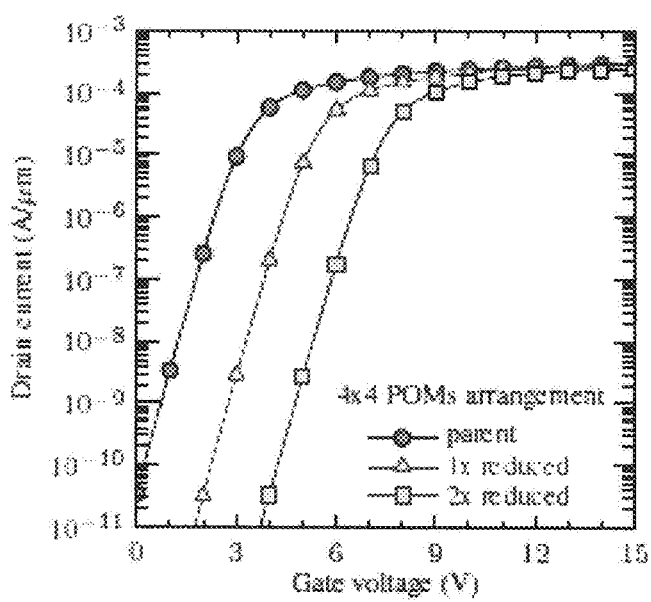
FIG. 10 is a graph of drain current (A/μm) against gate voltage (V) for a 4×4 POM arrangement when oxidized (circles), 1e⁻ reduced (triangles) and 2e⁻ reduced (squares). In this case, the centres of all POMs are 4.5 nm above the substrate.

Using an FG built from 4×4 POMs with molecular formula $[W_{18}O_{54}(SO_3)_2]^{4-}$, arranged in a planar distribution, the drain current of the cell was calculated (FIG. 10). The main assumption was that all of the POMs within the layer were simultaneously reduced by one or two electrons. Adding (reducing) additional negative charges into the FG led to lowering of the source-drain current and to a threshold voltage shift.

Figure 11:
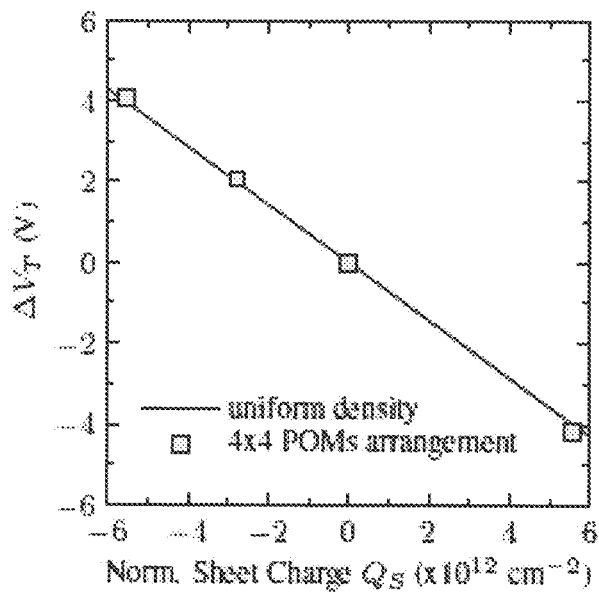
FIG. 11 is a graph of $\Delta V_T$ (V) against normalised sheet charge $Q_S$ (×10¹² cm⁻²), comparing the threshold voltage shift due to an idealised sheet charge in the oxide (line) and due to a POM-FG (squats) versus sheet charge density normalised by the electron charge. The data is for a 4×4 POM arrangement.
Figure 12:
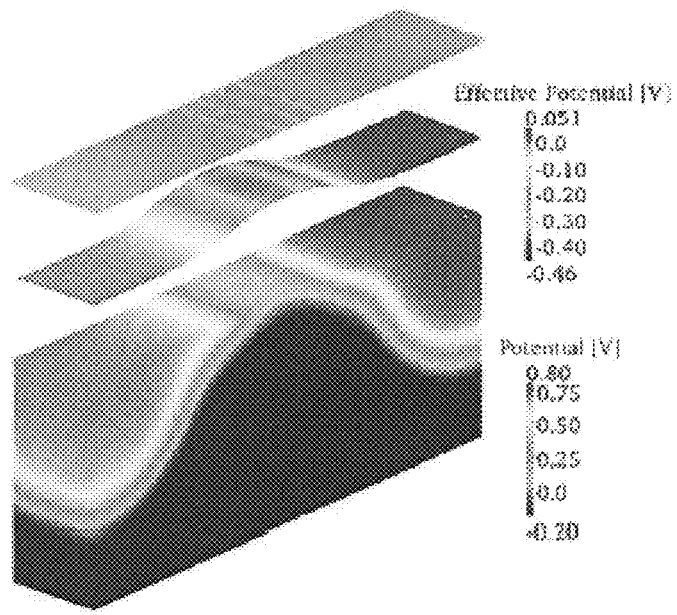
FIG. 12 is a potential barrier profile along the channel of a flash-cell (2D elevated plot) and distribution of the simulated device (3D). Fingerprints of 12 POMs placed in the floating gate are visible on the top panel above the potential barrier profile along the channel.

FIG. 11 shows the increase of the threshold voltage $\Delta V_T$ as a function of the sheet-charge density and was found to agree well with the idealised analytical model. Moreover, reducing each POM by two electrons produced the same impact on $V_T$ as doubling the sheet density in the analytical dependence. A direct link could be established between the results presented in FIG. 11 and the potential barrier profile along the channel as shown in FIG. 12. The height of the barrier in the channel determined the shift in $\Delta V_T$.

Cluster Synthesis

Reagents $Na_2WO_4 \cdot 2H_2O$ (Sigma, AR grade), $H_5IO_6$ (Sigma, 99%, AR grade), $Te(OH)_6$ (Sigma, 99%, AR grade), HCl (Sigma, Analar 36.5%-38% aqueous solution), $(CH_3)_2NH_2Cl$ (Alfa-Aesear, 94+%), $N(Bu)_4Br$ (Sigma, 99%, AR grade), $NBu_4BF_4$ (Sigma, electrometric grade). All solvents used were HPLC grade, 99.9% (Fisher Scientific). For electrochemical studies, $CH_3CN$ was freshly distilled under a nitrogen atmosphere prior to use.

$WW_{18}$ and $\gamma^*$-$TeW_{18}$

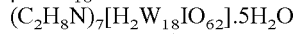
$(C_{12}H_{28}N)[H_4W_{19}O_{62}] \cdot 6CH_3CN$ ($WW_{18}$) and $(C_{16}H_{36}N)_7[H_3W_{18}O_{56}(TeO_6)] \cdot 4CH_3CN$ ($\gamma^*$-$TeW_{18}$) were synthesised by following the previously reported methods separately (see D.-L. Long et al., 2008 and D.-L. Long et al., 2006, 45). The purity of each cluster was checked by ESI-MS.

$\beta^*$-$IW_{18}$ $(C_2H_8N)_7[H_2W_{18}IO_{62}] \cdot 5H_2O$ $Na_2WO_4 \cdot 2H_2O$ (20.0 g, 60.6 mmol) and dimethylamine hydrochloride (8.10 g, 100 mmol) were dissolved in water (50 mL) and $H_5IO_6$ (1.00 g, 4.15 mmol) was added and dissolved. The pH was adjusted to 1.2 by addition of 37% HCl followed by heating the solution to reflux for half an hour. The solution was then cooled to room temperature and is allowed to evaporate slowly. Light yellow block crystals of 3 $((C_2H_8N)_7[H_2W_{18}IO_{62}] \cdot 5H_2O)$ appeared within one week. Yield: 3.8 g (23.7% based on W). Elemental analysis, calc. for $C_{14}H_{68}IN_7O_{67}W_{18}$: C, 3.47; H, 1.42; N, 2.02; I, 2.62. Found C, 3.37; H, 1.56; N, 1.88; I, 2.33.

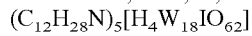
$(C_{12}H_{28}N)_5[H_4W_{18}IO_{62}]$

A solid crystal of $(C_2H_8N)_7[H_2W_{18}IO_{62}] \cdot 5H_2O$ (1.8 g, 0.4 mmol) was dissolved in 0.1 M HCl solution (30 mL). Tetrapropylammonium bromide (5.0 g, 21.4 mmol) was dissolved in water (20 mL) and added with stirring. The precipitate was centrifuged and washed with water, ethanol and ether, and dried in vacuum. Yield: 1.5 g (86.1% based on W). Negative ion ESI-MS (MeCN): m/z 2588.1: $\{TPA_4[H_3IW_{18}O_{62}]\}^{2-}$, 2680.7 $\{TPA_5[H_2IW_{18}O_{62}]\}^{2-}$.

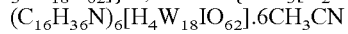
$(C_{16}H_{36}N)_6[H_4W_{18}IO_{62}] \cdot 6CH_3CN$

A yellow solution of $(C_{12}H_{28}N)_5[H_4W_{18}IO_{62}]$ (0.40 g 74.5 mM) in $CH_3CN$ (20 mL; $NBu_4PF_6$, 0.1 M) was reduced at $-0.88V$ vs $Fc^+/Fc$ until the Faradaic current decayed about to zero (about 30 mins). Coulometry indicated the transfer of 0.97(3) electrons per molecule. Pale yellow crystals appeared within a short time (for example, 5 days or one week or a few weeks) and were isolated by filtration, washed with EtOH and $H_2O$, and dried under vacuum for 24 h. Yield: 0.35 g; 79.7%. Negative ion ESI-MS (MeCN): m/z 1719.9: $\{TBA_3[H_4IW_{18}O_{62}]\}^{3-}$, 2821.6 $\{TBA_5[H_3IW_{18}O_{62}]\}^{2-}$.

Electrochemistry

Electrochemical data were obtained by cyclic voltammetry using FRA 2 Autolab Typ III Potentiostat/Galvanostat (with impedance unit) (METROM) with a GC electrode as a working electrode, Pt wire as a counter electrode and a silver wire as pseudo reference electrode in the usual three-electrode setup. The electrochemical measurements were performed under anaerobic conditions in a home-built glass cell containing a three electrode arrangement in which a glassy carbon slat (d=2.0 mm) surrounded by a Teflon shell served as working electrode. Tetrabutylammonium hexafluorophosphate was used as electrolyte (0.1 M). The different potentials were applied and monitored by a METHROM FRA 2 μAutolab Type III Potentiostat/Galvanostat (with impedance unit). The ferrocenium/ferrocence redox couple was observed at 0.4 V.

Bulk Electrolysis

Experiments were carried out using a CHI600D computer-controlled electroanalytical system in the potentiostate mode. The bulk electrolysis H-cell contained a carbon felt electrode and a Pt wire which served as the working and counter electrodes respectively. The working electrode and counter electrode were separated by a glass frit. The reference electrode (Ag/AgCl) was positioned as close as possible to the working electrode in order to maximize the uniformity of potential over its surface. All potentials are referenced to ferrocenium/ferrocence.

$WW_{18}$: Coulometry (at $-0.65V$ vs Ag/AgCl) of the first reduction for 140.0 mg $WW_{18}$ sample. $(C_{12}H_{28}N)_6[H_4W_{19}O_{62}]$ MW=5607.1. Number of electron reduced per cluster=(2.4/96485)/(0.140/5607.1)=1.0.

$\gamma^*$-$TeW_{18}$: Coulometry (at $-0.4V$ vs Ag/AgCl) of the first reduction for a 110.0 mg $\gamma^*$-$TeW_{18}$ sample. $(C_{12}H_{28}N)_7[H_3W_{18}TeO_{62}]$ MW=5736.2. Number of electron reduced per cluster=(1.8/96485)/(0.110/5736.2)=0.97.

$\beta^*$-$IW_{18}$: Coulometry (at $-0.4V$ vs Ag/AgCl) of the first reduction for a 65.0 mg sample of $\beta^*$-$IW_{18}$. $(C_{12}H_{28}N)_6[H_3W_{18}IO_{62}]$ MW=5549.2. Number of electron reduced per cluster=(1.1/96485)/(0.065/5549.2)=0.97.

Density Functional Theory Calculations

FIG. 13 shows schematically a simulation methodology used herein. According to this figure, the atomic coordinates of the POM 53 (as determined by x-ray diffraction) were input into the DFT simulation. The electronic structure was accounted for in the simulation domain bridge. Details about the POM arrangement (POM-layer charge distribution) was input and a device simulation (Garand) based on this information and information about the device was also included. In line with convention, the device description follows the setup shown in FIG. 13: that is, the lowest layer was a substrate 23, the source 19 and drain 21 components were located on the substrate 19 with substrate 19 separating them. An oxide layer 25 was located on the source 19 and drain 21 components, and separated the FG 29 and control gate 27. The control gate 27 was located above the FG 29. Below the FG 29 is an area of dark green, which indicates the transistor channel. The simulation domain bridge was developed in-house. The commercial simulators ADF and Garand were used for DFT and three-dimensional device simulations respectively.

The calculations were carried out by using DFT methodology with the ADF 2008 program. The gradient-corrected functionals of Becke and Perdew for the exchange and correlation energies, respectively, were used to improve the description of the electronic density provided by the local density approximation. A set of Slater-type basis functions of triple-$\xi$_+polarisation quality was employed to describe the valence electrons of all the atoms. Frozen cores consisting of the 1s shell for O, the 1s to 4d shells for W, Te and I were described by means of single Slater functions. Scalar relativistic corrections were included by means of the zeroth-order regular approximation (ZORA) formalism. The BP86/TZP calculations have been proven to be a very adequate methodology to study the electronic structure of polyoxometalates (J. A. Fernández et al., 2007; X. López et al., Inorg. Chem., 2006; J. M. Poblet et al., 2003). Unrestricted methodology for open shell electronic configurations was used.

All the structures discussed through this work were optimised in the presence of a continuous model solvent by means of the conductor-like screening model (COSMO) implemented in the ADF code (C. C. Pye and T. Ziegler, 1999). To define the cavity that surrounds the molecules, a solvent accessible surface (SES) method and a fine tesserae were used. The ionic radii of the atoms, which define the dimensions of the cavity surrounding the molecule, are chosen to be (in Å) 1.26 for W, 1.52 for O, 1.20 for H. The dielectric constant is set to 78 so as to model water as solvent. Due to the presence of protons in $\{W_{18}X\}$ species, the full analysis of the non-conventional WD anions is more complex compared to their $\{W_{18}X_2\}$ analogues. Here is presented the results for both the non-protonated and the di-protonated geometries at the two $\mu_3$-O atoms, which are the most basic oxygen atoms (see L. Vilà-Nadal et al., 2012).

EPR Study of Compounds

X-Band EPR spectra were recorded on a Bruker Elexsys E500 spectrometer with an ER 4122SHQE cavity in cylindrical TE011 mode as approximately $1\times10^{-4}$ M frozen solution at 100 K. In order to prove whether the cluster itself is paramagnetic in the ground state the non-reduced species was initially measured in CH$_3$CN at 100 K and no detectable signal was observed.

Discussion

Described herein are Dawson-like $\{W_{18}O_{54}XO_6\}$ clusters with localized redox active 'inner sphere' templates where X=I or Te. It is shown that these moieties can adopt different oxidation states e.g. $I^{VII/VI}$ or $Te^{VI/V}$ respectively. The clusters were studied using cyclic voltammetry, UV and EPR spectroscopy combined with experimental comparison to a 'control', non-hetero-atom embedded Dawson-like cluster. The electronic structure of both the oxidized and reduced forms of the clusters was investigated using DFT based upon X-ray data of the oxidised forms (D.-L. Long et al., 2006, 118; C. Ritchie et al., 2007; D.-L. Long, et al., 2008; J. Yan et al., 2009). As a 'built-in' control a Dawson-like tungstate cage $\{W_{18}O_{54}\}$ was used, where the template is [WO$_6$]$^{6-}$ ([H$_4$W$_{18}$O$_{56}$(WO$_6$)]TPA$_6$/WW$_{18}$) (TPA=tetrapropylammonium) (mixture of both isomers α and γ*) as a reference system to compare directly with the [TeO$_6$]$^{6-}$ (γ*-[H$_3$W$_{18}$O$_{56}$(TeO$_6$)]TPA$_7$/**γ*-TeW$_{18}$**) (J. Yan et al., 2009) and [IO$_6$]$^{5-}$ (β*-[H$_3$W$_{18}$O$_{56}$(IO$_6$)]TPA$_6$/**β*-IW$_{18}$**) templated WD structures (D.-L. Long, et al., 2008). The shorthand notation in bold is used below to describe the relevant POM formulae.

Described here is the redox behaviour of non-conventional Wells-Dawson POMs. γ*-TeW$_{18}$ and β*-IW$_{18}$ are seen to initially exhibit a localized one-electron process whereby the central heteroatom is reduced Te$^{(V\ to\ IV)}$, I$^{(VII\ to\ VI)}$. It was also found that reduction at greater negative potentials also reduces the tungsten framework, resulting in a mixture of localised and delocalized electron containing species.

The whole redox process is completely controllable and reversible and the reduction of specific sites in POMs is known, e. g. in the case of vanadium substituted POMs like [XV$^V$M$_{11}$O$_{40}$]$^{4-}$, which exhibit a V$^{(V)}$ to V$^{(IV)}$ reduction (S. P. Harmalker et al., 1983).

This is the first time that a reduced POM with a localized electron is located on a main group heteroatom has been described, and as such these compounds show a new type of localized 'innersphere' radical.

Figure 14:
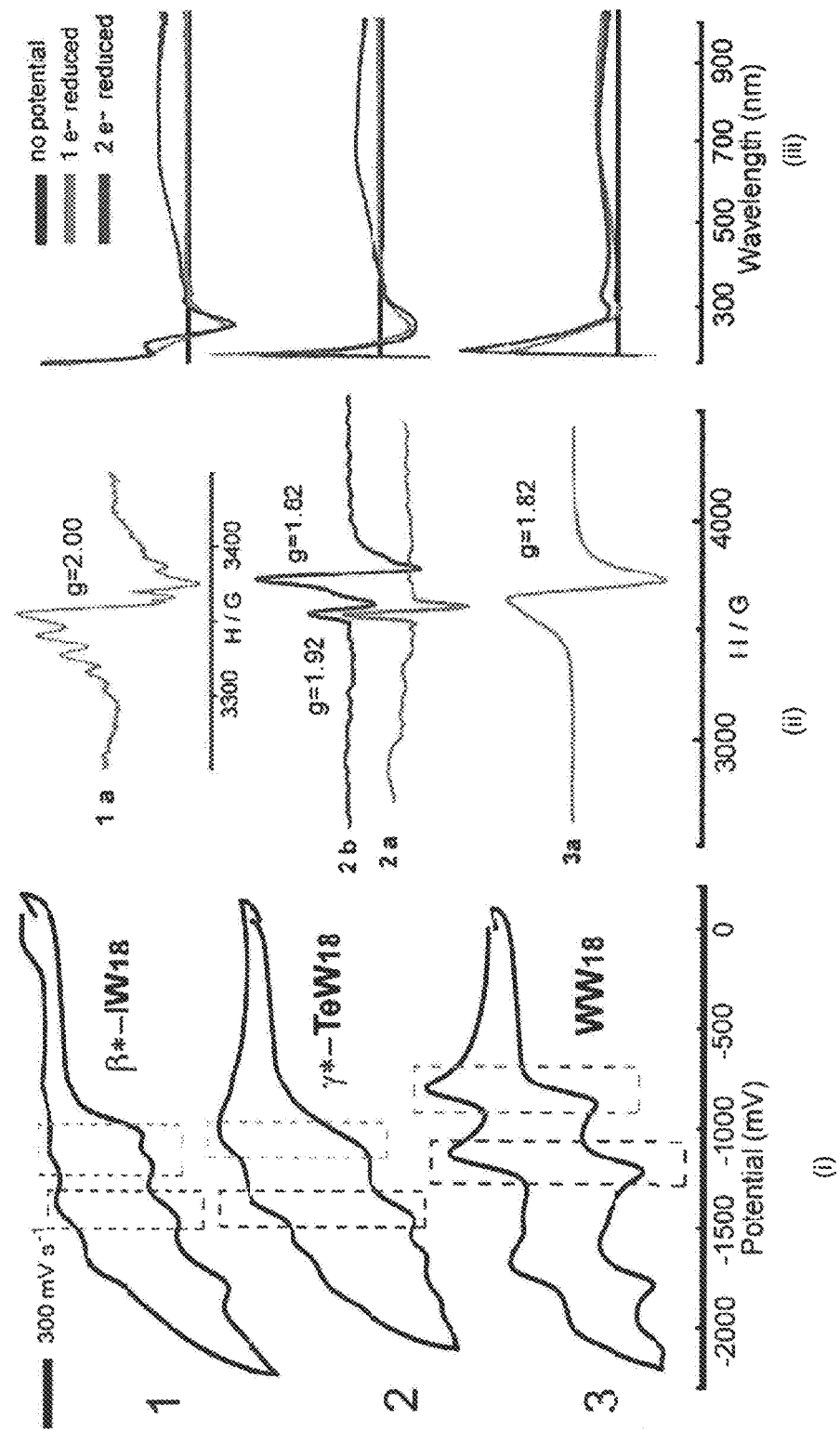
FIG. 14 is a selection of analytical spectra. (i): selected cyclic voltammograms in mV at 300 mVs⁻¹ scan rate: 1) $\beta^*$-$[W_{18}O_{56}(IO_6)]^{9-}$ ($\beta^*$-$IW_{18}$); 2) $\gamma^*$-$[W_{18}O_{56}(TeO_6)]^{10-}$ ($\gamma^*$-$TeW_{18}$) and 3) $[W_{18}O_{56}(WO_6)]^{10-}$ ($WW_{18}$). Highlighted at right (- - - -) is the first reduction and highlighted at left (- - - -) is the second reduction. (ii): Electron paramagnetic resonance (EPR) spectra in H/G of acetonitrile solutions at 100 K: 1a) one-electron reduced $\beta^*$-$IW_{18}$. ¹²⁷I hyperfine structure is observed. 2a) one-electron reduced $\gamma^*$-$TeW_{18}$ (bottom line); 2b) two electron reduced $\gamma^*$-$TeW_{18}$ (top line); 3a) one electron reduced $WW_{18}$. (iii): Spectroelectrochemistry: Delta absorption spectra (ΔOD/a.u.) in nm: 1) $\beta^*$-$IW_{18}$, 2) $\gamma^*$-$TeW_{18}$ and 3) $WW_{18}$ in $CH_3CN$ under argon.

Cyclic voltammetry studies on [H$_n$M$_{18}$O$_{56}$(XO$_6$)]$^{m-}$ (X=W, Te, I) using a glassy carbon electrode in acetonitrile showed a series of reversible one-electron redox processes, potentials are summarized in Table 2 and FIG. 14. Assignment of a one-electron reduction process was supported by bulk electrolysis. The first reduction of WW$_{18}$ showed a visually noticeable optical contrast (transparent to blue), due to the W$^{IV}$ to W$^V$ reduction process and this behaviour was not observed for the one electron reduced species of γ*-TeW$_{18}$ and β*-IW$_{18}$.

TABLE 2

Summary of the reversible potentials for the reduction of
[H$_n$M$_{18}$O$_{54}$(XO$_6$)]$^{m-}$ X = W, Te, I at a GC electrode in acetonitrile

| | $E^b$ in mV vs Fc/Fc$^+$ | | |
|---|---|---|---|
| m | 6−/7− | 7−/8− | 8−/9− |
| [H$_4$W$_{18}$O$_{54}$(WO$_6$)]$^m$ | −596 | −933 | −1497 |
| m | 7−/8− | 8−/9− | 9−/10− |
| [H$_3$W$_{18}$O$_{54}$(TeO$_6$)]$^m$ | −918 | −1255 | −1448 |
| m | 6−/7− | 7−/8− | 8−/9− |
| [H$_3$W$_{18}$O$_{54}$(IO$_6$)]$^m$ | −916 | −1179 | −1496 |

The UV-vis absorption spectrum of reduced and non-reduced clusters is shown in FIG. 14. The three two electron reduced clusters show a broad absorption at approx. 700 nm, characteristic for reduced POMs (E. Papaconstantinou, 1989). These data suggest that for the single-reduced $\{W_{18}O_{54}XO_6\}$, when X=I or Te, the electron is localized on the template $\{XO_6\}$. It is clear that there is a difference between the first and second reductions for β*-IW$_{18}$ and γ*-TeW$_{18}$. Above around 400 nm, the blue line (1e$^-$ reduced) extends in a similar position to the black line (no potential) for these molecules, while the red line (2e$^-$ reduced) extends substantially above the black line. In contrast, the blue and red lines for WW$_{18}$ substantially overlap in this region. Accordingly, it can be determined that the 1e reduction is different for β*-IW$_{18}$, γ*-TeW$_{18}$ compared to WW$_{18}$.

For the initial one-electron-transfer step, bulk reductive electrolysis was performed and the EPR spectra obtained after bulk electrolysis at the first reduction potential are indicative for Te$^{(V)}$ and I$^{(VI)}$. The one and two-electron processes for compounds WW$_{18}$, γ*-TeW$_{18}$ and β*-IW$_{18}$ are described below in equations 1 to 6.

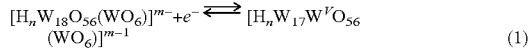

(1)

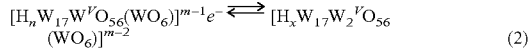

(2)

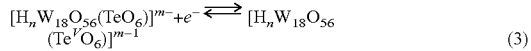

(3)

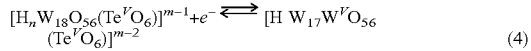

(4)

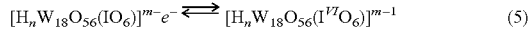

(5)

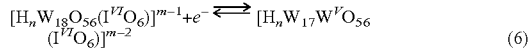

(6)

The EPR spectra after one-electron-reduction of WW$_{18}$, γ*-TeW$_{18}$ and β*-IW$_{18}$ are shown in FIG. 14. In the case of WW$_{18}$, a broad signal was observed with a g-value of 1.82. This value was within the range found for axial oxo complexes of tungsten (V) (G. M. Varga Jr. et al., 1970; R. A. Prados and M. T. Pope, 1976). In contrast, for clusters γ*-TeW$_{18}$ and β*-IW$_{18}$ a sharp signal with a g-value 1.92 was observed, while the solution stayed colourless, indicating a localised electron on the template of the cluster, forming a non-mixed valent reduced species. In the case of one-electron reduced β*-IW$_{18}$ hyperfine splitting arising from the $^{127}$I nuclei was observed, considered to be another clear indicator for the heteroatom localized electron. After re-oxidizing the samples the signals disappeared, and could once again be reduced given the same behaviour, demonstrating a fully reversible process. When transferring two electrons via bulk electrolysis no changes were obtained for the reference compound WW$_{18}$. For cluster γ*-TeW$_{18}$ and β*-IW$_{18}$, however, two signals could be determined, one indicating a delocalized electron over the shell (g-value 1.82), characterized also by the blue colour of the solution and the other exhibiting the localized electron on the template (g-value 1.92).

Density functional theory (DFT) calculations were undertaken on the clusters. The DFT formalism is a very useful tool to understand electronic and magnetic properties of POMs (J. M. Poblet et al., 2003; A. J. Bridgeman and G. Cavigliasso, 2003; X. López et al., Dalton Trans., 2006; X. López et al., 2012). The conventional Wells-Dawson cluster α-[W$_{18}$O$_{54}$(PO$_4$)$_2$]$^{6-}$ α-P$_2$W$_{18}$ is one of the most reviewed tungstophosphates since the resolution of its structure more than 50 years ago (A. F. Wells, 1945; B. Dawson, 1953; R. Strandberg, 1975) and it was taken here as benchmark for the calculations. Previous studies have helped to rationalize the isomerism and the redox properties of the conventional Wells-Dawson heteropolyanions (X. López et al., Inorg. Chem., 2003; F.-Q. Zhang et al., 2011). In a recent study, the stability of isomers α*, β* and γ* in the non-conventional structures was rationalised from the analysis of the frontier orbitals (L. Vilà-Nadal et al., 2012). The same theoretical approach was used here.

In general terms, the electronic structure of a fully oxidized POM is as follows: doubly occupied orbitals (HOMO) are formally delocalized over the oxo ligands, and perfectly separated from the unoccupied set of d-metal orbitals (LUMO) (X. López et al., 2002; J. M. Maestre et al., 2001). FIG. 6 compares the relative energies of the LUMOs in the fully oxidized conventional Wells-Dawson, [W$_{18}$O$_{54}$(PO$_4$)$_2$]$^{6-}$, and the four non-conventional Wells-Dawson structures, [H$_n$M$_{18}$O$_{56}$(XO$_6$)]$^{m-}$ when X=W, Te and I. In this figure, the words 'cap' and 'belt' indicate the localisation of each MO in the POM geometry. The symmetry of each molecule (for example, D$_{3h}$, C$_{3v}$) is shown above the MOs. The structure underneath shows the electron delocalization of the LUMO. The values indicated in eV show the gap between the HOMO and LUMO. When the central heteroatom is tungsten, the LUMO and LUMO$^{+1}$ are mainly delocalized over the belt metals, as it occurs in the classic α-P$_2$W$_{18}$ structure. Consequently, the first reduction of WW$_{18}$ would take place at the equatorial region. Inclusion of Te and I as central atoms modifies the energy and composition of the lowest unoccupied orbitals. This modification of the traditional distribution of the LUMOs is due to the greater electron affinities of Te and I. Thus in the case of γ*-TeW$_{18}$ and β*-IW$_{18}$ the LUMO is mainly localized at the central heteroatom, therefore the first reduction takes place at the tellurium and iodine centres.

According to the molecular orbital diagram in FIG. 6, the reduction on the belt tungsten atoms would require about 1 eV more than the reduction of the more electronegative iodine centre. Orbital energy differences permit a good estimation of the reduction energy differences (X. López et al., 2002). This phenomenon is comparable to the mixed metal heteropolyanions, for instance the trisubstituted [P$_2$W$_{15}$V$_3$O$_{62}$]$^{9-}$ Wells-Dawson anion, which is preferentially reduced in the vanadium polar sites (X. López et al., 2002; J. M. Maestre et al., 2001).

A simple analysis of the frontier orbitals of the fully oxidized molecules helped the rationalization of the first two examples of non-blue, non-mixed valent single reduced clusters. Calculations performed on the reduced structures confirmed the hypothesis; see Tables 3 and 4. The ground state for the single-reduced WW$_{18}$ has nearly 80% of the spin density delocalized over the belt atoms, whereas γ*-TeW$_{18}$ and β*-IW$_{18}$ singly reduced clusters had the spin density mainly localized at the six oxygen atoms of the central {XO$_6$} moiety. The spin density displayed some polarization, with 0.12 alpha electrons localized over the Te and 0.72 beta electrons delocalized over the oxygen atoms. A similar situation was observed when the central unit is {IO$_6$}, 0.12 alpha and 0.73 beta electrons, see Tables 5 and 6. Spin polarization is a mechanism related to the minimization of Coulomb (Jij) and exchange (Kij) integrals (see E. Ruiz et al., 2005 and J. Cano et al., 1998 for a wide discussion in MX$_6$ systems). For the WW$_{18}$ double reduced clusters, the spin polarization was also mainly located at the belt. In the case of the double reduced γ*-TeW18 and β*-IW18 clusters, the spin density was delocalized over the belt and the central {XO$_6$} moiety. The experimental data agreed with these results and demonstrated that the first reduction of γ*-TeW18 and β*-IW18 occurred on the central {XO$_6$} unit.

Accordingly, it is possible to reduce a heteropolyanion to give a localized electron on the inner heteroatom main group template; in this case involving the Dawson-like cluster when X=I or Te. This unusual behaviour differs fundamentally from classic reduced POMs with the electron delocalized over the metal shell. Thus, this unique class of POMs is expected to find utility as a new type of 'inner-sphere' electron transfer device/reagent.

TABLE 3

Orbital energies (eV); experimental ($E_{1/2}$), theoretical ($E_c$) and absolute values for the first cathodic peaks (V) and relevant theoretical interatomic distances (Å) and angles (degree) for the COSMO-optimized Wells-Dawson anions. (RE = Reduction Energy).

| | | | Single reduced anions (Doublet state) (α-β) | | | | | Double reduced anions (Triplet state) (α-β) | | | | |
|---|---|---|---|---|---|---|---|---|---|---|---|---|
| | | | | {XO$_6$} | | | E | | {XO$_6$} | | | E |
| | Ch | sym | cap | belt | X | O$^{central}$ | (eV) | cap | belt | X | O$^{central}$ | (eV) |
| α-P$_2$W$_{18}$ | 6− | D$_{3h}$ | 0.01 | −0.82 | N.E. | N.E. | $^2A_1''$ | 0.00 | −0.09 | −1.54 | N.E. | N.E. | $^3E''$ | 0.30 |
| α-WW$_{18}$ | 10− | D$_{3h}$ | 0.02 | −0.79 | 0.02 | 0.01 | $^2A_1''$ | 0.00 | −0.10 | −1.50 | −0.01 | 0.02 | $^3E''$ | 0.32 |
| γ*-WW$_{18}$ | 10− | D$_{3d}$ | 0.00 | −0.78 | 0.00 | 0.01 | $^2A_{1u}$ | 0.00 | −0.13 | −1.48 | 0.00 | 0.02 | $^3E_g$ | 0.32 |
| γ*-TeW$_{18}$ | 10− | D$_{3d}$ | 0.00 | −0.09 | 0.10 | −0.72 | $^2A_{1g}$ | 0.00 | −0.01 | −0.88 | 0.10 | −0.71 | $^3A_{1u}$ | 1.10 |
| β*-IW$_{18}$ | 9− | C$_{3v}$ | 0.00 | −0.03 | 0.12 | −0.73 | $^2A_1$ | 0.00 | 0.00 | −0.81 | 0.12 | −0.72 | $^3A_2$ | 1.79 |

TABLE 4

Electronic parameters and reduction energies (eV) for certain POM clusters

| | α-P$_2$W$_{18}$ | α-WW$_{18}$ | α-H$_2$WW$_{18}$ | γ*-WW$_{18}$ | γ*-H$_2$WW$_{18}$ | γ*-TeW$_{12}$ | γ*-H$_2$TeW$_{18}$ | β*-IW$_{18}$ | β*-H$_2$IW$_{18}$ |
|---|---|---|---|---|---|---|---|---|---|
| E(HOMO) | −6.71 | −4.95 | −5.50 | −5.30 | −5.92 | −5.52 | −5.92 | −5.81 | −6.20 |
| E(LUMO) | −4.39 | −3.64 | −4.09 | −3.70 | −4.10 | −3.65 | −4.10 | −4.78 | −4.97 |
| RE | −4.29 | −3.02 | −3.97 | −3.66 | −4.19 | −4.43 | −4.64 | −5.25 | −5.42 |
| q/m | 0.33 | 0.53 | 0.44 | 0.53 | 0.44 | 0.56 | 0.44 | 0.50 | 0.38 |

TABLE 5

Orbital energies (in eV), experimental ($E_{1/2}$) and theoretical ($E_c$) absolute values for the first cathodic peaks (in V), and reduction energies (RE) for the COSMO-optimized Wells-Dawson anions.

| | sym | E$_{HOMO}$ | E$_{LUMO}$ | ΔE$_{H-L}$[a] | E$_{1/2}$ vs (SCE)[b] | RE (eV) | E$_c$ vs (NHE)[c] | Δ(E$_{1/2}$ − E$_c$)[d] |
|---|---|---|---|---|---|---|---|---|
| α-[W$_{18}$O$_{54}$(PO$_4$)$_2$]$^{6-}$ | D$_{3h}$ | −6.71 | −4.39 | 2.32 | 0.098 | −3.62 | −4.63 | 0.34 |

| | sym | E$_{HOMO}$ | E$_{LUMO}$ | ΔE$_{H-L}$ | E$_{1/2}$ vs (FC$^+$/FC)[e] | RE (eV) | E$_c$ vs (NHE)[c] | Δ(E$_{1/2}$ − E$_c$) |
|---|---|---|---|---|---|---|---|---|
| α-[W$_{18}$O$_{56}$(WO$_6$)]$^{10-}$ | D$_{3h}$ | −4.95 | −3.64 | 1.31 | −0.60 | −3.62 | −3.62 | −0.70 |
| α-[H$_2$W$_{18}$O$_{56}$(WO$_6$)]$^{8-}$ | | −5.50 | −4.07 | 1.74 | −0.60 | −3.97 | −3.62 | −0.65 |
| γ*-[W$_{18}$O$_{56}$(WO$_6$)]$^{10-}$ | D$_{3d}$ | −5.30 | −3.70 | 1.60 | −0.60 | −3.66 | −3.62 | −0.64 |
| γ* [H$_2$W$_{18}$O$_{56}$(WO$_6$)]$^{8-}$ | | −5.69 | −4.09 | 1.60 | −0.60 | −4.19 | −3.62 | −0.13 |
| γ*-[W$_{18}$O$_{56}$(TeO$_6$)]$^{10-}$ | D$_{3d}$ | −5.52 | −3.88 | 1.65 | −0.92 | −4.41 | −3.99 | 0.42 |
| γ*-[H$_2$W$_{18}$O$_{56}$(TeO$_6$)]$^{8-}$ | | −5.92 | −4.10 | 1.82 | −0.92 | −4.64 | −3.90 | 0.64 |
| β*-[W$_{18}$O$_{56}$(IO$_6$)]$^{9-}$ | C$_{3v}$ | −5.81 | −4.78 | 1.04 | −0.92 | −5.24 | −3.99 | 1.24 |
| β*-[H$_2$W$_{18}$O$_{56}$(IO$_6$)]$^{7-}$ | | −6.20 | −4.97 | 1.23 | −0.92 | −5.42 | −3.99 | 1.24 |

[a]ΔE$_{H-L}$ = E$_{LUMO}$ − E$_{HOMO}$ (eV).

[b]MT Pope, E. Papaconstantinou, *Inorg. Chem.* 1967, 6, 1147-1152.

[c]Predicted absolute potential vs NHE using Cramer corrected absolute zero potential.

[d]Difference between computed and experimental potentials.

[e]This work.

TABLE 6

Spin densities (α-β) on belt and cap metal centres and on the central {XO$_6$} unit for the singly- and doubly-reduced anions.

| | Single reduced anions (Doublet state) (α-β) | | | | Double reduced anions (Triplet state) (α-β) | | | |
| | | | {XO$_6$} | | | | {XO$_6$} | |
| | Ch | cap | belt | X | O$^{central}$ | cap | belt | X | O$^{central}$ |
|---|---|---|---|---|---|---|---|---|---|
| α-H$_2$WW$_{18}$ | 8− | 0.00 | −0.82 | 0.01 | 0.01 | −0.10 | −1.33 | 0.00 | 0.02 |
| γ*-H$_2$WW$_{18}$ | 8− | 0.00 | −0.80 | 0.01 | 0.01 | −0.12 | −1.57 | 0.00 | 0.02 |
| γ*-H$_2$TeW$_{18}$ | 8− | 0.00 | −0.11 | 0.10 | −0.70 | −0.01 | −0.91 | 0.10 | −0.72 |
| β*-H$_2$IW$_{18}$ | 7− | 0.00 | −0.04 | 0.14 | −0.80 | 0.01 | −0.87 | 0.14 | −0.76 |

Figure 20:
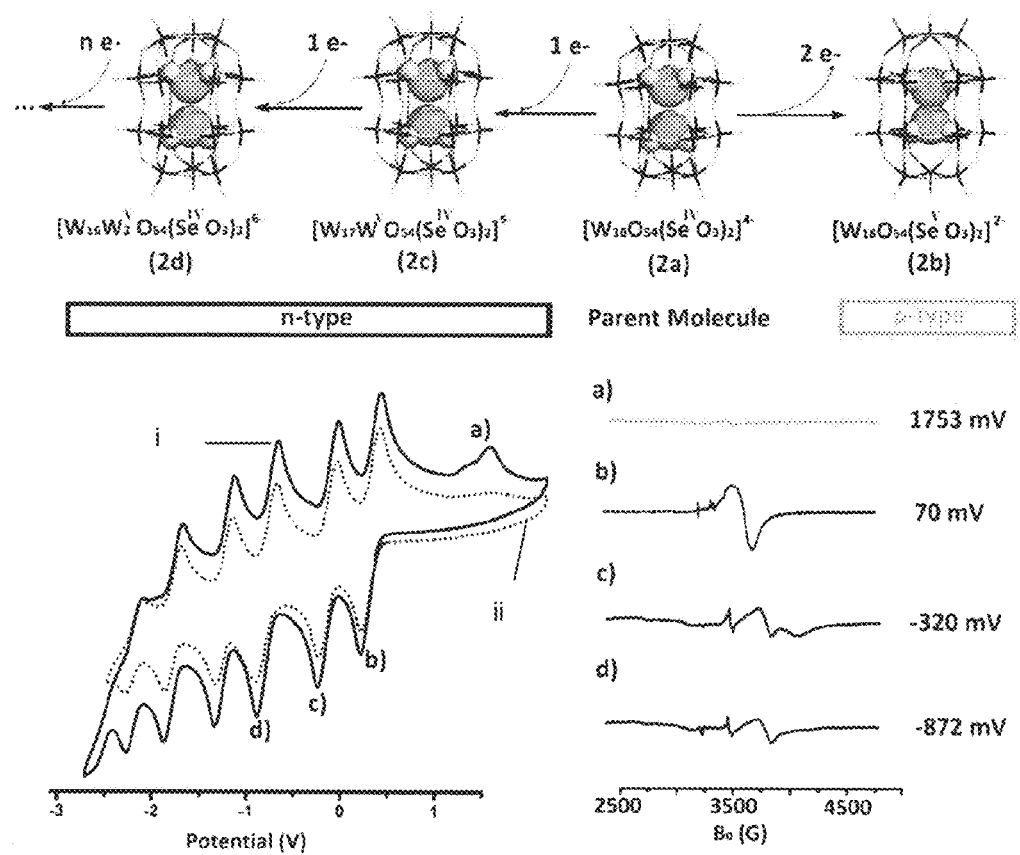
FIG. 20 shows a summary of the redox behaviour of $[W_{18}O_{54}(SeO_3)_2]^{4-}$. The POM was able to change between p-type (upper right-most molecule, labelled (2b)) and n-type (upper left two molecules, labelled (2d) and (2c)) semiconducting behaviour using a voltage push. The CV in the lower left corner was obtained for microcrystals adhered to a GCE (diameter=1.5 mm) 0.1M TBA $PF_6$ solution at a with scan rate=200 mV $s^{-1}$ and scanning range of −2.9 V to 1.5 V (black line, labelled i) or −2.7 V to 1.5 V (dotted blue line, labelled ii). The EPR spectra (lower right corner) are measured at 100 K in a frozen acetonitrile solution containing the clusters with different redox states: a) oxidized cluster/EPR base line, b)-d) one, two and three electron reduced cluster respectively. The EPR measurement (with change in field $B_0$ (G)) was undertaken after bulk electrolysis, the applied voltage is shown in bold on the right.

Until now, the electronic properties of bulk semiconductors have only been tailored through the irreversible introduction of dopant ions, modifying the electronic structure by either injecting electrons or core holes. The present inventors have devised novel POMs with tunable redox properties. A novel inorganic molecular cluster {Se$_2$W$_{18}$O$_{60}$} embedding redox active selenium template with multi-switchable states has been prepared and is described here. In this study, the theoretical methods have been developed and the first results demonstrating the utility of the selenium-containing POM (Se-POM) in electronic devices are presented. Due to the encapsulation of redox active templates (L. Vilà-Nadal et al., Angew. Chem. Int. Ed., 2013), this cluster demonstrated exceptionally rich redox behaviour, arising from the tungsten atoms as well as the selenite template, see FIG. 20.

A new host-guest cluster with specific redox behaviour was designed and synthesized through DFT investigations, followed by a device modelling approach permitting the exploration for integrating many clusters into CMOS-based devices. A core-shell 'Dawson-like' archetype was selected as the functional part of the switching node. With thermal post-processing stability in mind a tungsten-based rather than molybdenum-based core-shell cluster was chosen. Complementary DFT calculations were carried out in order to pinpoint the energy levels of various hetero-atom templates such as P, S, Se and Ge to help choose an appropriate heteroatom. The DFT study suggested that the inclusion of Se$^{IV}$ dopants may lead to oxidation state change (Se$^{IV \rightarrow V}$) allowing ultimately the formation of a Se—Se bond within the cluster.

Figure 19:
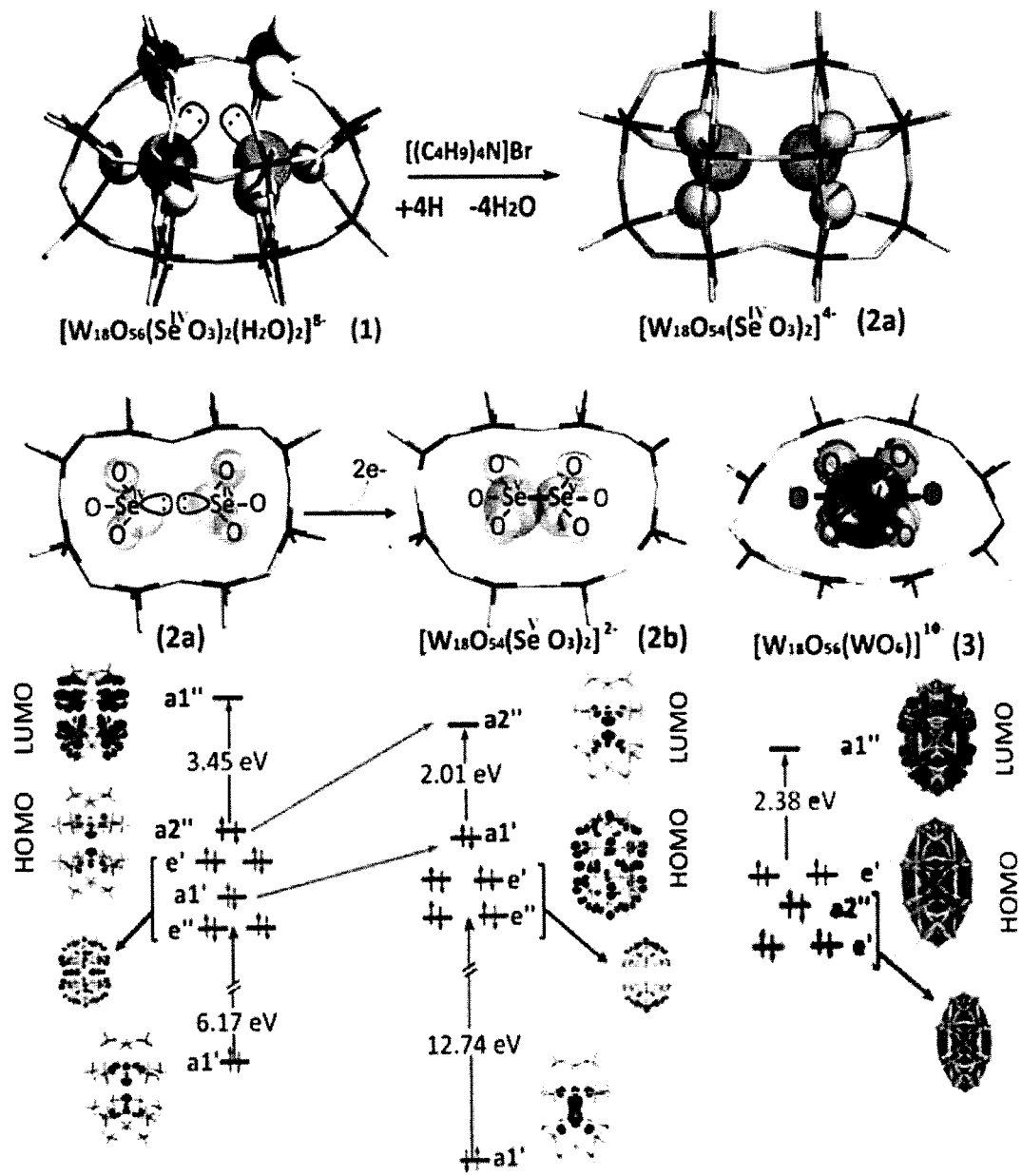
FIG. 19 shows schematically the transformation of a Se-containing POM cluster from an inactive to electronically active form (top); a schematic diagram of the formation of a $Se^V$—$Se^V$ bond and comparison with a control cluster $[W_{18}O_{56}(WO_6)]^{10-}$ (middle); and results from DFT analysis demonstrating frontier orbitals and formation of a $Se^V$—$Se^V$ bond and for a 'control' compound (bottom).

More particularly, a novel tungsten(VI) oxide polyoxometalate molecular nano-cluster (A. Müller et al., 1999) containing two embedded redox agents {SeO$_3$} inside the molecular tungsto-oxo shell has been prepared that shows (can be configured with) p- or n-type semiconducting behaviour, depending on the switchable electronic state of the cluster cage or the embedded redox active ion, and that can reversibly interconvert between four electronic states (see FIG. 15 and FIG. 19).

Five electronic states (see FIG. 19) are easily accessible electrochemically for the cluster (2-, 4-, 5-, 6-, 7-) and can be switched resulting in 'n-type' reduced as well as the oxidation of the embedded two {(Se$^{IV}$O$_3$)$_2$}$^{4-}$ to give an EPR silent 'p-type' {Se$^V_2$O$_6$}$^{2-}$ cluster containing a {Se$^V$—Se$^V$} bond and a new 5+ oxidation state for selenium which has never been observed before. The p-type behaviour is derived from the presence of a peak in the positive part of the CV curve. Embedding the selenium template inside the cluster appears to allow a supramolecular-driven electronic reorganization resulting in the formation of a Se—Se bond (confirmed by CV and EPR).

Without wishing to be bound by theory, the inventors propose the following mechanistic outline. Upon positive electronic activation two electrons were ejected from the active selenite anions along with the concomitant formation of an O$_3$Se—SeO$_3$ bonding interaction between the two selenium centres inside the cluster shell. In contrast, application of a low negative potential injected an electron into the shell, switching it from an oxidized state to a reduced state along with the associated weaker Se - - - Se interaction, while a high negative potential further injected the electrons to Se$^{IV}$ and formed Se$^{III}$, therefore the cluster switch to a fourth state with reduced shell and reduced template.

POM compounds have a characteristic behaviour of accepting electrons without significant structural changes, as well as n-type semi-conductivity and good solubility in a wide variety of solvents and stability toward reduction both in solution and in the solid state (E. Coronado et al., 2008; J. Lehmann et al., 2007; A. B. Bourlinos et al. 2004; M. T. Pope and A. Muller, 1991). These clusters are extraordinary molecules, because they exhibit high charge and low charging energies, are of nano-scale dimensions, and their framework cage can encapsulate many types of templates (E. Coronado and C. J. Gomez-Garcia, 1998). The potential to incorporate guests to dope the metal oxide cage is of particular interest, because the electronic properties of the cluster could be manipulated using these internal guests (M Sadakane and E. Steckhan, 1998; D.-L. Long et al., 2007). The classic POM cluster has oxo anion guests based upon main group elements, such as phosphorus or silicon, which are vital for retaining the structural integrity of the cluster, and which are normally chemically inert. Previously, the present inventors have hypothesized that the embedding of electronically active templates in metal oxide cage resulting of nonconventional POMs and their unique properties would open the way to the design of molecular transition metal oxide exhibiting properties not observed in their bulk analogues (D.-L. Long and L. Cronin, 2006). The results are promising on developing multiple state redox active clusters, as discussed for a particular example below. A previous study on the thermochromic molybdenum (VI) oxide molecular nanocluster containing two embedded sulphite redox templates showed that the cluster could be activated and reversibly interconverted between two electronic states (C. Fleming et al., 2008; R. Tsunashima et al., 2011). The development of this type of cluster is arduous because, despite the fact that spectacular assembly control has been demonstrated to enable the formation of a predetermined POM structure, the controlled synthesis of targeted POMs with selective templates is still a challenge for chemists.

Figure 15:
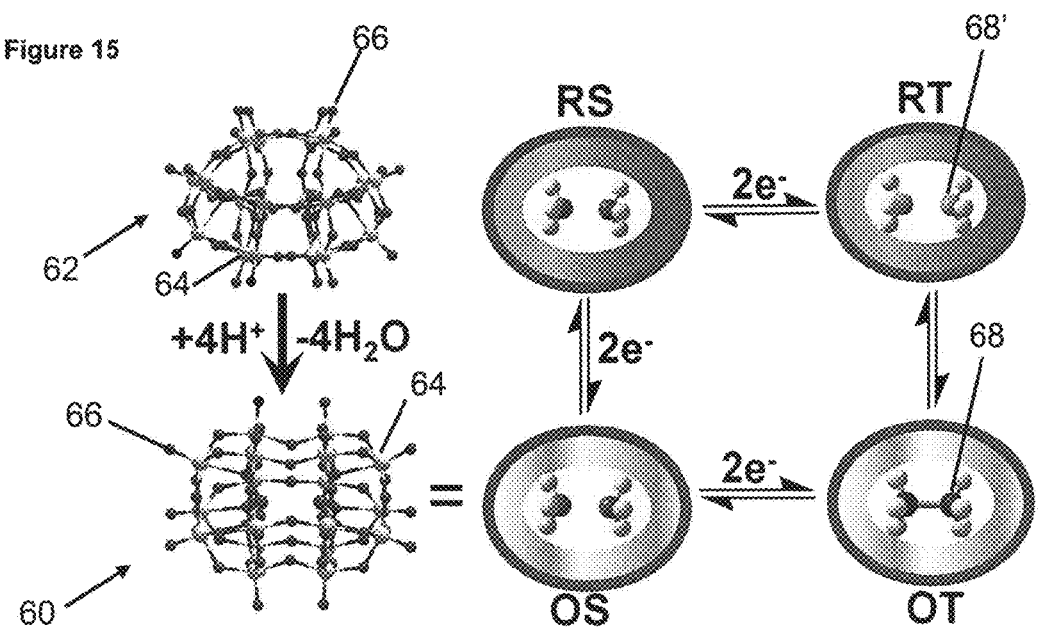
FIG. 15 shows the molecular structure of the $[W_{18}O_{54}(SeO_3)_2]^{4-}$ cluster (left) and reversible redox states (right). The $\{W_{18}O_{54}(SeO_3)_2\}$ cluster framework is shown at the bottom left and the precursor cluster $[W_{18}O_{56}(SeO_3)_2(H_2O)_2]^{8-}$ is presented at the top left. (Belt and cap metal atoms are not distinguished in this Figure). Hydrogen atoms, solvent and counter anions are omitted for clarity. In the scheme on the right, the $[W_{18}O_{54}(SeO_3)_2]^{4-}$ cluster is abbreviated to the ellipse containing two selenites. Its redox states are: (I) OS state with Oxidized Shell; (II) OT state with Oxidized Template; (III) RS state with Reduced Shell; (IV) RT state with Reduced Template and reduced shell.

In the present work, a systematic study of design, synthesis and characterization of the type of {W$_{18}$O$_{54}$} caged nonconventional POM cluster with electronically active selenite templates was performed. A family of POMs was tailored as a molecular functionalized tungstate oxide cluster such as α-$\{W_{18}O_{54}(SeO_3)_2\}$ 60, containing two redox-active selenite anions 68, which were positioned closely within the tungsten oxo shell. Due to their encapsulation, this cluster family showed rich redox behaviour, not only from the W centers, but also from the selenite templates, and without causing a bulk structural change. The $[W_{18}O_{54}(SeO_3)_2]^{4-}$ cluster could go through four well distinguishable reversible states (RS, RT, OS, OT), and at least four electrons could be injected to the metal oxide cage and two electrons could be removed from the selenite template 68. The reduction of the cluster elongated the Se- - -Se distance and oxidation could shorten it and finally led to the formation of a Se—Se bond, where the $Se^V$ species 68 was detected for the first time and stabilized as the $O_3Se$—$SeO_3$ form, see FIG. 15. As shown in the left part of FIG. 15, the $\{W_{18}O_{54}(SeO_3)_2\}$ cluster 60 was prepared from the precursor molecule $[W_{18}O_{56}(SeO_3)_2(H_2O)_2]^{8-}$ 62. The addition of four protons (loss of four water molecules) was observed to cause a change in the geometry of the cage made up of metal 64 and oxygen 66 atoms. (In this representation, no distinction is made between metal atoms 64 in the belt and cap regions.) The selenium atoms 68 are shown inside the cage structure. On the right in FIG. 15 is shown a schematic representation of the redox changes that the present inventors propose, as discussed above. The $Se^{III}$ atoms 68' were found when the template was reduced and $Se^V$ atoms 68 were found when the template was oxidised.

Figure 32:
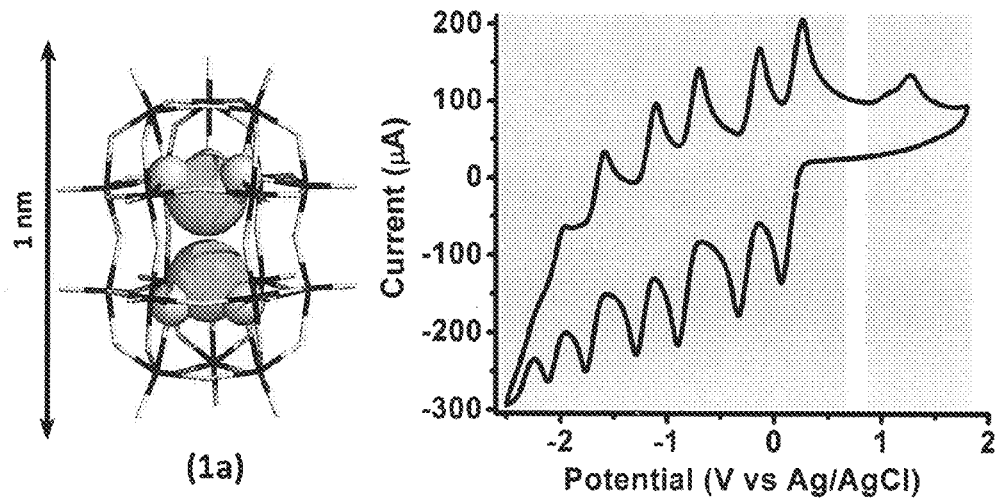
FIG. 32 left: Crystal structure of the core-shell cluster $[W_{18}O_{54}(SeO_3)_2]^{4-}$ with the $\{W_{18}O_{54}\}$ cage shown as black and grey lines respectively. The two Se core dopants are shown as orange spheres inside the cage. The cluster cage can be reduced multiple times (grey area) and the two Se dopants at the POM cluster core can be oxidised (orange area). Right: The CV obtained from microcrystals of $[W_{18}O_{54}(SeO_3)_2]^{4-}$ adhered to a GCE (diameter=1.5 mm) in 0.1M TBA $PF_6$ acetonitrile solution at a scan rate= 200 mV s$^-$ and scanning range of −2.5 V to 1.8 V against a Ag/AgCl reference.

The target cluster was synthesized by a stepwise chemical approach utilizing a self-reorganization process of molecular polyanions. To understand the assembly behaviour of POMs with selenite template, the synthetic parameter-matrix including the concentration of tungstate, organic cations, pH, and ionic strength was carefully screened in the initial study with the assistant probe of ESI-MS technology (J. Yan et al., 2009). The precursor $[W_{18}O_{56}(SeO_3)_2(H_2O)_2]^{8-}$ 62 was synthesized whereby the $\{SeO_3\}$ supramolecular dopants were positioned in the inner cavity of the cluster pointing away from each other. In the weak acidic solution, the Dawson type cluster $[W_{18}O_{56}(SeO_3)_2(H_2O)_2]^{8-}$ 62 could be detected, which could be isolated by using organic dimethylammonium cations (DMAH) in gram scale with a yield of 46% as crystalline compound $(DMAH)_7Na[W_{18}O_{56}(SeO_3)_2(H_2O)_2].20H_2O$. X-Ray single crystal diffraction of $[W_{18}O_{56}(SeO_3)_2(H_2O)_2]^{8-}$ showed that it contained two selenium templates in the nano-sized $\{W_{18}O_{54}\}$ tungsten oxo cage. The two triangular pyramid $\{SeO_3\}$ templates adopted a "shoulder by shoulder" arrangement with Se- - -Se distance of 0.348(2) nm inside. This orientation led to the deformity of the cluster, which decreased the cluster symmetry to $C_{2v}$ (D.- L. Long et al., Angew. Chem. Int. Ed., 2005). The octahedral tungstate units close to the lone pair electrons of $Se^{IV}$ were not bonded to the template and contributed to the tungsten oxo framework with an extra oxo terminal ligand or a water ligand, which allowed the further sculpture of the $[W_{18}O_{56}(SeO_3)_2(H_2O)_2]^{8-}$ to become possible. Further cations and solvent exchange treatment of $(DMAH)_7Na[W_{18}O_{56}(SeO_3)_2(H_2O)_2].20H_2O$ under strong acidic condition led to the self-assembly of $[W_{18}O_{56}(SeO_3)_2(H_2O)_2]^{8-}$ to $[W_{18}O_{54}(SeO_3)_2]^{4-}$, see FIG. 15. Thus by cation metathesis and heating, 62 was transformed into $[W_{18}O_{54}(SeO_3)_2]^{4-}$ 70 whereby transformation of the cluster aligned the principle axis of the two $(SeO_3)$ moieties such that the lone pairs of electrons were locked along the principle axis. This structural re-arrangement led to significant $Se^{IV}$ . . . $Se^{IV}$ intramolecular interactions in 70 of 3.1 Å which was confirmed by X-ray structural analysis (see FIG. 19) while the DFT gave a HOMO-LUMO gap of 3.45 eV. Furthermore, the HOMO-LUMO gap for the two-electron oxidized molecule 72 was 2.01 eV and the LUMO was delocalized over the $SeO_3$-moiety (see FIG. 19). The oxidation triggered the formation of two $Se^V$ moieties and subsequent Se . . . Se bond formation, (DFT result: $d_{Se-Se}$=2.6 Å, in $[W_{18}O_{54}(SeO_3)_2]^{2-}$) 72 which forced the tungsten cage to expand slightly. The Se . . . Se bonding interaction in the a1' molecular orbital of 72 was around 6 eV larger than in the parent cluster 70. Given that the redox properties of a POM are closely related to the composition of its frontier orbitals, the reduction potentials measured for the cluster were fully consistent with those predicted by theory. The molecular functionalized tungstate oxide cluster $[W_{18}O_{54}(SeO_3)_2]^{4-}$ 70 was synthesised by a dehydration reaction of the two selenite type cluster $[W_{18}O_{56}(SeO_3)_2(H_2O)_2]^{8-}$ 62 (see below). Notably, this cluster not only demonstrated exceptionally rich redox behaviour associated with the reduction of the metal oxide cluster $\{W_{18}O_{54}\}$ cage, but also from the oxidation of selenite templates at the cluster core, see FIG. 32. The protonation and dehydration of $[W_{18}O_{56}(SeO_3)_2(H_2O)_2]^{8-}$ resulted in the loss of these extra terminal oxo and water ligand and the selenite template was "forced" to change the orientation to a "face to face" mode, therefore the two charge-bearing selenite anions were encapsulated in a closed $\{W_{18}O_{54}\}$ shell with only eighteen W=O terminal unit on the surface. The solubility of $[W_{18}O_{54}(SeO_3)_2]^{4-}$ could be controlled by selectively using quaternary ammonium cations during this process. Crystallography data showed the two selenite templates were quite close to each other with Se- - -Se distance of 0.308(1) nm, and the ESI-MS and $W^{183}$-NMR studies have clearly ruled out the possibility of the short Se- - -Se distance being caused by the crystallography-disorder of mono-heterotemplate such as the case of $[H_3W_{18}O_{57}(TeO_3)]^{5-}$ (J. Yan et al., 2009). The single peak of ESI-MS at m/z 2456.1 (see FIG. 16 (a)) fitted the molecular formula of $\{(TBA)_2[W_{18}O_{54}(SeO_3)_2]\}^{2-}$ (TBA=n-tetrabutylammonium), and no species related the cluster of $\{W_{18}O_{57}(SeO_3)\}$ was detected. The $W^{183}$-NMR of $[W_{18}O_{54}(SeO_3)_2]^{4-}$ showed two well distinguished sharp peaks at −92 ppm and −104 ppm with an integration ratio of 2:1, which could be assigned as the signal from the twelve "belt" and six "capping" positional tungsten respectively, see FIG. 16 (b). (The mono-selenite containing version cluster of $\{W_{18}O_{57}(SeO_3)\}$ has also been discovered in another procedure, see for example L. Wang et al., 2013.) One selenium position was occupied by two protons in the cluster and the polyanion was isolated as $[H_2W_{18}O_{57}(SeO_3)]^{6-}$, which showed significant difference in physical properties.

Figure 16:
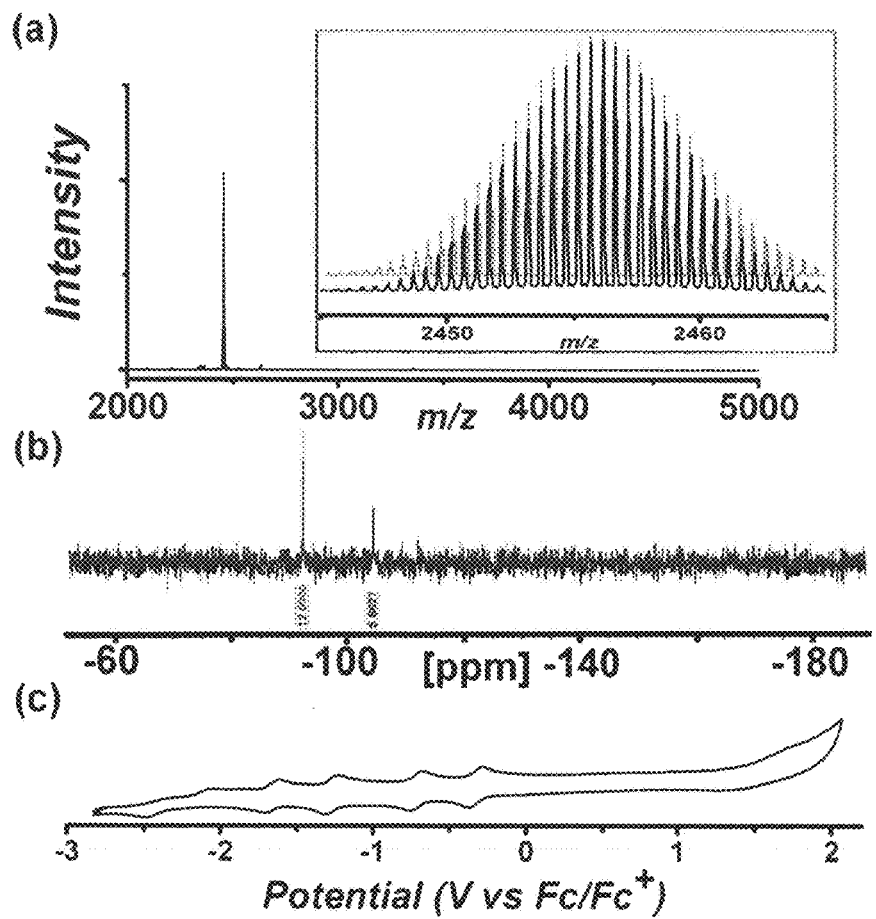
FIG. 16 shows spectrum characterization of the $[W_{18}O_{54}(SeO_3)_2]^{4-}$ cluster. (a) Negative ESI-MS of 0.1 μM $[W_{18}O_{54}(SeO_3)_2]^{4-}$ in $CH_3CN$ solution with the major peak at m/z 2456.1. The simulated spectrum with formula $\{(C_{16}H_{36}N)_2[W_{18}Se_2O_{60}]\}^{2-}$ is overlaid. (b) $W^{183}$-NMR spectrum of 0.1 mM $[W_{18}O_{54}(SeO_3)_2]^{4-}$ in $d_3$-dimethyl sulfoxide solution with two peaks. (c) Cyclic voltammogram obtained for 0.1 mM $[W_{18}O_{54}(SeO_3)_2]^{4-}$ in 0.05 M $THAPF_6$ acetonitrile solution at a glassy carbon electrode (diameter=3 mm) with 100 mV s⁻¹ scan rate.

The protonation and dehydration process significantly changed the electric properties of the cluster, and electrochemistry studies have shown that $[W_{18}O_{54}(SeO_3)_2]^{4-}$ has much richer redox behaviour than $[W_{18}O_{56}(SeO_3)_2(H_2O)_2]^{8-}$, see FIG. 16 (c). The $[W_{18}O_{54}(SeO_3)_2]^{4-}$ 70 cluster could go through a series of well-defined reversible electronic states in addition to the oxidation of the embedded templates ($Se^{IV \rightarrow V}$). It was determined that the oxidation was a 2e$^-$ Se-centred process leading to the formation of two $Se^V$ moieties within the cluster shell, $[W_{18}O_{54}(Se^VO_3)_2]^{2-}$ 72. DFT calculations demonstrated the feasibility for the formation of a Se . . . Se bond in an $O_3Se$—$SeO_3$ moiety containing two $Se^V$ and this was confirmed by an electron paramagnetic resonance (EPR) measurements which showed that there was a strong interaction as the sample was EPR silent. This the first example of selenium in the +5 oxidation state so far reported. The fast solution cyclic voltammetry (CV) measurements of $[W_{18}O_{54}(SeO_3)_2]^{4-}$ showed four reversible reduction processes following by two quasi-reversible waves, and oxidation peaks were also detectable when a highly positive potential was applied. These oxidation processes could be assigned to the oxidation of the Se templates. The initial coulometry and differential pulse voltammetry (DPV) measurements showed that $[W_{18}O_{54}(SeO_3)_2]^{4-}$ goes through multiple single electron redox process in the negative potential region. Electrochemical reduction of the cluster at the potential −0.430 V (vs Fc/Fc$^+$) or of −98 mV (vs Ag/AgCl led to a dark blue solution, a classical sign for reduced POMs, which indicated that the initial reduction occurred on the tungsten oxo cage. This reduction of an acetonitrile solution of 70 by one electron was assigned to the RS state of the cluster with formula $[W_{18}O_{54}(SeO_3)_2]^{5-}$. This reduced state is another stable state the cluster can exist in. The electron paramagnetic resonance (EPR) spectrum of a frozen $[W_{18}O_{54}(SeO_3)_2]^{5-}$ solution in acetonitrile showed a broad signal with an isometric g-value of 1.783, which could be assigned to the reduced tungsten on the shell (N. Fay et al., 2007). Further reduction at the potential −1.0 V (vs. Fc/Fc$^+$) or −320 mV (vs. Ag/AgCl) led to an extra electron injection at shell tungsten atoms, and the cluster transformed to $[W_{18}O_{54}(SeO_3)_2]^{6-}$ but remained in the RS state with two electron delocalized on the tungsten oxo shell. The EPR showed a fine coupling with g-values of 1.872, 1.828 and 1.752 respectively, see FIG. 17 (b). The crystallographic analysis of $[W_{18}O_{54}(SeO_3)_2]^{5-}$ and $[W_{18}O_{54}(SeO_3)_2]^{6-}$ showed that the reduction did not cause a structural variation, but slightly weakened the Se- - -Se interaction. The distance increased form 0.307(1) nm in $[W_{18}O_{54}(SeO_3)_2]^{4-}$ to 0.311(1) nm in $[W_{18}O_{54}(SeO_3)_2]^{6-}$, which was still much shorter than the sum of the selenium van der Waals radii (0.380(2) nm). Further solution reduction would involve the selenite template; therefore the cluster could be switched to the RT state with reduced templates and reduced shell. The broad oxidation peak of Se$^{IV}$ to Se$^V$ at 925 mV (vs Ag/AgCl) gradually increased during the reduction at a potential lower than −872 mV (vs Ag/AgCl). The cluster could therefore be switched to another state with a reduced template and a reduced shell. The four reversible characteristic peaks in solution CV indicated the retaining of the cluster framework. However, a broad oxidation peak of Se$^{III}$ to Se$^{IV}$ at about 0.370 V (vs Fc/Fc$^+$) gradually increased during the electroreduction at −1.65V (vs Fc/Fc$^+$). The EPR showed a new axial signal with the values $g_\parallel$=2.037 and $g_\perp$=2.008, which could be assigned to the reduced Se$^{III}$. The cluster $[W_{18}O_{54}(SeO_3)_2]^{7-}$ in RT state and the following further reduced species were highly sensitive to air and their tungsten oxo cages were quickly oxidized to the two electrons reduced cage in seconds or one electron reduced cage in minutes. To understand the intrinsic redox property of this cluster, solid CV and DPV measurements of microcrystals of $[W_{18}O_{54}(SeO_3)_2]^{4-}$ in different potential range was also performed, see FIG. 17 (d). The feature current intensity was significantly increased because of the improved density of active cluster on electrode surface. The current peaks indicated that the metal oxo cage could have six reversible redox processes at the fast scan rate and their locations were consistent with the solution study. Further reduction of the crystals clearly showed the electrons could be injected to the Se template at the potential −2.78 V (vs. Fc/Fc$^+$) and two related new oxidation peaks of Se$^{III}$ to Se$^{IV}$ appeared at the potential 0.40 and 0.54 V (vs. Fc/Fc$^+$), also the remaining of characteristic oxidation peaks indicated that no decomposition occurred during the initial template reduction. The DPV results on solid microcrystals also had a consistent conclusion. Seven reduction waves appeared in the negative potential region and only six oxidation peaks were detected the same area, between 0 and −3 V (vs. Fc/Fc$^+$), see FIG. 17 (d). As seen in this figure, the six oxidation peaks occurred at around −0.25, −0.65, −1.25, −1.7, −2.1, and −2.55 V; the seven oxidation peaks occurred at around −0.25, −0.65, −1.25, −1.65, −2.15, −2.4 and −2.65 V (vs. Fc/Fc$^+$). The oxidation of the template needed higher applied potential.

Additionally, an oxidation process of $[W_{18}O_{54}(SeO_3)_2]^{4-}$ solution was observed in the CV. The double oxidation peak appeared at 1.75 V (vs. Fc/Fc$^+$) accordance with the hypothesis of the selenite oxidation process. The coulometry data showed that two electrons could be removed per cluster, which indicated the oxidation of Se$^{IV}$ to Se$^V$, and therefore the switching the $[W_{18}O_{54}(SeO_3)_2]^{4-}$ to new OT states $[W_{18}Se_2O_{60}]^{2-}$ with oxidized template and oxidized shell. The CV of $[W_{18}Se_2O_{60}]^{2-}$ showed no oxidation peaks in the positive region and the reduction of the cluster was more intricate because of the extra reduction of template inside. The Se$^V$ was not readily observable and considered as the excited state for selenium compounds (U. K. Klaning and K. Sehested, 1986, J. R. Milligan et al., 2002). However, EPR measurements showed no signal, confirming the absence of Se$^V$ radical, which indicated that the Se$^V$ is stabilized by forming a Se$^V$—Se$^V$ bond. The OT state of the cluster was sensitive to atmosphere, and no evidence showed the decomposition of cluster during the redox process. The evaporation of the resulting solution led to the cluster $[W_{18}O_{54}(SeO_3)_2]^{4-}$ crashing out with electrolyte cations as single crystals in a yield of 92%. Also, the ESI-MS was utilized to study the redox process and its reversibility (I. Prat et al., 2011). By increasing the collision energy, the $[W_{18}Se_2O_{60}]^{2-}$ was detectable before crushing the cluster into fragments.

Figure 18:
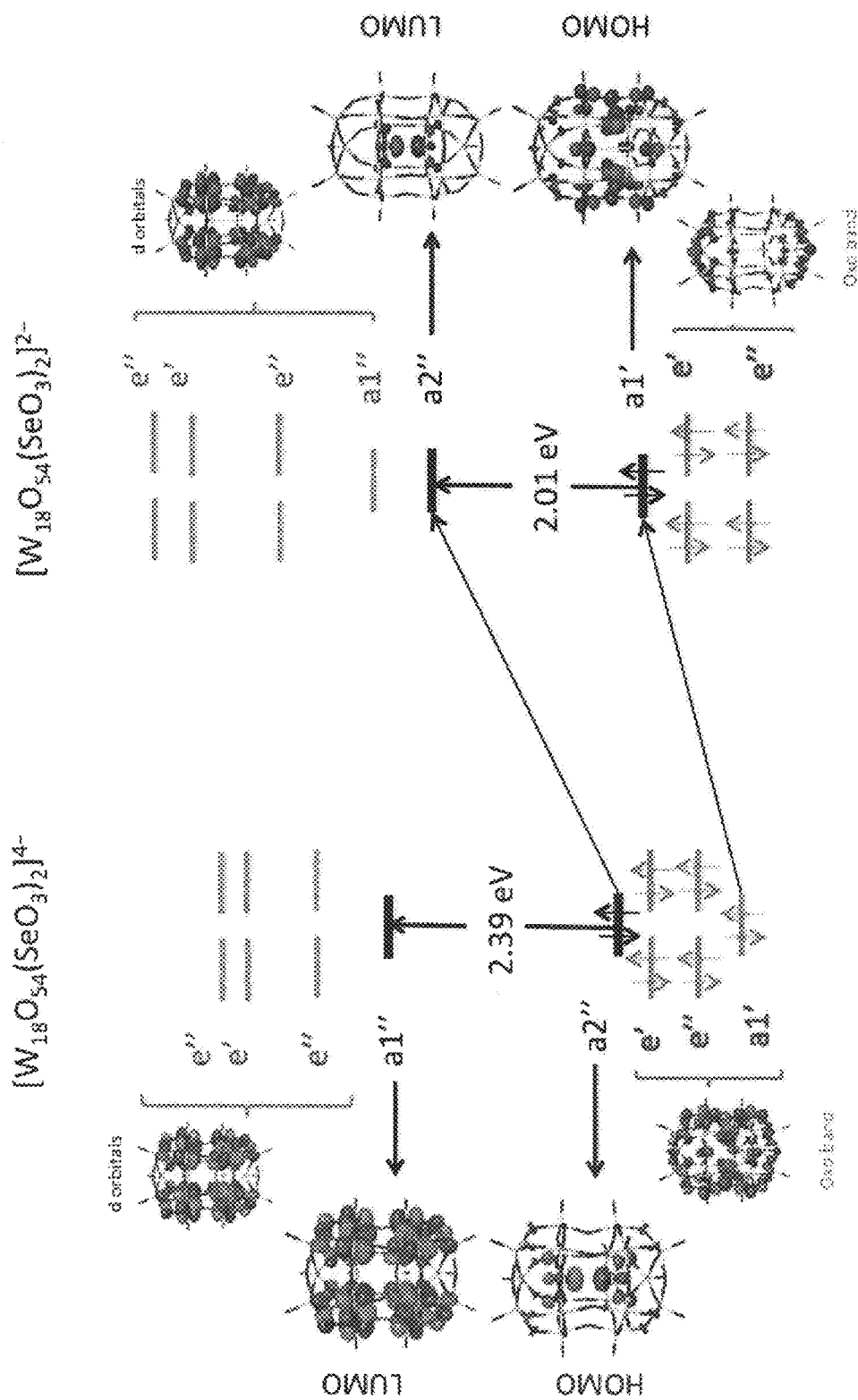
FIG. 18 shows schematically the electronic structure of $[W_{18}O_{54}(SeO_3)_2]^{4-}$ type cluster described by the highest occupied molecular orbitals being oxygen p-like (oxo band), and the set of lowest unoccupied orbitals are metal d-like (metal band).

To gain further insight into the electronic structure of OT state, the present inventors have also explored the Se$^V$—Se$^V$ bond formation using simulations based on density-functional theory (DFT). Quantum modelling of POMs has enabled approaching spectroscopic, reactivity, and chemical properties in a quantitative way (X. López et al., 2012). The ground state electronic structure of $[W_{18}O_{54}(SeO_3)_2]^{4-}$ resembled a classic POM orbital distribution (J. M. Poblet et al., 2003) being the highest occupied orbital (HOMO) mainly delocalized over the SeO$_3$ moiety, whereas the subsequent molecular orbitals (LUMO) belonged to the equatorial metals. A similar distribution of the frontier orbitals have been observed if two sulphite anions are introduced inside molybdate cages (R. Tsunashima et al., 2011). The two selenite anions had a much shorter Se- - -Se crystallographic distance of 0.307(1) nm than that of 0.322(1) nm, which was also in good agreement with the 0.311 nm in calculated one. The LUMO was delocalized over metal centres that were connected to each other by large M-O-M angle, with a value of ~145°. The two-electron oxidation of $[W_{18}O_{54}(SeO_3)_2]^{4-}$ led to a $[W_{18}Se_2O_{60}]^{2-}$ structure, where the {W$_{18}$O$_{54}$} cage had been geometrically reorganized due to the oxidation process. Remarkably, the two SeO$_3$ moieties had become closer and a bond was formed between them. Commonly, a contact bond distance implies certain bonding interaction and in this case a Se- - -Se distance of 2.595 Å was obtained for optimized geometry of the structure. The structure had undergone some other adjustments, for instance the M-O-M angle had increased to 163.1° and the electronic structure had also been reorganized, see FIG. 18.

The LUMO was now delocalized over the SeO$_3$ moiety; the HOMO was delocalized over the oxygen atoms of the POM cage. The electronic structure of the [W$_{18}$O$_{54}$(SeO$_3$)$_2$]$^{4-}$ type cluster is described by the highest occupied molecular orbitals being oxygen p-like (oxo band), and the set of lowest unoccupied orbitals are metal d-like (metal band), thus we frequently use the terms 'oxo band' and 'band of unoccupied orbitals', respectively (J. A. Fernandez et al., 2007). It is worth noting though that these sets of orbitals do not form a band in the strict sense, since the orbital energy is separated by discrete energies in these medium-sized clusters. Frontier orbitals implied in the [W$_{18}$O$_{54}$(SeO$_3$)$_2$]$^{4-}$ cluster, being the H-L$_{gap}$=2.39 eV, being the HOMO delocalized over the SeO$_3$ moiety. For the two electrons oxidized [W$_{18}$Se$_2$O$_{60}$]$^{2-}$ the H-L$_{gap}$=2.01 eV is slightly smaller and the unoccupied orbital delocalized over SeO$_3$ is the LUMO.

The key to the activation of the cluster arose from the precise positioning of the Se centres of the selenite anions within the cluster cage, which would result from the reaction of two selenite anions along with the loss of two electrons, and thus provided a barrier to spontaneous bond formation. Consequently, if the selenite groups could be pushed together through electro-activation, the possibility of reversible Se—Se bond formation arose, with a commensurate transfer of two electrons onto the cluster cage, and formed a dithionate-like anion (O$_3$Se—SeO$_3$) with new state of Se$^V$ not isolated before. Further study of the mono-selenite containing cluster [H$_2$W$_{18}$SeO$_{60}$]$^{6-}$ has shown different behaviours. The only structural difference between [W$_{18}$O$_{54}$(SeO$_3$)$_2$]$^{4-}$ and [H$_2$W$_{18}$SeO$_{60}$]$^{6-}$ is one Se$^{IV}$ template is replaced by two protons and therefore [H$_2$W$_{18}$SeO$_{60}$]$^{6-}$ is -6 charged. This difference varied the redox property of the cluster. Not only the CV of [H$_2$W$_{18}$SeO$_{60}$]$^{6-}$ showed only three single electron reversible couples and no Se template oxidation process was observed, but also the DFT result showed two inner protons that helped to stabilize the cluster [H$_2$W$_{18}$O$_{57}$(Se$^{IV}$O$_3$)]$^{6-}$ and the oxidation led to the less stable one electron unpaired species [H$_2$W$_{18}$O$_{54}$(Se$^V$O$_3$)]$^{5-}$, as long as further oxidation decomposed the molecule.

Figure 24:
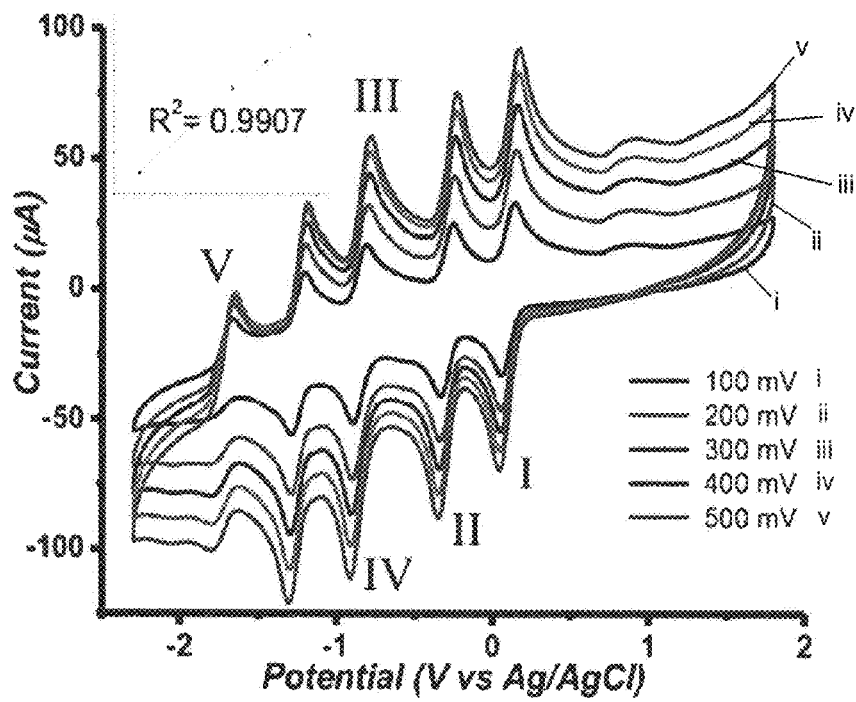
FIG. 24 shows cyclic voltammograms (second cycle of potential) obtained for 0.2 mM $[W_{18}O_{54}(SeO_3)_2]^{4-}$ in 0.1 M THA $BF_4CH_3CN$ solution at a GCE (diameter=1.5 mm) with different scan rates (from 100 to 500 mV $s^{-1}$).

Dawson POMs usually can reversibly accept at least six electrons in aprotic solvents, without any structural modification in the case of the α-isomers. In the present case, the sixth mono electronic process forming the [W$_{18}$O$_{54}$(SeO$_3$)$_2$]$^{10-}$ species lay beyond the electrochemical window of the CH$_3$CN (0.1 M Hex$_4$N BF$_4$) electrolyte system. Therefore the solid cyclic voltammetry (SCV) with a micro-crystal of (C$_{16}$H$_{36}$N)$_4$[W$_{18}$O$_{54}$(SeO$_3$)$_2$].2CH$_3$CN adhered on the glassy carbon electrode was also performed. As shown in FIG. 24, a high concentration of cluster (C$_{16}$H$_{36}$N)$_4$[W$_{18}$O$_{54}$(SeO$_3$)$_2$].2CH$_3$CN on the electrode surface significantly increased the currents. The solid had a higher resistance and the redox peaks were separated with a ΔE$_p$ of 185 mV at scan rate 200 mV s$^{-1}$. Further, the predicted sixth redox process was also observed with a E°$_f$ of -2.056V. The reduction increased the solubility of the cluster, which resulted in dissolution of the solid sample and a resulting decrease in current density. Interestingly, a further reduction study showed the seventh reduction was a template involved process. Two new peaks appeared at the potentials of 0.75 and 0.9 in the following oxidation process, which indicated the re-oxidation of selenium template. Given the well-separated nature of processes I and II (shown in FIG. 25), bulk reductive electrolysis at a fixed potential was undertaken. Coulometric analysis confirmed the 1.0 (±0.1) electron reduction, as the [W$_{18}$O$_{54}$(SeO$_3$)$_2$]$^{4-}$ species was reduced to the blue [W$_{18}$O$_{54}$(SeO$_3$)$_2$]$^{5-}$ form. In the case of [W$_{18}$O$_{54}$(SeO$_3$)$_2$]$^{5-}$ there were also five reversible redox processes present. Again, the two initial diffusion-controlled processes, I and II, were present, but now process I was oxidative rather than reductive with an E°$_f$ of 0.163 V (vs Ag/AgCl), while process II, with an E°$_f$ value of -0.234 V (vs Ag/AgCl) remained a reductive process. Processes III-V at more negative potentials also remained reductive. Data is summarised in Table 8.

TABLE 8

Reversible potentials (E$_f^0$) derived from voltammetry of (C$_{16}$H$_{36}$N)$_4$[W$_{18}$O$_{54}$(SeO$_3$)$_2$] · 2CH$_3$CN adhered to the surface of a GCE (diameter = 1.5 mm) in contact with TBA PF6 at a scan rate of 200 mVs$^{-1}$. For a reversible process ΔE$_p$ is given.

| States | Redox process | E$_f^0$ (V vs Ag/AgCl) | ΔE$_p$ mV |
|---|---|---|---|
| Crystal solid | [W$_{18}$O$_{54}$(SeO$_3$)$_2$]$^{2-/4-}$ | 1.273 | — |
| | [W$_{18}$O$_{54}$(SeO$_3$)$_2$]$^{5-/4-}$ | 0.163 | 195 |
| | [W$_{18}$O$_{54}$(SeO$_3$)$_2$]$^{6-/5-}$ | -0.234 | 194 |
| | [W$_{18}$O$_{54}$(SeO$_3$)$_2$]$^{7-/6-}$ | -0.799 | 194 |
| | [W$_{18}$O$_{54}$(SeO$_3$)$_2$]$^{8-/7-}$ | -1.198 | 189 |
| | [W$_{18}$O$_{54}$(SeO$_3$)$_2$]$^{9-/8-}$ | -1.676 | 172 |
| | [W$_{18}$O$_{54}$(SeO$_3$)$_2$]$^{10-/9-}$ | -2.042 | 145 |

No resonance could be observed for the oxidised compound [W$_{18}$O$_{54}$(SeO$_3$)$_2$]$^{2-}$. The one electron reduced species gave an isometric signal with g=1.79, A=62.8 MHz, and σ=16.21 mT. No hyperfine structure attributable to $_{183}$W (I=1/2, 14.8% abundant) could be observed.

To confirm the X-ray structure and obtain further insight DFT calculations were performed including solvation field on [W$_{18}$O$_{54}$(SeO$_3$)$_2$]$^{4-}$ and its oxidized, [W$_{18}$O$_{54}$(SeO$_3$)$_2$]$^{2-}$ and reduced derivatives: [W$_{18}$O$_{54}$(SeO$_3$)$_2$]$^{5-}$, [W$_{18}$O$_{54}$(SeO$_3$)$_2$]$^{6-}$, [W$_{18}$O$_{54}$(SeO$_3$)$_2$]$^{7-}$, [W$_{18}$O$_{54}$(SeO$_3$)$_2$]$^{8-}$ were carried out. See Table 9 for a comparison between relevant distances and angles from X-ray and DFT-optimised geometry for [W$_{18}$O$_{54}$(SeO$_3$)$_2$]$^{4-}$ and [W$_{18}$O$_{54}$(Se$_V$O$_3$)$_2$]$^{2-}$. There was a great agreement between the X-ray data and the optimised geometry for [W$_{18}$O$_{54}$(SeO$_3$)$_2$]$^{4-}$. Although no crystal for [W$_{18}$O$_{54}$(SevO$_3$)$_2$]$^{2-}$ has yet been obtained, the DFT-optimised geometry is quite reasonable; the two main differences between the DFT-geometries of (C$_{16}$H$_{36}$N)$_4$[W$_{18}$O$_{54}$(SeO$_3$)$_2$].2CH$_3$CN and [W$_{18}$O$_{54}$(SevO$_3$)$_2$]$^{2-}$ are Se . . . Se distance of 3.109 Å, 2.595 Å and W$_B$—O$_B$—W$_B$ angle 149.11°, 163.10° respectively. These differences were explained by the formation of the Se$^V$—Se$^V$ bond and the subsequent increase of electron density in the centre of the cage, evidencing the flexibility of the tungsten cage in the W$_{18}$ Wells-Dawson molecules.

TABLE 9

Theoretical values of the total energy in Hartree (E$_h$), orbital Energies (in eV), HOMO-LUMO gap (eV). RE stands for Reduction Energy.

| Specie | E$_h$ | E$_{HOMO}$ | E$_{LUMO}$ | ΔE$_{H-L}$ | RE (eV) | | Equation |
|---|---|---|---|---|---|---|---|
| [W$_{18}$O$_{54}$(SeO$_3$)$_2$]$^{2-}$ | -10526.98 | -8.30 | -6.28 | 2.01 | -7.33 | 2 e- ox. (Se$^{IV}$ → Se$^V$) | 3 |
| [W$_{18}$O$_{54}$(SeO$_3$)$_2$]$^{4-}$ | -10527.52 | -8.02 | -4.57 | 3.45 | | Parent Molecule | |

TABLE 9-continued

Theoretical values of the total energy in Hartree ($E_h$), orbital Energies (in eV), HOMO-LUMO gap (eV). RE stands for Reduction Energy.

| Specie | $E_h$ | $E_{HOMO}$ | $E_{LUMO}$ | $\Delta E_{H-L}$ | RE (eV) | | Equation |
|---|---|---|---|---|---|---|---|
| $[W_{18}O_{54}(SeO_3)_2]^{5-}$ | −10527.71 | −6.96 | −4.74 | 2.22 | −5.01 | 1 e− reduced | 4 |
| $[W_{18}O_{54}(SeO_3)_2]^{6-}$ | −10527.88 | −4.59 | −4.47 | 0.13 | −4.55 | 2 e− reduced | 5 |
| $[W_{18}O_{54}(SeO_3)_2]^{7-}$ | −10528.03 | −4.22 | −3.75 | 0.47 | −4.11 | 3 e− reduced | 6 |
| $[W_{18}O_{54}(SeO_3)_2]^{8-}$ | −10528.16 | −4.01 | −2.96 | 1.05 | −2.95 | 4 e− reduced | 7 |

The inventors have also theoretically estimated its reduction potentials by calculating the fully oxidized molecule and its one-electron reduced partner. The theoretical estimation of a redox potential is well established and in the case of a given POM is done by determining the free energy associated with the process:

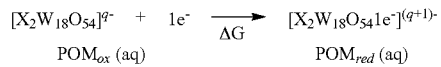

$$[X_2W_{18}O_{54}]^{q-} + 1e^- \xrightarrow{\Delta G} [X_2W_{18}O_{54}1e^-]^{(q+1)-}$$
$$\text{POM}_{ox} \text{ (aq)} \qquad\qquad \text{POM}_{red} \text{ (aq)}$$

The oxidation process $[W_{18}O_{54}(Se^{IV}O_3)_2]^{4-} \rightarrow [W_{18}O_{54}(Se^VO_3)_2]^{2-} + 2e^-$. This case is a two-electron redox process. In order to compare the theoretically obtained reduction energy (RE) with the experimental redox potential it was necessary to take into account that:

$$\Delta G° = -nFE° = -nF(E_{red} - E_{ox}) \qquad \text{(eq. 1)}$$

Where $\Delta G° = \Delta G°_{red} - \Delta G°_{ox}$ $$\Delta G° = -nF(E_{exp} - E°_{ENH}) = \Delta G°_{POM} - \Delta G°_{ENH} \qquad \text{(eq. 2)}$$

The reduction process of a POM involves the addition of one electron to an almost nonbonding orbital, thus the entropic and vibrational contributions to $\Delta G$ in the above equation could be replaced by its electronic contribution in solution, the reduction energy (RE) (I.-M. Mbomekallé et al., 2010). In the case of a reduction process, RE is defined as the energy difference between the one-electron reduced and oxidized forms of the WD anion computed in the presence of a solvent model (COSMO), (D. A. W. A. Mariotti et al., 2007) otherwise, energies would not be reliable for comparison with experimental values (A. Lewis et al., 2004). As in electrochemical data in which the normal hydrogen electrode (NHE) is taken as the zero on the relative scale, the theoretical values need to be referred to an absolute theoretical zero. Cramer et al. recalculated this absolute zero to be 4.28 eV for the free energy change in the NHE reaction: ½$H_2 \rightarrow H^+ + e^-$ (L. Vilà-Nadal et al., Chem. Eur. J., 2013, D. McGregor et al., 2012).

TABLE 10

Comparison between relevant distances and angles from X-Ray and DFT-optimised geometry. Values in parentheses show the difference between experimental and theoretical values.

| | | | $[W_{18}O_{54}(Se^VO_3)_2]^{4-}$ (2a) | | $[W_{18}O_{54}(Se^VO_3)_4]^{2-}$ (2b) |
|---|---|---|---|---|---|
| | | XR | $C_1$ (Cosmo) | $D_{3h}$ (Cosmo) | $D_{3h}$ (Cosmo) |
| Angles (°) | $W_C$-$O_C$-$W_C$ | 150.6 | 152.70 (2.12) | 152.80 (2.21) | 153.21 |
| | $W_C$-$O_{b1}$-$W_B$ | 128.6 | 130.93 (2.30) | 131.11 (2.49) | 144.31 |
| | $W_B$-$O_{b2}$-$W_B$ | 141.9 | 145.10 (3.17) | 144.72 (2.79) | 150.36 |
| | $W_B$-$O_{Se}$-$W_B$ | 89.3 | 90.34 (1.02) | 90.18 (0.86) | 56.91 |
| | $W_B$-$O_B$-$W_B$ | 144.9 | 150.35 (5.45) | 149.11 (4.22) | 163.10 |
| | $O_{Se}$-Se-$O_{Se}$ | 101.1 | 101.44 (0.35) | 101.37 (0.28) | 110.06 |
| Distances (Å) | dSe . . . Se | 3.053 | 3.123 (0.07) | 3.109 (0.06) | 2.595 |
| | $dO_B$ . . . $O_B$ | 3.019 | 3.184 (0.17) | 3.177 (0.16) | 3.472 |
| | $dO_{Se}$ . . . Se | 1.688 | 1.705 (0.02) | 1.703 (0.01) | 1.629 |
| | $dO_{Se}$ . . . $W_B$ | 2.413 | 2.489 (0.08) | 2.490 (0.08) | 2.504 |
| | $dO_{Se}$ . . . $W_C$ | 2.436 | 2.500 (0.06) | 2.526 (0.09) | 3.159 |

The inventors used the Cramer value to transfer the experimental value obtained versus Ag/AgCl to be referred versus NHE. Table 11 summarizes the theoretical values for the species studied here.

(Ec) for Dawson clusters using the equation $E°=-\Delta G°/nF$ and the Cramer value 4.28 eV. Small discrepancies were found between the theoretical and the experimental slopes. This approach has proven to be a powerful tool to theoreti-

TABLE 11

Experimental ($E_{1/2}$) from the CV, see Table 7, and Theoretical ($E_c$) Absolute Values for the First Cathodic Peacks (in V). COSMO-Optimized non-classical Wells-Dawson anion $[W_{18}O_{54}(SeO_3)_2]^{q-}$, RE stands for Reduction Energy, Orbital Energies (in eV). Structures optimized with $D_{3h}$ symmetry.

| | $E_f^0$ (V vs Ag/AgCl) | $E_c$ (V vs NHE)[a] | $E_{HOMO}$ | $E_{LUMO}$ | $\Delta E_{H-L}$[b] | RE (eV) | $\Delta (E_{1/2} - E_c)$[c] |
|---|---|---|---|---|---|---|---|
| $[W_{18}O_{54}(SeO_3)_2]^{4-}$ | | | -8.02 | -4.57 | 3.45 | | |
| $[W_{18}O_{54}(SeO_3)_2]^{2-/4-}$ | 0.922 | -5.40 | -8.30 | -6.28 | 2.01 | -7.33 | 1.93 |
| $[W_{18}O_{54}(SeO_3)_2]^{5-/4-}$ | 0.098 | -5.01 | -6.96 | -4.74 | 2.22 | -5.01 | 0.01 |
| $[W_{18}O_{54}(SeO_3)_2]^{6-/5-}$ | -0.297 | -4.61 | -4.59 | -4.47 | 0.13 | -4.55 | 0.06 |
| $[W_{18}O_{54}(SeO_3)_2]^{7-/6-}$ | -0.852 | -4.06 | -4.22 | -3.75 | 0.47 | -4.11 | -0.06 |
| $[W_{18}O_{54}(SeO_3)_2]^{8-/7-}$ | -1.224 | -3.69 | -4.01 | -2.96 | 1.05 | -2.95 | 0.19 |

[a]Predicted absolute potential vs NHE using Cramer corrected absolute zero potential (4.28 eV).
[b]$\Delta E_{H-L} = E_{LUMO} - E_{HOMO}$ (eV).
[c]Difference between computed and experimental potentials.

The two-electron oxidation and one, two-electron and further reduction reactions were summarized in the following reactions:

  (eq. 3)

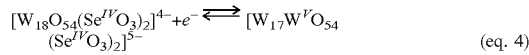  (eq. 4)

cally determine the redox behaviour of POMs (L. Vilà-Nadal et al., Chem. Eur., J., 2013, D. McGregor et al., 2012). In general, there was a good agreement between the experimental and the theoretical values, the larger discrepancy was found with the formation of $[Se_{V2}W_{18}O_{60}]^{2-}$. But despite not having found further evidence, the absence of an EPR signal and the DFT calculations confirmed the stability of the two-electron oxidized cluster.

TABLE 12

Experimental ($E_{1/2}$) from the solid CV experiment, see Table 8, and Theoretical ($E_c$) Absolute Values for the First Cathodic Peacks (in V). COSMO-Optimized non-classical Wells-Dawson anion $[W_{18}O_{54}(SeO_3)_2]^{q-}$, RE stands for Reduction Energy, Orbital Energies (in eV). Structures optimized with $D_{3h}$ symmetry.

| | Experimental | | Calculated | | | | Difference |
|---|---|---|---|---|---|---|---|
| | $E_f^0$ (V vs Ag/AgCl) | $E_c$ (V vs NHE)[a] | $E_{HOMO}$ | $E_{LUMO}$ | $\Delta E_{H-L}$[b] | RE (eV) | $\Delta (E_{1/2} - E_c)$[c] |
| $[W_{18}O_{54}(SeO_3)_2]^{4-}$ | | | -8.02 | -4.57 | 3.45 | | |
| $[W_{18}O_{54}(SeO_3)_2]^{2-/4-}$ | 1.273 | -5.75 | -8.30 | -6.28 | 2.01 | -7.33 | 1.58 |
| $[W_{18}O_{54}(SeO_3)_2]^{5-/4-}$ | 0.163 | -5.07 | -6.96 | -4.74 | 2.22 | -5.01 | -0.06 |
| $[W_{18}O_{54}(SeO_3)_2]^{6-/5-}$ | -0.234 | -4.68 | -4.59 | -4.47 | 0.13 | -4.55 | 0.13 |
| $[W_{18}O_{54}(SeO_3)_2]^{7-/6-}$ | -0.799 | -4.11 | -4.22 | -3.75 | 0.47 | -4.11 | 0.00 |
| $[W_{18}O_{54}(SeO_3)_2]^{8-/7-}$ | -1.198 | -3.71 | -4.01 | -2.96 | 1.05 | -2.95 | 0.22 |

[a]Predicted absolute potential vs NHE using Cramer corrected absolute zero potential (4.28 eV).
[b]$\Delta E_{H-L} = E_{LUMO} - E_{HOMO}$ (eV).
[c]Difference between computed and experimental potentials.

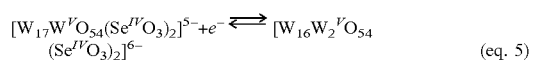  (eq. 5)

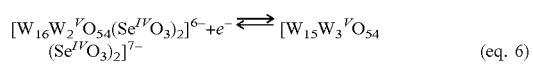  (eq. 6)

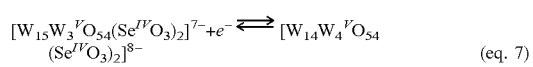  (eq. 7)

Table 12 summarises the first one-electron reduction energies and their relationship with the experimental first reduction peaks. Half-wave potentials vs. NHE and theoretical estimates of the reduction energy are shown in the last columns. The inventors have determined the cathodic peaks Experimental The time dependent bulk electrolysis with cyclic voltammetry was performed in 0.1 mM $[W_{18}O_{54}(SeO_3)_2]^{4-}$ acetonitrile solution with 0.1 M THAPF$_6$ electrode using the bespoke made four ports electrochemical cell with glass frit (reference electrode: Ag/AgCl; working electrode: 3 mm glassy carbon for CV and a carbon mesh for bulk electrolysis; scanning rate: 100 mV s$^{-1}$). The applied potential for bulk electrolysis is -1.65 V (vs Fc/Fc+). The CV was recorded at time intervals from 0 hr to 2.5 hrs (from bottom line to top line in FIG. 17 (a)).

Figure 17:
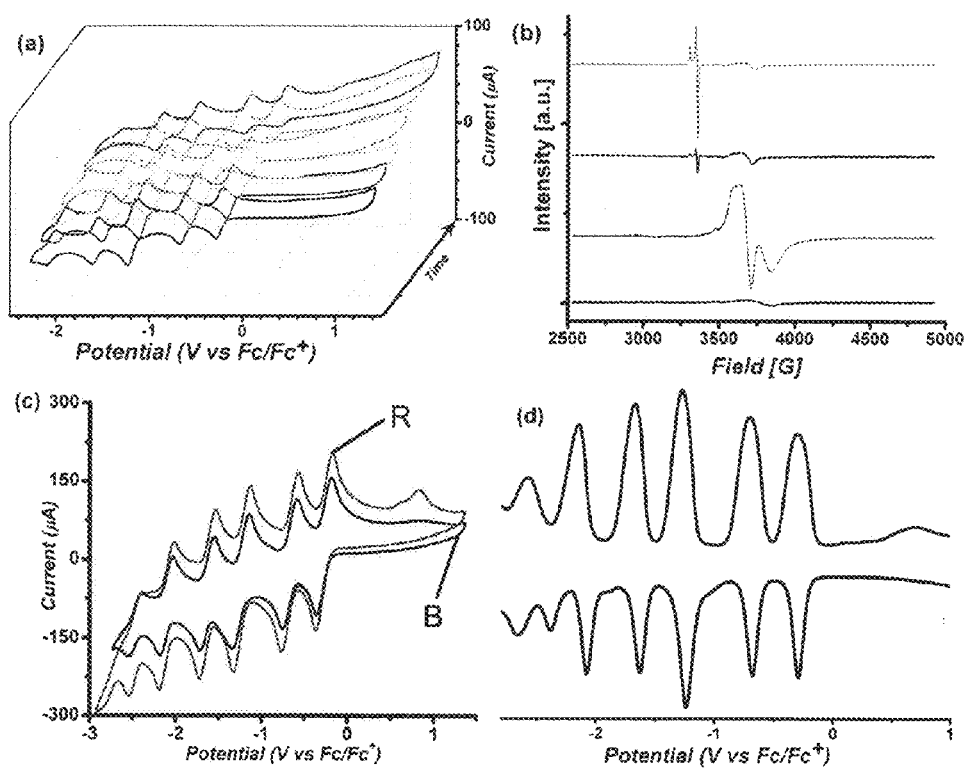
FIG. 17 shows time dependent bulk electrolysis (a), cyclic voltammetry (CV) (c) and EPR (b) spectra, and differential pulse voltammetry (DPV) (d) of the reduced clusters shown in FIG. 16.

The EPR spectra were measured at 100 K in frozen acetonitrile solution containing the clusters with different degree of reduction: one to four electron reductions separately (from bottom to top in FIG. 17 (b)).

CV (second cycle of potential) obtained for $[W_{18}O_{54}(SeO_3)_2]^{4-}$ adhered microcrystals in contact with 0.1 M TBAPF$_6$ solution at a GCE (diameter=3 mm) with scan rate=200 mV s$^{-1}$ on scanning range of −2.9 V to 1.5 V (line R) or −2.7 V to 1.5 V (line B) as shown in FIG. 17 (*c*).

DPV was obtained for [W$_{18}$O$_{54}$(SeO$_3$)$_2$]$^{4-}$ adhered microcrystals in contact with 0.1 M TBAPF$_6$ solution at a GCE. Amplitude: 0.05 V, Pulse Width: 0.1 s, Sample Width: 0.0167 s, Pulse Period: 0.5 s.

Electronic Devices
CMOS-Based Devices Using POM

The present inventors have designed and built functional circuits using molecular metal-oxides (MMOs), by connecting self-assembled MMOs into top-down, lithographically defined CMOS architectures. Fabrication of two distinct novel device architectures incorporating the p-n POM showed interesting electronic properties at the device level. Construction of two distinct CMOS-based devices demonstrated that 'n-type' cluster-embedded devices act as flash memory with a programming window of >1.2 V. The work described herein also provides a two electrode device with the 'p-type' cluster has an unprecedented write-once-read-once memory behaviour associated with the oxidation of embedded Se$^{IV \rightarrow V}$ atoms. These molecular-based devices have reproducible characteristics and can be easily fabricated by dip coating of the electrode arrays in organic solvents containing the molecular metal oxide cluster. Both exploit the unique properties of the p-n POM clusters, such as those embedded in the lithographically fabricated electrode arrays. The supramolecular inclusion of different redox active templates within the metal-oxide host targeted the design, synthesis and characterization of a {M$_{18}$} POM cluster shell with two electronically active templates. The vast majority of POM clusters can be described by the HOMO and LUMO orbitals, and the inventors have modulated the electronic behaviour by introducing redox-active heteroatoms as templates (L. Fleming et al., 2008). The ability to dope the cluster at the molecular level which can be seen at the device level is considered novel in itself, and herein is provided an industry-validated device model showing the practical feasibility of foundry scale POM molecules integrated into MOS technology. Potential new modes of switching originating from the incorporation of redox-active internal core dopants within the POM cluster shell may arise.

The ability to fabricate large CMOS-based device arrays incorporating electronically active and chemically compatible molecules is currently lacking. The inventors consider that success here could not only lead to commercial CMOS devices with molecular technology, but define a miniaturisation roadmap to the single molecule limit (i.e. from many to single molecules per device) as lithography and molecular deposition routes are improved. In this respect, the design of new semiconductor devices requires highly sophisticated modelling approaches to move beyond the integrative cycle of prototype, test, and re-design. This is due to the extremely high cost of experimentally exploring the endless choices of materials, devices and system architectures. One solution is accurate, fast and reliable simulation tools based on detailed physical models spanning from quantum mechanics all the way up to 'classical' physics and various devices architectures. The inventors have realised that one approach to achieve this is to merge atomistic and continuum approaches into a multi-scale 3D simulation framework, allowing for the incorporation of molecular units, that can facilitate predictable models for a realistic prototype of post-CMOS devices such molecular based floating gate flash memory cells.

POM clusters are proposed herein as molecular units for incorporation into novel electronic nano-devices. POMs are nanosized anionic electronically active metal-oxygen clusters with n-type semiconducting properties, where the electronic properties can be configured as a function of the embedded templates inside the molecular cage (J. Lehmann et al. 2007, A. B. Bourlinos et al. 2004, H. Li, et al., 2011). Thus the doping of the metallic cage by various guests is of great interest, since they offer the opportunity to modulate the electronic properties of the molecular capsule, especially if electronically active templates are embedded (L. Fleming et al., 2008). Realistic, industry standard device-level simulations, discussed below, validated the approach at the nanometer scale, where the device performance was mainly determined by the number of the molecules in the storage media and not by the position of the electron traps. The results showed that POMs can be used as a realistic nanoscale flash memory, and the configuration of the POM core with dopants can lead to new electrical behaviours (J. Lehmann et al., 2007, H. Li, et al., 2011, L. Fleming et al., 2008). This work, therefore, provided a practical roadmap for the integration of configurable molecules in MOS technologies as the lithographic scales approached the molecular limit (V. Bonfiglio and G. Iannaccone, 2013). It is believed that POMs are intrinsically more compatible with Si and SiO$_2$ than other flash memory candidates presented thus far, because they are (i) oxygen rich; (ii) redox active without decomposition (iii) thermally more stable than carbon-containing molecules and (iv) are more amenable to preparation of high yields of flash devices—synthetically, POMs are also simpler to make compared with complex organic systems.

In order to evaluate the possibility of [W$_{18}$O$_{54}$(SeO$_3$)$_2$]$^{4-}$ and [W$_{18}$O$_{56}$(WO$_6$)]$^{6-}$ molecules for realization of a floating gate (FG) in a non-volatile molecular memory (NVMM), the inventors have developed the first multi-scaled, multi-level computational framework designed to perform realistic and elaborate flash memory cell modelling. A flash-cell design was simulated, where the cell had shallow trench insulation (STI) (C. Gallon et al., 2004) which was based on a 18 nm gate length transistor. This design gave accurate results, allowing the evaluation of the devices for practical implementation. The simulation flow links the first principle molecular simulations, such as DFT results, which are presented above, to mesoscopic (continuous) transistor simulations with the commercial three-dimensional (3D) numerical device simulator GARAND (Gold Standard Simulations Limited (GSS Ltd.), The University of Glasgow, Glasgow, UK (www.GoldStandardSimulations.com).

The first step of the computational algorithm is to obtain atomic charges for POM molecules. The spatial charge distributions of a POM molecule for different redox states obtained from the DFT calculations were transferred to a flash cell simulation domain. A simplified simulation flow diagram is presented in FIG. 13. Central to this flow is the custom-built Simulation Domain Bridge, connecting the two distinct simulation domains. The motivation for using this hierarchy of modelling approaches was the complexity of the problem. Accurate description of the POM clusters required the first principles calculations on an atomic level, involving around 100 atoms, while the descriptions of the current flow through the flash cell demanded mesoscopic modelling. This is applied to a system of millions of atoms, which are however subject to important quantum mechanical effects in the conducting channel of the device and to complex electrostatic effects arising from device non-uniformities and physical boundaries.

Figure 30:
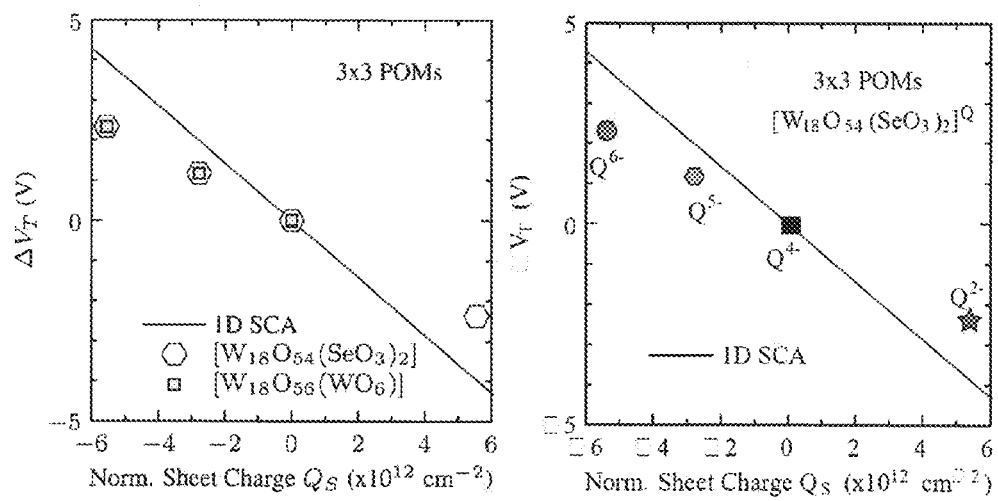
FIG. 30 shows a comparison between the sheet charge approximation (SCA) and the numerical result of the simulated flash cell for a 3×3 arrangement of a POM cluster, showing substantial reduction of the programming window owing to the finite MOS-capacitor area. The change in $\Delta V_T$ (V) is shown with change in normalised sheet charge Qs (×$10^{12}$ $cm^{-2}$).
Figure 31:
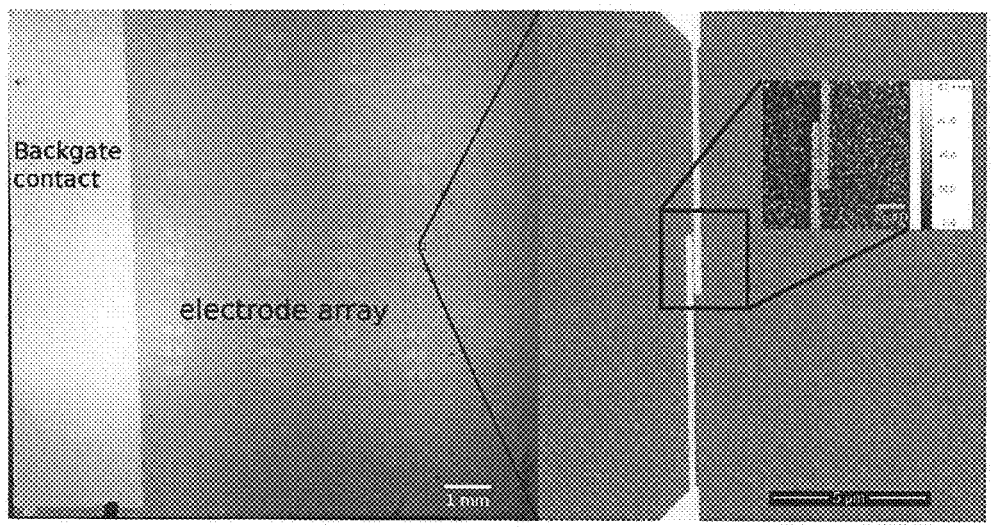
FIG. 31 shows SEM and AFM (inset) images of fabricated nanogap electrodes coated with $[W_{18}O_{54}(SeO_3)_2]^{4-}$. Scale bars: left, 1 mm; Right, 5 μm; Inset 1 μm.

DFT is the most comprehensive theoretical approach for understanding the structural, electronic and magnetic properties of POMs. In this study, the DFT calculations provided the atomic and electronic structure of the POM in a given redox state. That is, the equilibrium atomic coordinates, validated by spectroscopic measurements, and the partial charges on each atom of the molecule for a given redox state. Such calculations are feasible for an individual POM only, while a flash cell of contemporary dimensions needed around ten POMs to realize efficient storage. The role of the Simulation Domain Bridge was to compose the spatial charge distribution corresponding to a given spatial and redox configuration of a set of POMs and their balancing cations that together formed the storage layer of the flash cell. This charge distribution was imported by GARAND as a set of fixed fractional charges in the gate-oxide of the flash cell transistor. In this way it was possible to calculate current-voltage characteristics of the flash memory cells for different spatial and redox configurations of POMs in the oxide, i.e., for a different amount of stored charge representing different logical states of the cell. The 3D numerical simulations of the flash cell, performed with GARAND, deployed the drift-diffusion transport formalism and include density-gradient quantum-corrections, essential for the accurate modelling of decananometer devices. A BULK flash cell was created for this study with an 18 nm gate length. Given the fact that the gate area of the template flash cell was 18×18 nm$^2$, sheet densities Ns of POM clusters were considered approximately 3×10$^{12}$, corresponding to 3×3 rectangular planar arrangements of the POMs. It also led to an inter-molecular distance of about 3 nm, which is in agreement with the experiments. The study mainly focussed on the programming window $\Delta V_T$ (FIG. 30) and current-voltage ($I_D$-$V_G$) characteristics of the molecular based flash cell. The programming window $\Delta V_T$ was defined as the difference between the $V_T$ of the programmed cell, where all POMs in the storage layer were once– reduced, storing −1 net charge each, and the $V_T$ of the erased cell in this case no net charge being stored in the POM layer. FIG. 30 $a$ compares the analytical result based on the sheet charge approximation (SCA) to multi-level 3D simulations of $\Delta VT$ for all bits where each bit corresponds to an oxidation or reduction state of the selenium POM—[W$_{18}$O$_{54}$(SeO$_3$)$_2$]$^Q$=Q$^{2-}$, Q$^{4-}$, Q$^{5-}$ and Q$^{6-}$. The charge distribution of the [W$_{18}$O$_{54}$(SeO$_3$)$_2$]$^{4-}$ POM was used as a reference point to establish the programming window between the different bits based on oxidation and reduction of POM molecules. The figure clarifies that the sheet-charge approximation was not acceptable in the case of molecular-based flash cells. Moreover, the threshold voltage shift was around 2.5V for each step of oxidation of [W$_{18}$O$_{54}$(SeO$_3$)$_2$]$^{4-}$. Consistent with oxidation from [W$_{18}$O$_{54}$(SeO$_3$)$_2$]$^{4-}$ to [W$_{18}$O$_{54}$(SeO$_3$)$_2$]$^{2-}$ a $\Delta V_T$ of more than 5 V resulted.

FIG. 30 $b$) shows a comparison of the programming window between the two types of POMs—[W$_{18}$O$_{54}$(SeO$_3$)$_2$]$^{4-}$ and [W$_{18}$O$_{56}$(WO$_6$)]$^{6-}$. It was clear from these results that both molecules had an identical programming window −$\Delta V_T$. The reason for this identical behaviour was the fact that oxidation of each molecule was based on adding one electron per step. In both cases the parent structure had an overall charge that equalled zero, for the 1× reduced=1e$^-$ and for 2× reduced molecules=2e$^-$. The main and important difference was that the [W$_{18}$O$_{54}$(SeO$_3$)$_2$]$^{4-}$ POM demonstrated not only possible oxidation but reduction while the latest process was not observed in [W$_{18}$O$_{56}$(WO$_6$)]$^{6-}$.

Figure 21:
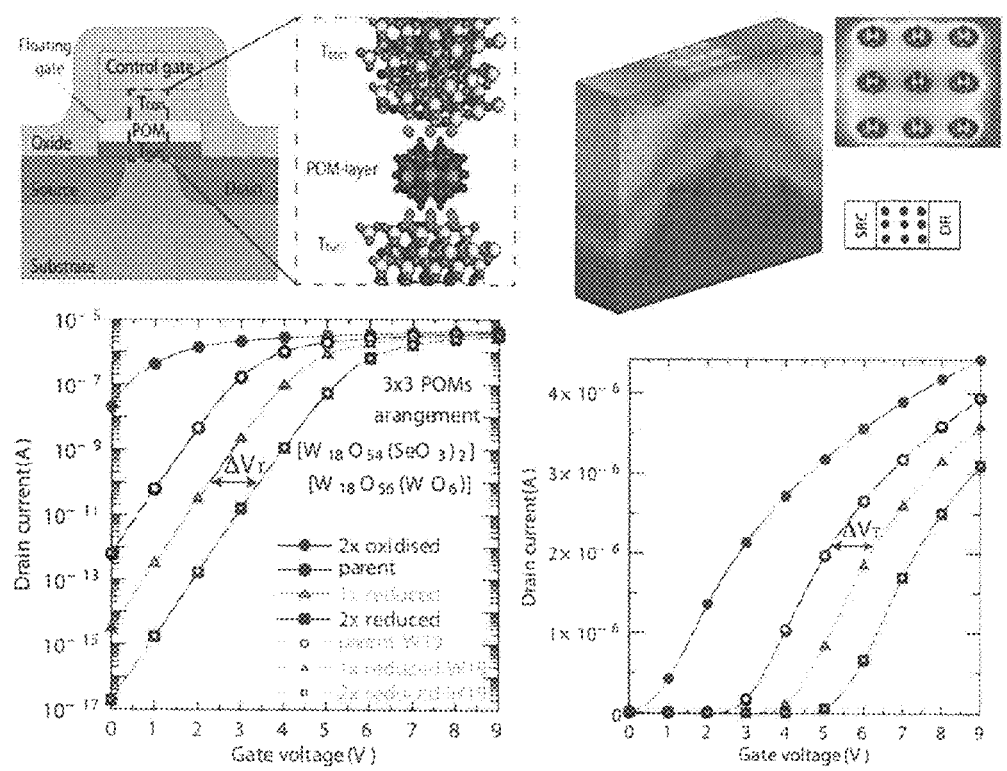
FIG. 21 shows a) a schematic diagram representation of a single-transistor non-volatile memory cell, indicating the aimed substitution of the poly-Si floating gate (FG) with an array of clusters (POM layer); b) The 3D electrostatic potential in the lower part of the oxide and the substrate, and 2D map of the potential across of the plane through the centre of the POMs, arranged in a 3×3 regular grid 4.5 nm from the Si—$SiO_2$ interface, as schematically illustrated. The change in drain current (A) with change in gate voltage (V) ($I_D$-$V_G$) with a drain bias of 50 mV is shown in c) logarithmic scale and d) linear scale for BULK molecular flash cell for 2×oxidised $[W_{18}O_{54}(SeO_3)_2]^{2-}$, parent $[W_{18}O_{54}(SeO_3)_2]^{4-}$, 1× reduced $[W_{18}O_{54}(SeO_3)_2]^{5-}$ and 2× reduced $[W_{18}O_{54}(SeO_3)_2]^{6-}$, also for parent $[W_{18}O_{56}(WO_6)]^{10-}$, 1× reduced $[W_{18}O_{56}(WO_6)]^{11-}$ and 2× reduced $[W_{18}O_{56}(WO_6)]^{12-}$.

The first step in the computational flow was to replace the poly-Si FG with a layer of POM molecules which is schematically presented in FIG. 21. More specifically, spatial charge distributions of a [W$_{18}$O$_{54}$(SeO$_3$)$_2$]$^{4-}$/[W$_{18}$O$_{56}$(WO$_6$)]$^{6-}$ molecule for different redox/oxidation states obtained from DFT calculations were incorporated into the flash cell device structure. The POMs were negatively charged in the parent state and in the native state those charges were counter balanced by positively charged cations—the green structure in FIG. 21 $a$). Similar to the atomic charges, the presence of the cations in the POM layer was modelled as a set of fractional point charges distributed around each POM. The total positive charge balanced out the negative charge of the parent POMs, so that any reduction/oxidation of the POM would lead to the presence of extra electron charges in the gate stack. This provided localized balancing of each POM, essential for modelling a flash cell with broad dispersion of the position and number of POMs in the gate dielectric.

Figure 34:
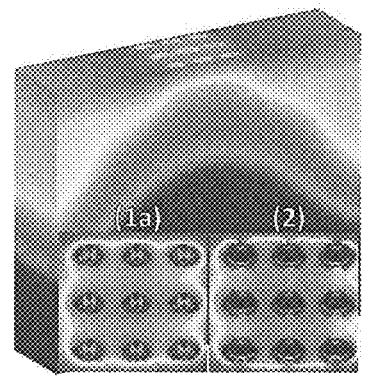
FIG. 34 is a schematic illustration of the 3D electrostatic potential in the lower part of the oxide and the substrate of a device, and 2D map of the potential across of the plane through the centre of the POMs, arranged in a 3×3 regular grid 4.5 nm from the Si—$SiO_2$ interface for the compounds $[W_{18}O_{54}(SeO_3)_2]^{5-}$ and $[W_{18}O_{56}(WO_6)]^{10-}$.

Assuming that the POM layer consisted of nine [W$_{18}$O$_{54}$(SeO$_3$)$_2$]$^{4-}$ molecules arranged in a three-by-three array the inventors were able to evaluate the NVMM performance with the help of the GARAND simulator. FIG. 21 $b$ revealed the 3D electrostatic potential in the lower part of the oxide and the substrate. Also the 2D map of the potential across the plane through the centre of the POMs layer arranged in a 3×3 regular grid is presented in this figure. Based on calculations, not only qualitative but also quantitative information could be obtained of the impact on the oxidation/reduction of the [W$_{18}$O$_{54}$(SeO$_3$)$_2$]$^{4-}$/[W$_{18}$O$_{56}$(WO$_6$)]$^{6-}$ molecular layer on the flash-cell characteristics. In the process of evaluating the performance of each flash cell, the current—voltage characteristic ($I_D$-$V_G$) presented in FIG. 21 $c$ played an important role. The same figure reveals the impact of the oxidation/reduction of the [W$_{18}$O$_{54}$(SeO$_3$)$_2$]$^{4-}$/[W$_{18}$O$_{56}$(WO$_6$)]$^{6-}$-FG layer on the drain current and voltage threshold of the flash memory cell. Clearly, adding electrons to the POMs leads to reducing of the drain current (the OFF-current) i.e. the value of the drain current at gate voltage=0.0V. This was based on the fact that introducing more negative charge in the FG repelled the electrons from the channel of the transistor. As result the drain current was reduced because it was directly influenced by the electron density distribution in the channel of the transistor:—less electrons in the channel—less drain current. More importantly the two types of POMs gave exactly identical $I_D$-$V_G$ characteristics. It is believed that the reason for this was that even though [W$_{18}$O$_{54}$(SeO$_3$)$_2$]$^{4-}$ /[W$_{18}$O$_{56}$(WO$_6$)]$^{6-}$ had different anionic charge distributions (visible in the 2D electrostatic plot in FIG. 34), the size of each POM was very small in comparison to the channel area. Therefore, the source-to-drain current was barely affected by variation of different local charge distribution in the molecules. This effect is expected to increase with scaling down the channel area. In addition, the reduction step in both molecules was based on one electron transfer per step. The parent structure in both case always had 0 overall charge, 1× reduction had one extra electron and 2× reduction had 2 extra electrons compared to the parent molecule. Hence, it was concluded from the results based on the multi-level computational framework that it was clear that POM molecules could serve as a floating gate with the potential for significant applications in molecular-based flash memory cells. The results demonstrated a significant programming window between each bit with a high signal to noise ratio. Another important characteristic for each device was the OFF- (the current at $V_G$=0.0 V)/ON- (the current at $V_G$=0.7 V) current ratio. From the data shown in FIG. 21 $c$ it was clear that the ON-/OFF-current ratio increased with increasing the oxidation of the POM molecule. For example, for the $[W_{18}O_{54}(SeO_3)_2]^{2-}/[W_{18}O_{56}(WO_6)]^{10-}$ molecule, around two orders of magnitude of the ON-/OFF-current ratio was demonstrated while in the $[W_{18}O_{54}(SeO_3)_2]^{6-}/[W_{18}O_{56}(WO_6)]^{12-}$ POM eleven orders of magnitude difference was observed. A similar trend was observed in the experimental data presented below.

Figure 22:
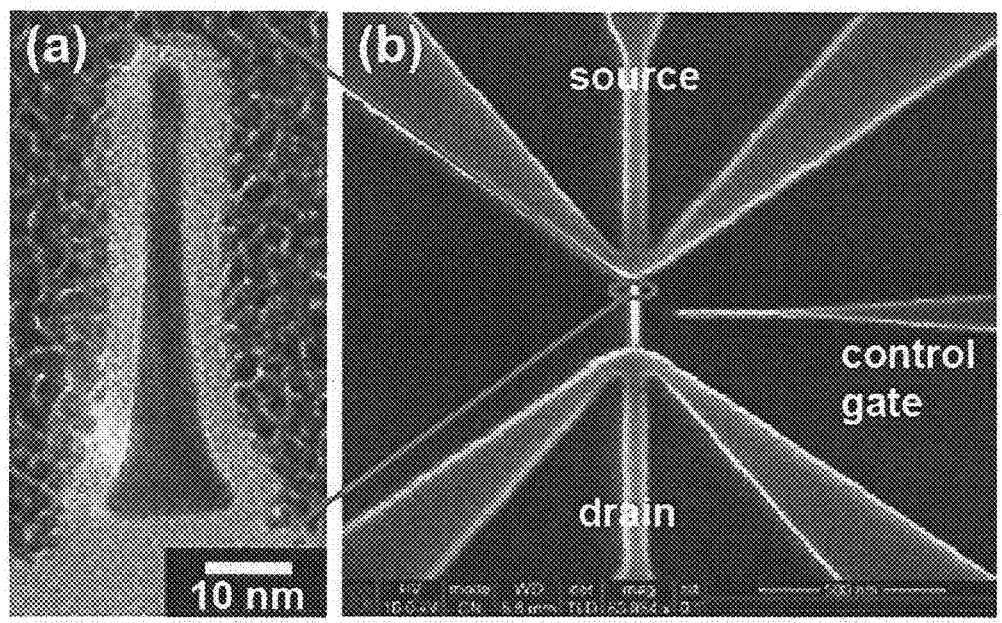
FIG. 22 shows a) an SEM image of a memory device according to an embodiment of the invention, shown together with a cross sectional TEM image of a ~5 nm Si nanowire channel with a side control gate. $[W_{18}O_{54}(SeO_3)_2]^{4-}$ was deposited around the nanowire and the side gate was used to charge and discharge the deposited molecules; and b) and c) show the change in drain current (A) with change in gate voltage (V) at 0.5 V source-drain bias before deposition of the POMs (green dashes, top, labelled i), after the deposition of the POMs (orange dashes, second top, labelled ii), after a −20 V pulse applied to charge the POMs (blue line, bottom, labelled iv) and a +20 V pulse applied to discharge the POMs (red line, third from top, labelled iii). The effect was repeatable demonstrating a clear shift in the threshold of the device when charged. The programming window was >1.2 V at low gate voltages.
Figure 22:
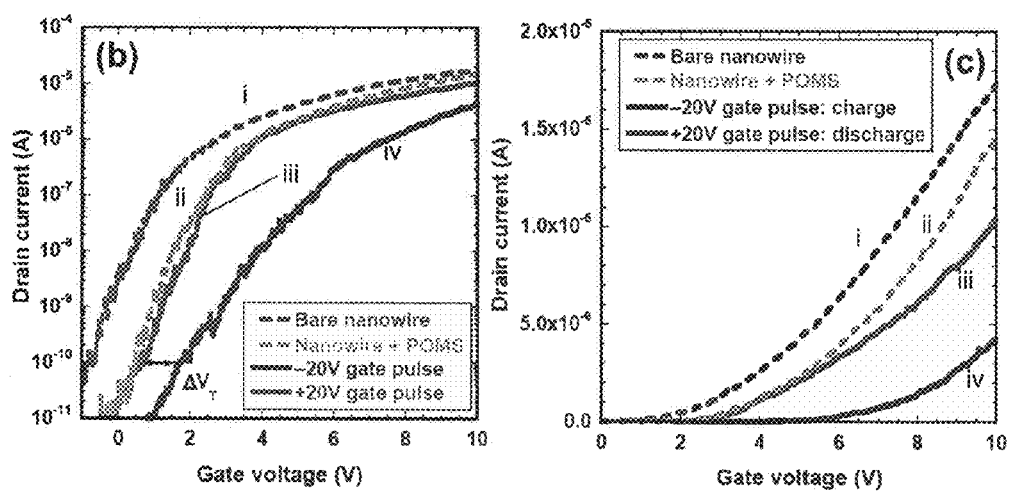

The present vertical flash memory cell used by industry and in the modelling of FIG. 21 requires high temperature processing which may damage the POMs and also requires significant process complexity to achieve a flash memory. Therefore to provide a first demonstration of a flash memory cell using the POMs, a lateral geometry has been used with a ~4 nm Si nanowire channel covered with a 4 nm $SiO_2$ insulator, nominally identical to the modelled structure beneath the POMs floating gate in FIG. 21 a. Such a geometry provided an easier exploration of the intrinsic ability of the POM to form the switching component of a flash-memory device compared with a vertical flash memory cell. Nominally identical flash-memory characteristics have been demonstrated in an array of nine independent devices. Devices with different geometries were tested and only those with the distance between the control gate and the nanowire channel below 60 nm demonstrated reproducible flash memory behaviour. FIG. 22a provides a scanning electron microscope (SEM) image and a cross-sectional transmission electron microscope (TEM) image of the device with a side control gate realised 50 nm from the nanowire allowing POMs to be deposited from the solvent into the gap (and all around the active part of the device as well). The fabrication process is described in full below. FIG. 22 b demonstrates a shift in the threshold voltage ($\Delta V_T$) of 1.1±0.1 V from the bare nanowire to the same nanowire coated in POMs. A large negative voltage of −20 V was then used to inject charge into the POMs before the control gate was again swept to demonstrate drain current characteristics with a $\Delta V_T$ shift of 1.2±0.1 V at low voltages. After a further pulse of +20 V, the drain current characteristics returned to the characteristics close to the original uncharged state. A plot of $\Delta V_T$ vs. log time demonstrated the present limit of the programme/erase times were 0.1 s and read times were 100 μs. The charge/discharge could be repeated many times and the retention time of the flash memory was at least 336 hours with further measurements required to determine the ultimate retention time (expected to be significantly longer, as no decay in the stored charge has yet been measured over the 336 hour period). The read time is presently limited only by the RC time constant (22.3 pF×250 kΩ=56 μs) of the nanowire devices and especially the large pad capacitance. It is thought that an rf design of the device and optimisation of the capacitance and resistance could reduce this to sub-ns read times. The extracted shift in the threshold voltages suggested a sheet charge density of the POMs of ~2×10$^{15}$ cm$^{-2}$. The results do not yet allow an accurate determination of the charged state of the POM clusters and further work is required to determine this charge state. The write/erase time was limited by the large density of POM molecules and the current compliance of the characterisation setup. A device with a shorter control gate to nanowire channel dimension and significantly fewer POMs is expected to both reduce the write/erase voltage and the time. Preliminary calculations suggested 100 POMs would have a sub-picosecond write time if limited by the device and characterisation limits but it is expected that the fundamental charging mechanisms of the POM would dominate at such device dimensions. This analysis clearly demonstrates that the ultimate performance of the POM based flash memory has not been reached and further work is required to determine the fundamental limits of the proposed technology. The sub threshold slope for the −20 V pulsed measurements in FIG. 22 b indicated additional charging mechanisms in the device in addition to the POM flash floating gate mechanism. As the POMs had been distributed over the entire device with a high density, there were many potential charging mechanisms that could have provided this type of non-optimal behaviour. The drain current characteristics after the +20 V pulse also indicated that the return to the original state of the POMs was not complete (FIG. 22 b and c) suggesting optimisation of the device geometry and POM positioning is required to improve the performance. Nevertheless, these measurements show that it is possible to produce functional flash devices utilising POMs due to their intrinsic n-type properties, and in particular by drop casting a solution of the POM directly onto the gate architecture in a one-step process.

Figure 33:
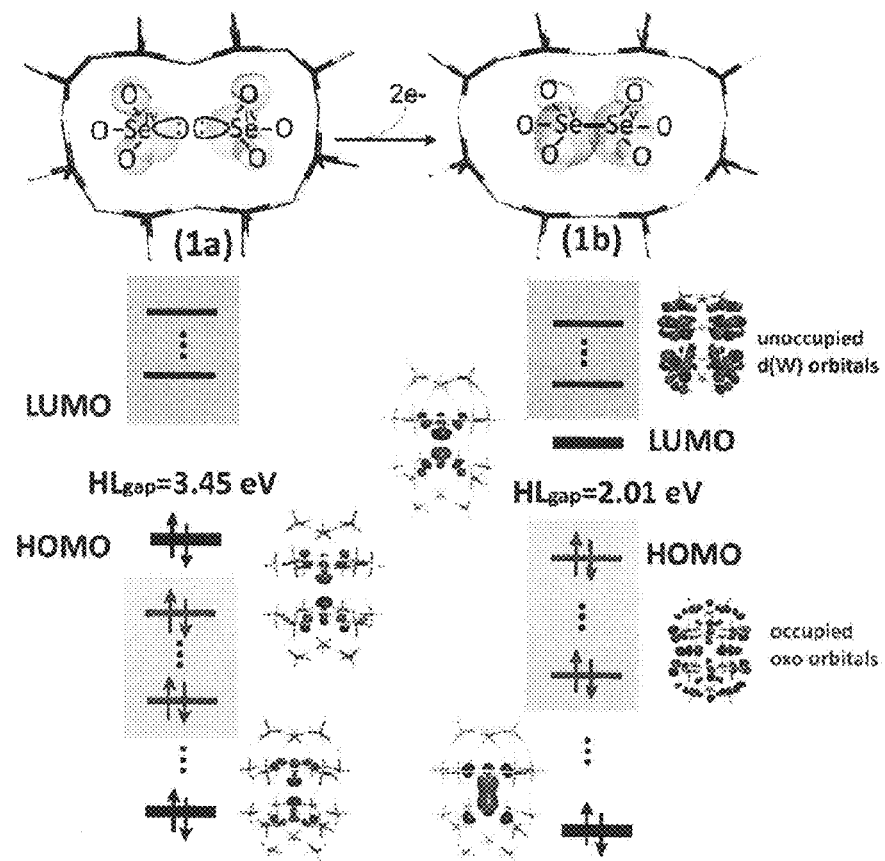
FIG. 33 top: A schematic diagram showing the formation of the $Se^V$—$Se^V$ bond in the transformation of $[W_{18}O_{54}(SeO_3)_2]^{4-}$ to $[W_{18}O_{54}(SeO_3)_2]^{2-}$. Bottom: Results from DFT analysis, demonstrating the frontier orbitals and the formation of an $Se^V$-$Se^V$ bond. Relevant orbitals delocalised over the Se moieties are highlighted in bold. The HOMO-LUMO gap (HLgap) is the energy gap between the highest occupied molecular orbital (HOMO) and the lowest unoccupied molecular orbital (LUMO). Although the orbital energies of POM clusters are separated by discrete energies, they can also be viewed as a having a band-like orbital structure and in this sense, the blue box depicts a set of unoccupied tungsten d-like orbitals and the red box a set of occupied oxygen p-like orbitals.

In addition to the exploitation of the shell of the POM clusters to trap charges for functional flash-memory, the role of the two inner 'core' moieties in the POM cluster archetype $\{W_{18}O_{54}(XO_n)_2\}^{m-}$ were investigated using DFT theory (where X is P, S, and Se) to see if it was possible to use these heteroatom dopants to change the electronic structure of the cluster by a redox process. In this cluster-type, the heteroatoms are positioned next to each other and could in principle interact via their lone pairs of electrons. This was particularly true for $[W_{18}O_{54}(SeO_3)_2]^{4-}$ since the two inner $\{Se^{IV}O_3\}$ moieties within the outer cluster shell had significant intramolecular non-bonding interactions with a $Se^{IV} \ldots Se^{IV}$ distance of 3.1 Å, see FIG. 33. This was confirmed by a DFT study, which showed that the ejection of two electrons from the cluster core should lead to an oxidation state change ($Se^{IV \rightarrow V}$) in $[W_{18}O_{54}(SeO_3)_2]^{4-}$ commensurate with the formation of a Se—Se bond within the cluster. Not only was this redox process shown by the electrochemical data (see FIG. 32), the two electron oxidation of $[W_{18}O_{54}(SeO_3)_2]^{4-}$ to $[W_{18}O_{54}(SeO_3)_2]^{2-}$ was confirmed directly by coulometry, and the formation of a Se—Se bond was consistent with studies showing the 2 electron oxidised species is diamagnetic, as confirmed by EPR spectroscopy. In addition, the theoretical estimation of the reduction potentials were in good agreement with the experimental values, as were the theoretical values for the two electron oxidation process leading to the formation of $[W_{18}O_{54}(SeO_3)_2]^{2-}$.

Figure 23:
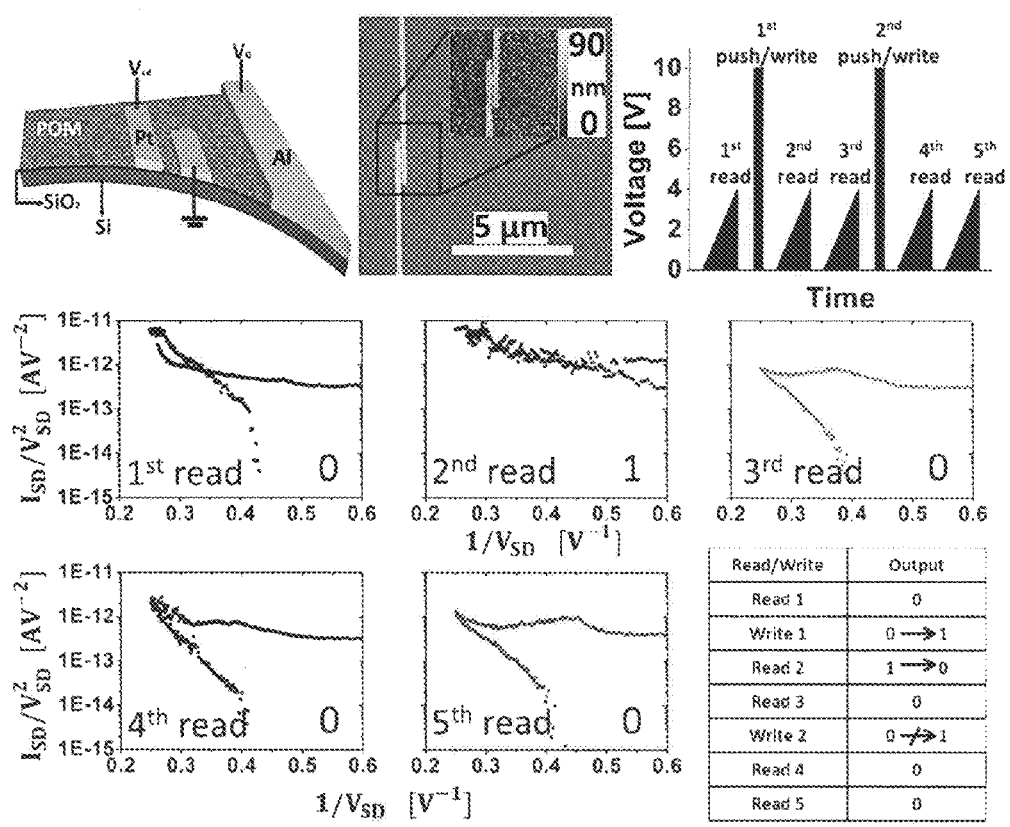
FIG. 23 shows: top row: Top left/middle: Conceptual sketch and SEM/AFM images of fabricated nanogap electrodes coated with $[W_{18}O_{54}(SeO_3)_2]^{4-}$, according to an embodiment of the invention. Top right: the measurement procedure shown in terms of applied voltage over time for a sequence of read and push/write events. The sample was subjected to excitation at high voltage, and then measured at a lower bias level. The data was obtained by sweeping the source-drain voltage from 0 V to 4 V and back to 0 V with the gate bias maintained constant at 3 V. Centre and bottom rows: Fowler-Nordheim plots of the IV data of the POM molecules between the nanogap electrodes for the read cycles, showing change in $AV^{-2}$ with change in $V^{-1}$. It was observed that subjecting the system to excitation with source-drain voltage at 9-10 V changed the nature of the transport upon subsequent inspection, removing the hysteresis. In this measurement, the effect was transient, disappearing after the first post-excitation probe (J. G. Simmons, 1963, R. H. Fowler and L. Nordheim, 1928) and this is shown conceptually on the bottom right of the figure.

To explore the possibility of exploiting the (oxidative) p-behaviour expected for the Se-embedded cluster $(C_{16}H_{36}N)_4[W_{18}O_{54}(SeO_3)_2]\cdot 2CH_3CN$, a nano-electronic device incorporating $(C_{16}H_{36}N)_4[W_{18}O_{54}(SeO_3)_2]\cdot 2CH_3CN$ was fabricated to test the predictions made by the theoretical analysis. The following device structure was used for investigations of the response of the POM molecules to electric stimuli. An array of parallel Pt electrodes with a gap of approximately 50 nm was produced on a highly doped silicon substrate with a thermally grown 30 nm thick barrier oxide. Sixty-four individual electrode pairs were fabricated on each sample. A contact was opened to the silicon substrate allowing it to function as a gate electrode. FIG. 23 shows SEM and atomic force microscopy (AFM) images of a fabricated electrode pair, after deposition of the POM material.

Through high volume control measurements (a total of more than 250 measurements have been performed on electrode pairs with and without POMs) it was established that this system is capable of probing the electrical characteristics of the p-type $[W_{18}O_{54}(Se_2O_3)_2]^{2-}$, although a high degree of variability was observed mainly due to the uncontrolled deposition method. Specifically, control experiments were undertaken with no POM material present and samples using the n-type $[W_{18}O_{56}(WO_6)]^{6-}$ (which has an identical $\{W_{18}O_{54}\}$ shell, but this time contains an oxidatively inactive $\{WO_6\}$ 'core'). Representative I-V curves in FIG. 23 confirmed that the effects observed were genuine for $[W_{18}O_{54}(SeO_3)_2]^{4-}$. These studies demonstrated that subjecting $[W_{18}O_{54}(SeO_3)_2]^{4-}$ to an excitation at high source-drain bias enabled the influence of the transport characteristics upon subsequent inspection at lower voltages. FIG. 23 shows measurements performed with a source-drain bias up to 4 V, before and after subjecting the system to a source-drain bias of 9-10 V. Two measurements were performed after excitation, and the procedure was repeated twice. FIG. 23 shows schematically the source-drain voltage variation and the gate bias was kept at +3 V throughout the measurements. The measurements were deliberately carried as a slow process ensuring maximum resolution of the analyser equipment, with a full probe measurement taking approximately 20 minutes. Retention and dissipation of the "write" procedure were also on this timescale and the intrinsic rate limits are expected to be similar to the flash memory.

Figure 36:
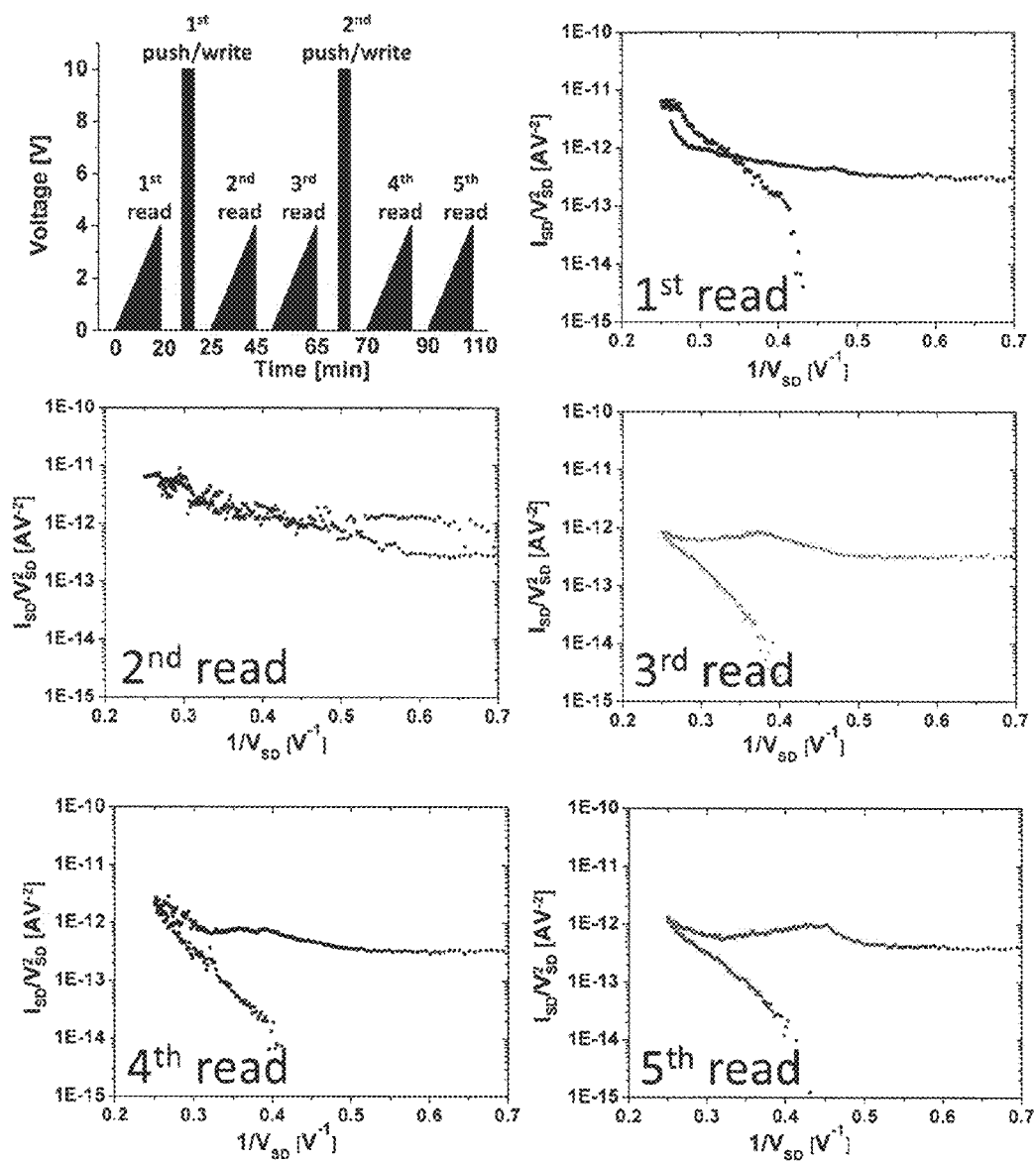
FIG. 36 top left: measurement procedure in terms of applied voltage. The sample $(C_{16}H_{36}N)_4[W_{18}O_{54}(SeO_3)_2]\cdot 2CH_3CN$ was subjected to excitation at high voltage, and then measured at a lower bias level. The data was obtained by sweeping the source-drain voltage from 0 V to 4 V and back to 0 V with the gate bias maintained constant at 3 V. Top left, centre and bottom rows: Fowler-Nordheim plots of the IV data of $(C_{16}H_{36}N)_4[W_{18}O_{54}(SeO_3)_2]\cdot 2CH_3CN$ between the nanogap electrodes for the read cycles.
Figure 37:
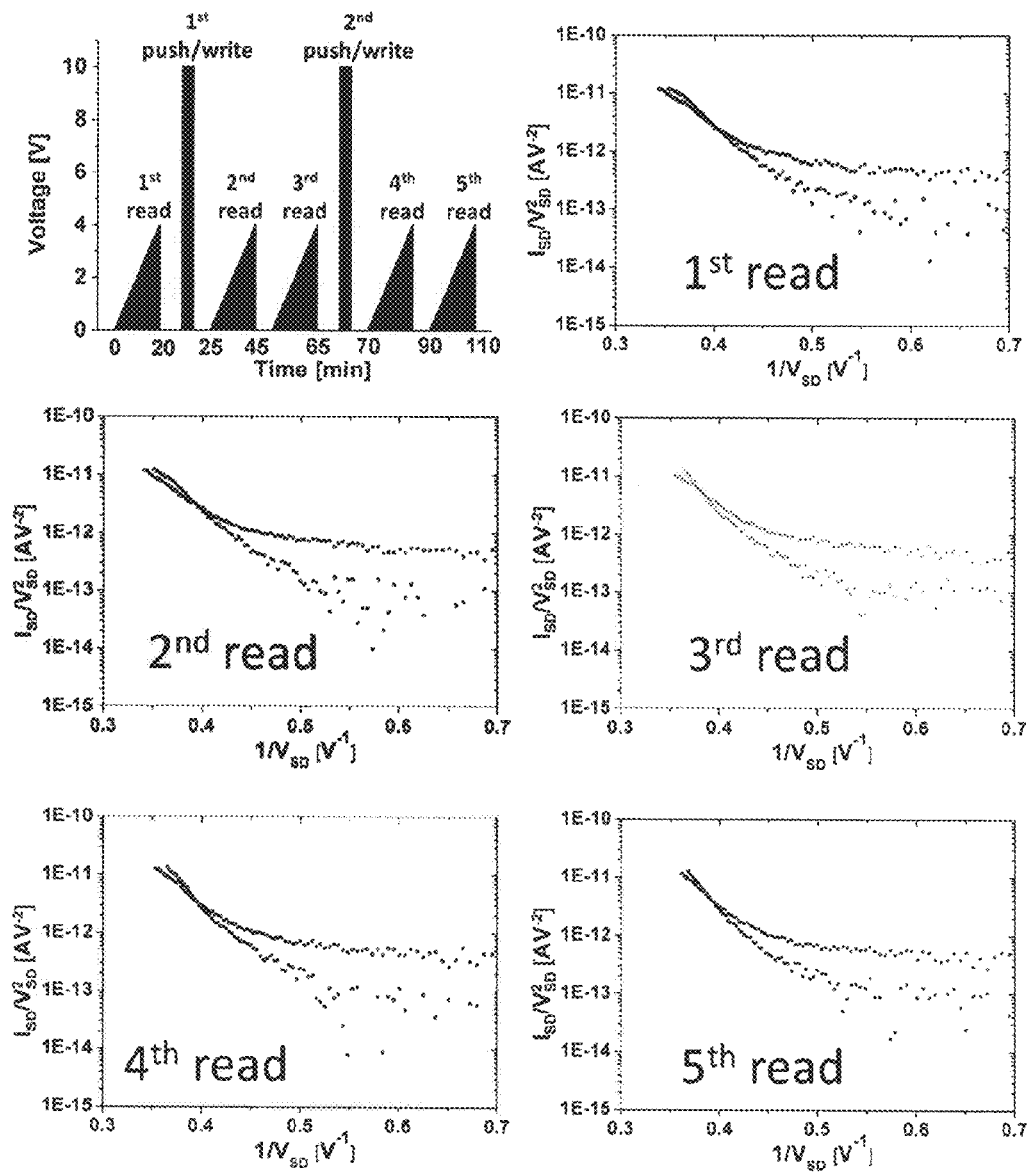
FIG. 37 top left: measurement procedure in terms of applied voltage. The sample $(C_{16}H_{36}N)_6[H_4W_{19}O_{62}]$ was subjected to excitation at high voltage, and then measured at a lower bias level. The data was obtained by sweeping the source-drain voltage from 0 V to 4 V and back to 0 V with the gate bias maintained constant at 3 V. Top left, centre and bottom rows: Fowler-Nordheim plots of the IV data of compound $(C_{16}H_{36}N)_6[H_4W_{19}O_{62}]$ between the nanogap electrodes for the read cycles.

Two devices were made, the first device was based upon compound $(C_{16}H_{36}N)_4[W_{18}O_{54}(SeO_3)_2] \cdot 2CH_3CN$ and the data is presented in FIG. 36 and the data for compound $(C_{16}H_{36}N)_6[H_4W_{19}O_{62}]$ is shown in FIG. 37. Significant hysteresis was observed in both devices between the upwards and downwards voltage sweeps, with a gap of approximately 0.2 V. This was also evident in the control measurements of the cluster $[W_{18}O_{56}(WO_6)]^{10-}$ and this device thus also showed that the precursor compound and $[W_{18}O_{56}(WO_6)]^{10-}$ are perfect examples of trapped charges giving flash memory like behaviour consistent with the previous observations. For the first initial post-excitation measurement, however, hysteresis was not observed for compound $[W_{18}O_{54}(SeO_3)_2]^{4-}$—see FIG. 36. Hysteresis has been observed in a number of different Wells-Dawson clusters and the effect was attributed to the cage structure. Absence of the hysteresis indicated a modification of the transport across the cage and across and between molecules to allow easier electron flow. The inventors consider the phenomenon to be a direct representation of the charging effects described electrochemically (the oxidation process $Se^{IV \rightarrow V}$ associated with the two $\{SeO_3\}$ templates). As demonstrated, this effect was only observed after the initial excitation, and was not recreated with consecutive pushing pulses for cluster $[W_{18}O_{54}(SeO_3)_2]^{4-}$. Thus, this experiment was not able to "re-charge" the POM material—this was typical behaviour across several devices and implied that the POM could be used as a write-once-read-once memory with a self-erase built in after reading (a 'write-once-erase' memory). As such the $+V_e$ driving force for this behaviour could be directly linked to the oxidation of the two Se guests within the POM demonstrating how, at the device level, the molecular configuration and formation of the $Se^V$ dopant underpinned this unprecedented behaviour. Devices containing compound $(C_{16}H_{36}N)_6[H_4W_{19}O_{62}]$, containing a fully oxidised $\{WO_6\}$ template, did not exhibit this behaviour, linking the observed device characteristics with the redox active $\{SeO_3\}$ templates.

Experimental: DFT Part in the Device Modelling

Single point calculations, for the fully converged B3LYP geometries, were carried out using ADF 2008 program (ADF 2008. 01, SCM, Theoretical Chemistry, Vrije Universiteit, Amsterdam, The Netherlands (http://www.scm.com); G. Velde et al., 2001) in order to obtain the MDC-q charge distribution of the POMs (M. Swart et al., 2001). The spin-unrestricted formalism was applied to open-shell species. The exchange-correlation functionals of Becke and Perdew were used (A. D. Becke, 1986; A. D. Becke, 1988; J. P. Perdew, 1986 and erratum). Relativistic corrections were included by means of the ZORA formalism. Triple-Z polarisation basis sets were employed to describe the valence electrons of W, O, and Se. The present computational settings, BP86/TZP, have been demonstrated to be a satisfactory methodology for describing the electronic structure of POMs (X. López et al., 2004). A continuous model solvent was used by means of the conductor-like screening model (COSMO) with a ionic radii of the atoms that defined the dimensions of the solvent cavity surrounding the molecule, chosen to be 1.26 Å for W and 1.52 Å for O. The dielectric constant ($\in$) was set to 78.40 to model $H_2O$ as solvent. Coordinates and the MDC-q charges were presented in the following lines. As in a previous paper from the inventors (L. Vilà-Nadal et al., Chem. Eur. J., 2013) to obtain the charge distribution used for the construction of the POM-layer within the Simulation Domain Bridge, a set of atomic charges output from the DFT package ADF was used. Of the several ways of constructing atomic charges from the self-consistent density calculation in DFT, the approach of Multipole Derived Charges (M. Swart et al., 2001) up to quadruple moment, i.e. MDC-q was chosen. This approach provided an accurate description of the electrostatic potential of the molecules, exactly reproducing dipole and quadruple moments in this case, and as such was considered suitable for integration in the device simulator.

Experimental: POM Deposition into the Devices

The two different POM clusters, $(C_{16}H_{36}N)_4[W_{18}O_{54}(SeO_3)_2] \cdot 2CH_3CN$ and $(C_{16}H_{36}N)_6[H_4W_{19}O_{62}]$, were used in the device studies. Crystalline samples of each compound were dissolved in acetonitrile (99.8%, Sigma Aldrich) at a concentration of 2.5 mg/mL. The solutions were agitated ultrasonically to ensure complete dissolution. Electrode samples were immersed in this solution for 5 minutes and then blow-dried in a stream of nitrogen. Investigation in the SEM indicated that the POMs were distributed over the majority of the devices and all measurements were conducted on devices where the POMs did not provide any potential conduction path between the electrical bond pads between the source, drain and control gate.

Device I: Flash Memory

Experimental

The Si nanowires were fabricated on 200 mm silicon-on-insulator (SOI) substrates purchased from SOITEC with a top Si layer of 55 nm and a buried oxide thickness of 150 nm. The wafers were implanted with P at an energy of 35 keV with a dose of $2 \times 10^{16}$ $cm^{-2}$. Following implantation, the wafers were annealed at 950° C. for 5 minutes to diffuse and active the dopant. Hall bar four-terminal measurements were used to determine that the activated dopant was $8 \times 10^{19}$ $cm^{-3}$. The samples were then cleaned in preparation for the lithography.

Hydrogen silsesquioxane (HSQ) was diluted in methyl isobutyl ketone (MIBK) at a ratio of 5:1 before being spun onto the wafers at 5000 rpm resulting in measured thickness of 50 nm. The substrates were then baked at 90° C. for 2 minutes. All the lithography was undertaken in a Vistec VB6 UHR electron-beam lithography tool operated at an accelerating voltage of 100 keV. Previous work demonstrated that an optimum dose of ~2700 $\mu C/cm^2$ allowed resist line widths in HSQ down to 5 nm (M. Mirza et al., 2012). After exposure, the resist was developed using a diluted tetramethyl ammonium hydroxide (TMAH) based solution with DI water of 1:3 for 1 minute at 23° C. More details of the experimental procedures are published elsewhere (M. Mirza et al., 2012). Samples were produced with resist line widths ranging of ~15 nm.

Figure 27:
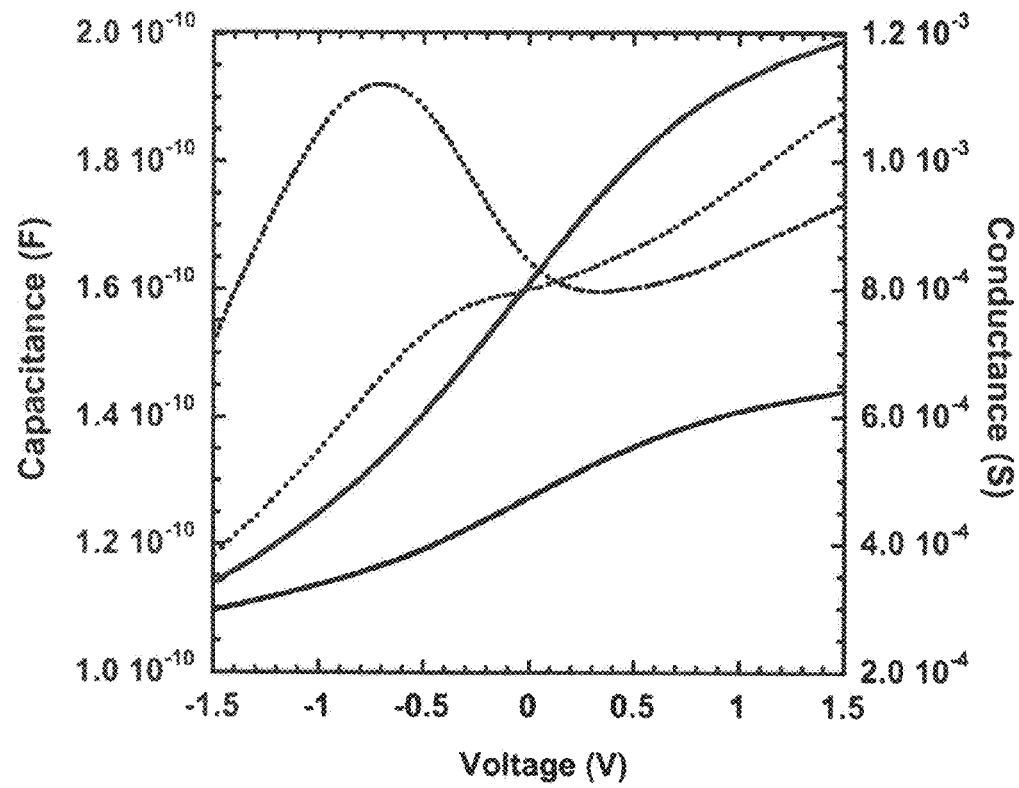
FIG. 27 shows the capacitance-voltage (CV in red labelled i) and the gate insulator conductance (in blue labelled ii) from test capacitors fabricated on the same die as the Si nanowire devices and used to characterise the thermal oxide. The dashed lines are for the as-grown thermal oxide whilst the solid lines are for the oxide after a 15 minutes anneal in forming gas. The CV indicates a reduction in mid-gap states after the forming gas anneal and a significant reduction in the oxide conductance.

A low damage $SF_6/C_4F_4$ inductively coupled plasma (ICP) reactive ion etch (RIE) process was undertaken in a STS tool operating at 600 W ICP coil power, 6 W platten power (corresponding to a dc bias of −23 V), $SF_6/C_4F_4$ flow rates of 25:90 standard cubic centimeters per minute (sccm) at standard temperature and pressure, a chamber pressure of 10 mTorr and a sample platten temperature of 20° C. The etch rate was 80 nm per minute for the silicon with a selectivity of the Si:HSQ etch rates of 2.5:1 (M. Mirza et al., 2012). After etching the samples were thermally oxidized in $O_2$ at 950° C. for 90 seconds to produce a ~4 nm thick $SiO_2$ passivation layer. Optical lithography was then used to define electrical contacts. HF was used to etch through the oxide before 20 nm of Ni and 50 nm of Pt were deposited by electron beam evaporation. Finally the devices were annealed in forming gas (95% $N_2$ and 5% $H_2$) 380° C. for 15 minutes. Capacitance-voltage (CV) measurements made on large capacitors with guard rings on bulk n-Si wafers indicated that the as grown oxide had a number of mid-gap states (see FIG. 22a). Hence the anneal in forming gas was developed to reduce these mid-gap states as shown by the CV measurements in FIG. 27. The anneal also alloyed the Ni to form a NiSi Ohmic contact with a specific contact resistance of 0.8 n-mm as measured by the circular transfer line method (K. Gallacher et al., 2012).

FIG. 22a provides a SEM picture of the completed Si nanowire device. A Hall bar arrangement was fabricated to allow the carrier density and mobility of the Si nanowire device to be characterised. For all the experiments presented, only two terminal source-drain measurements are presented with the side gate used to control the channel conductance. All electrical measurements were undertaken at 300 K on a Cascade Microtech probe station using an Agilent B1500 semiconductor parameter analyser with source measurement units allowing 100 atto-Amp resolution.

Before any molecules were deposited onto the Si nanowire devices, the devices were measured as fabricated and then measured after the devices had been submerged into acetone and dried using nitrogen. No changes in the current-voltage characteristics of the transistor devices could be determined even on high resolution plots of transfer characteristics. The POMs were deposited into the devices after being dissolved in acetone and then a single drop deposited onto a Si nanowire device. Nitrogen was used to evaporate the acetone solvent before the device with POMs was electrically characterised. Investigation in the SEM indicated that the POMs were distributed over the majority of the device and all measurements were conducted on devices where the POMs did not provide any potential conduction path between the electrical bond pads between the source, drain and control gate.

FIG. 22b, c presents the electrical results at 300 K. The dashed green lines (uppermost lines) in FIGS. 22 b, c are the current-voltage (IV) characteristics of the two-terminal source-drain Si nanowire channel as a function of the control gate voltage on a semi-log and a linear scale before any POM molecules were deposited. Whilst the 7 nm wide Si nanowire was heavily doped and expected to be a depletion mode device, by being sub-10 nm, the surface depletion was sufficient to turn the device into an enhancement mode device. The orange dashed lines (second from top) are the IV characteristics for the POMs after deposition but before any attempt had been made to charge or discharge the POMs. The solid red lines (third from top) are the I-V characteristics of the Si nanowire with POMs after a −20 V pulse for 10 seconds. This should inject electrons into the POM molecules above the LUMO energy state and the IV characteristics (solid blue line, bottom) indicated a strong shift in the threshold voltage, $V_T$ indicating that the POMs around the molecule changed their charge state. The sub threshold slope is not completely parallel to the uncharged POMs or the bare Si nanowire indicating that additional charging is occurring. −20 V was chosen as this is 40 V/m between the control gate and the channel which was well below the breakdown of the thermal $SiO_2$ of 109 V/m and therefore it was unlikely that the thermal oxide around the nanowire was charging (S. Sze and K. K. Ng, 2007). The device, however, was coated with a large density of POMs but the most likely reason is that the substrate oxide in the SOI could also have charge injected which would affect the sub threshold slope. The +20 V used to reduce the electron charge in the POMs returned the IV to something similar to the uncharged POMs as deposited but again there was a little change from the original charged state. The sub threshold slope was improved compared to the charged state suggesting that the substrate charging or other charging mechanisms responsible was reversible.

If the smallest $\Delta VT$ was used between the −20 V and +20V at a drain current of 10-10 A then $\Delta V_T = 1.2 \pm 0.1$ V. On the linear plot of IV, $\Delta V_T$ increased to ~3 V demonstrating a significant level of charging around the device. If it is assumed that the POMs have a dielectric constant similar to $SiO_2$ of 3.9 then this $\Delta V_T = 1.2 \pm 0.1$ V indicated a sheet charge density stored in the POMs of ~$2 \times 10^{15}$ cm$^{-2}$. The retention time of the POMs has been measured to be non-volatile for at least 336 hours and the charging and discharging has been repeated many times in tens of devices to demonstrate the reproducibility of the molecular flash memory.

Figure 35:
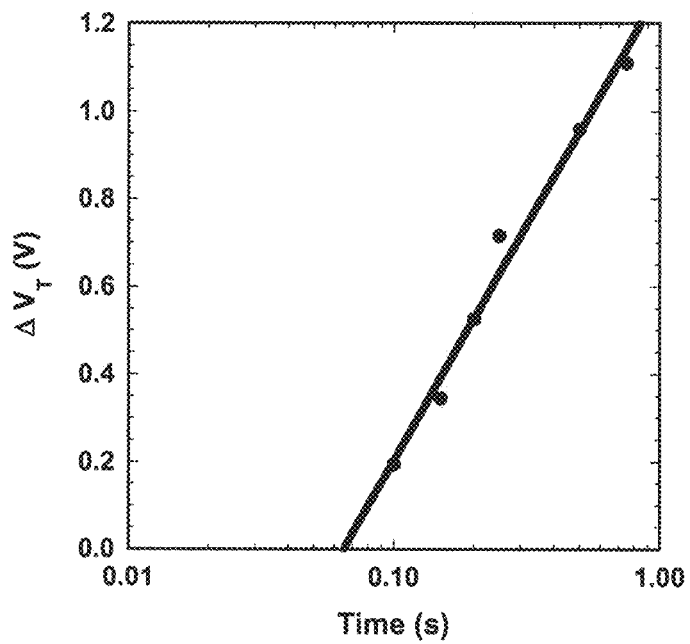
FIG. 35 shows a plot the shift in the threshold voltage ($\Delta V_T$) as a function of log time for a typical device coated with POMs.

In order to further characterise the program/erase characteristics of the devices the shift in the threshold voltage ($\Delta V_T$) of the nanowire coated in POMs was plotted (see FIG. 35) as a function of log time. This demonstrated that the programme/erase times were currently limited to 0.1 s for a reasonable signal to noise ratio.

This flash memory system is therefore considered fully functional—readable, writeable and has good charge retention without decay. Preliminary investigations indicate good lifetime and robust performance.

Device II— Write-Once-Read-Once Memory

Experimental

Samples were fabricated on 500 μm thick single crystal n-type <100> silicon doped with arsenic to a resistivity of <0.005 Ohm-cm (Virginia Semiconductor, USA). After cleaning in persulfuric acid (Caro's acid) (4:1 mixture of 30% $H_2O_2$ and $H_2SO_4$), a 30 nm oxide was grown on the surface by thermal oxidation in oxygen at 1135° C.

The electrode array pattern was defined by electron beam lithography. The wafer was spincoated with a 105 nm thick layer of PMMA (Elvacite 2041, Lucite International), exposed in a Vistec VB6 UHR EWF system, and developed in a 3:1 IPA:MIBK mixture for 45 seconds, followed by a rinse in pure IPA. After a 30 second treatment in oxygen plasma at 40 W to remove any polymer residue, Ti/Pt was deposited on the sample by e-beam evaporation (MEB 550S, Plassys, France). Platinum was chosen as the electrode material due to its good electronic properties and the stability at high temperatures necessary to withstand the annealing performed later. The sample was immersed in remover 1165 (Shipley) overnight and then sprayed with acetone and rinsed in IPA to lift off the polymer and define the electrodes. The gate contact was defined using photolithography. The sample was spincoated with a 1.5 μm layer of photoresist (S1818, Shipley), exposed using standard i-line exposure (MA6, Karl Suss), and developed in microposit MF-319 for 1 min followed by a rinse in water. The barrier oxide was etched using hydrofluoric acid, and the sample immediately transferred to the vacuum chamber for evaporation of 200 nm of aluminium. Lift-off was performed in acetone with ultrasonic agitation to finalize the contact. In the final step, the sample was annealed at 500° C. for 20 minutes. This served to remove trapped charges in the barrier oxide, present due to the electron beam lithography. Failure to remove these charges would result in a high level of leakage current between the electrodes through the oxide.

POM Deposition:

POM crystals as received were dissolved in acetonitrile (99.8%, Sigma Aldrich) at a concentration of 2.5 mg/mL. The solution was agitated ultrasonically to ensure complete dissolution. Electrode samples were immersed in this solution for 5 minutes and then blow-dried in a stream of nitrogen. Various concentrations of material were tested and it was found that lower concentrations gave vary poor coverage of the surface, but this concentration was sufficient to largely cover the surface with material, ensuring deposition at the nanogaps, although the specific arrangement was uncontrolled.

Figure 28:
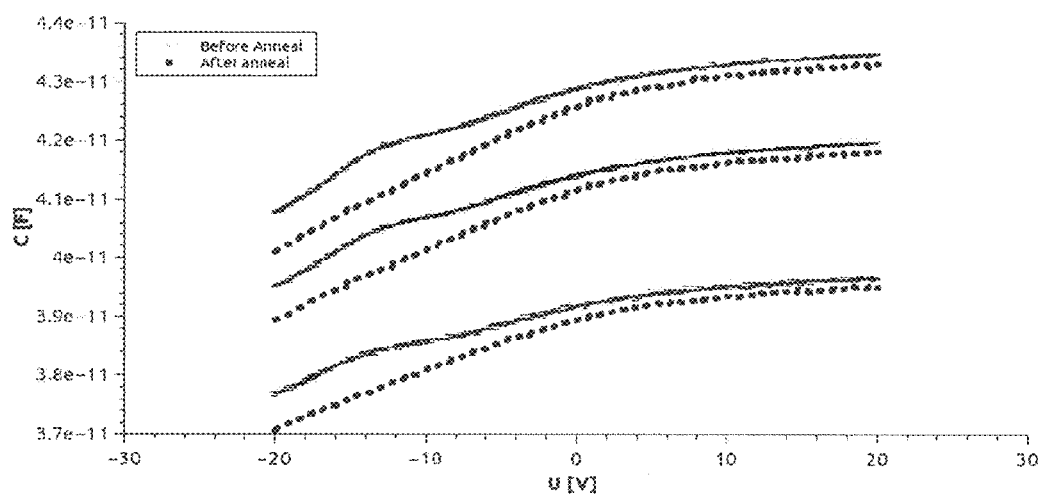
FIG. 28 shows capacitance measurements before (black, solid lines above the dotted red lines) and after (red, dotted lines beneath the black lines) annealing for 20 minutes at 500° C. Measurements were taken at 50 kHz on three square capacitor pads of slightly different dimension. The "bump" in the curve at around −12 V is indicative of the presence of trapped charge in the dielectric. The anneal process was sufficient to remove all indications of trapped charges. The change in capacitance (F) is shown with change in voltage (V).
Figure 29:
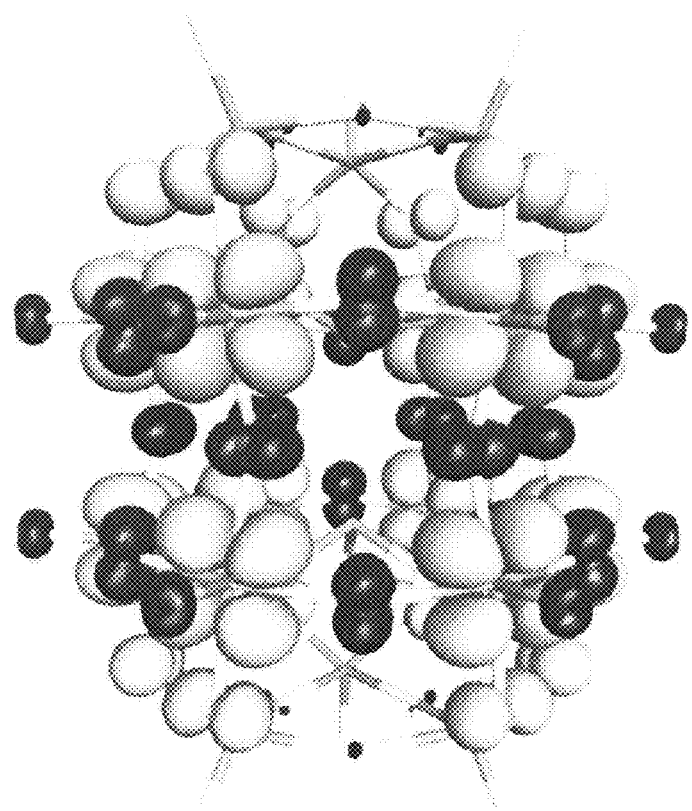
FIG. 29 shows spin density map (the difference between alpha- and beta-electron densities) of the one-electron reduced cluster (S=1/2) for $[W_{17}W_VO_{54}(SeO_3)_2]^{5-}$. In the spin density map, blue shapes (spin down, ↓) taken as negative and white shapes (spin up, ↑) taken as positive. According to convention, the electron density associated with a spin aligned parallel to the applied field is taken as positive, and the corresponding to antiparallel spin as negative.

Device Measurements:

Measurements were performed at a Cascade Microtech Summit probe station. Data was acquired using an Agilent B1500A Semiconductor Device Analyzer with a high resolution source-measurement unit. To verify that the anneal was sufficiently effective at removing trapped charges, capacitive measurements were performed using square pads fabricated on the same sample as the nanogap electrodes with the same electron beam exposure. As seen in FIG. 28, the annealing was sufficient to remove the characteristic footprint of trapped charges.

Fabricated electrode pairs were measured after fabrication but before POM deposition. This procedure ensured that electrode pairs with any defects were not needlessly measured with POMs present, and also provided confidence that measured effects were due to the POM material, and not an artefact from the electrode arrangement. Electrode pairs were also inspected by scanning electron microscopy and atomic force microscopy after measurements were complete.

It is thus considered that the present invention, and in particular the demonstrated inclusion of POM molecules as the floating gate storage node of a non-volatile MOS flash memory with MOS gates and readout channel circumvents many of the challenges encountered in scaling conventional and molecular based flash memories to date.

Experimental

Reagents:

$Na_2WO_4.2H_2O$ (Sigma, AR grade), $Na_2SeO_3$ (Sigma, 99%, AR grade), HCl (Sigma, Analar 36.5%-38% aqueous solution), $(CH_3)_2NH_2Cl$ (Alfa-asear, 98+%), $(N(Bu)_4)Br$ (TBA·Br Sigma, 99%, AR grade), $NR_4BF_4$ and $NR_4PF_6$ (R=Bu, Hex; Sigma, electrometric grade). All solvents used were HPLC grade, 99.9% (Fisher Scientific). For electrochemical studies, $CH_3CN$ was freshly degassed prior to use.

Cyclic Voltammetry:

CHInstruments 760 electro-analytical systems was used for cyclic voltammetry, bulk electrolysis and coulometry. The standard three electrode cell electrochemical arrangement was employed. Glassy carbon disk (d, 3.0 mm), carbon felt or platinum net were used as working electrodes. The counter electrode was a platinum wire and an Ag/AgCl electrode was used as reference. During electrolysis experiments, the counter electrode compartment was separated from the working electro part by a porous glass frit and the reference electrode was positioned as close as possible to the working electrode in order to maximize the uniformity of the potential over its surface. All electrode potentials are quoted either relative to the ferrocene/ferrocenium redox couple (Fc/Fc+) or to the Ag/Ag+ reference (see respective measurements for details).

FTIR spectra were prepared as KBr pellets and FT-IR spectra were collected in transmission mode using a JASCO FT-IR 4100 spectrometer. Wavenumbers are given in $cm^{-1}$.

EPR spectra X-Band EPR spectra were recorded on a Bruker Elexsys 500E spectrometer with a cylindrical $TE_{011}$ cavity as approximately $1\times10^{-4}$ M frozen acetonitrile solution (100K).

Elemental microanalysis was carried out at the University of Glasgow using an EA 1110 CHNS, CE-440 Elemental Analyzer.

Electrospray-ionisation mass spectrometry (ESI-MS) were performed using a Bruker microTOF-Q quadrupole time-of-flight mass spectrometer.

Single Crystal X-Ray Diffraction:

Suitable single crystal was selected and mounted onto the end of a thin glass fibre using Fomblin oil. Single crystal datasets were collected at 150(2) K on the following instruments. Bruker AXS Apex II ($\lambda(MoK\alpha)=0.71073$ Å) equipped with a graphite monochromator. Oxford Diffraction Gemini Ultra ($\lambda(MoK\alpha)=0.71073$ Å and $\lambda(CuK\alpha)=1.5405$ Å) equipped with a graphite monochromator and ATLAS CCD detector.

Structure solution and refinement were carried out with SHELXS-97 (R. herbst-Irmer and G. M Sheldrick, 1998) and SHELXL-97 (L. J. Farrugia, 1999) via WinGX (R. C. Clark and J. S. Reid, 1995). Corrections for incident and diffracted beam absorption effects were applied using analytical methods (A. D. Becke, 1988). CIF files are available from CCDC.

Preparation of $(C_2H_8N)_7Na[W_{18}O_{56}(SeO_3)_2(H_2O)_2].6H_2O$.

Dimethylamine hydrochloride (3.000 g 36.8 mmol), $Na_2SeO_3$ (0.500 g, 2.89 mmol) and $Na_2WO_4.2H_2O$ (5.000 g, 15.16 mmol) were dissolved in water 30 mL. Hydrochloric acid (37%) was added drop-wise under stirring and the pH of the solution was adjusted to 3.0. The solution was gently heated until it started to turn cloudy and filtered. It was again filtered once it cooled completely. Slow evaporation of the filtrate allowed the crystals to form in three days. Yield: 33.5% (1.410 g, 0.30 mmol). I.R. (KBr disk, v/cm$^{-1}$): 3441, 2963, 2674, 1442, 1157, 1107, 956, 880, 797. Elemental analysis, calc. for $(C_2H_8N)_7Na[W_{18}O_{56}(SeO_3)_2(H_2O)_2].6H_2O$: C, 3.40; H, 1.47; N, 1.98. Found C, 3.05; H, 1.31; N, 1.82. TGA water loss from 20 to 200° C., calculated (found) %: 2.2 (2.9).

Preparation of $(C_{16}H_{36}N)_4[W_{18}O_{54}(SeO_3)_2].2CH_3CN$.

Solid $(C_2H_8N)_7Na[W_{18}O_{56}(SeO_3)_2(H_2O)_2].6H_2O$ (4.0 g) was dissolved in 50 mL diluted 0.5 M Hydrochloric acid (37%). Tetrabutylammonium bromide (10.0 g) was dissolved in water (30 mL) and added, under stirring, to the previous solution. The precipitate was centrifuged and washed with water, ethanol, and diethyl ether and then dried in vacuum for 2 days. The compound was purified by recrystallization from acetonitrile. Pale yellow block crystals formed in a week and were dried in high vacuum. Yield: 63.1% (3.854 g). Negative mode ESI-MS (MeCN): 2456.1 $\{(TBA)_2[W_{18}Se_2O_{60}]\}^{2-}$. Elemental analysis, calc. for $(C_{16}H_{36}N)_4[W_{18}O_{54}(SeO_3)_2]$: C, 14.24; H, 2.62; N, 1.04. Found C, 14.28; H, 2.40; N, 1.02.

Preparation of $[W_{18}O_{54}(SeO_3)_2]^{2-}$.

A yellow solution of $(C_{16}H_{36}N)_4[W_{18}O_{54}(SeO_3)_2]\cdot 2CH_3CN$ (70 mg) in 20 mL of a 0.1 M THA $BF_4$ in $CH_3CN$ was oxidized at 2.3 V (vs. Ag/AgCl) until the Faradaic current decayed to zero. Coulometry indicated the transfer of 1.8(2) electrons per molecule.

Preparation of $(C_{16}H_{36}N)_5[W_{18}O_{54}(SeO_3)_2]\cdot 3CH_3CN$.

The yellow solution of $(C_{16}H_{36}N)_4[W_{18}O_{54}(SeO_3)_2]\cdot 2CH_3CN$ (70 mg) in 20 mL of a 0.1 M TBA $BF_4$ in $CH_3CN$ was reduced at −0.1 V (vs. Ag/AgCl) until the Faradaic current decayed to zero. Coulometry indicated the transfer of 0.97(5) electrons per molecule. Evaporation of the resulting dark blue solution results in crystals of $(C_{16}H_{36}N)_5[W_{18}O_{54}(SeO_3)_2]\cdot 3CH_3CN$. Crystal structure determination clearly showed five TBA+ cations, confirming the composition.

Preparation of $(C_{16}H_{36}N)_6[W_{18}O_{54}(SeO_3)_2]\cdot 3CH_3CN\cdot H_2O$.

Electrolysis of an equivalent solution to $(C_{16}H_{36}N)_5[W_{18}O_{54}(SeO_3)_2]\cdot 3CH_3CN$ at the more negative potential of −0.5 V (vs. Ag/AgCl) led to a deep blue solution. Coulometry indicated the transfer of 1.95(5) electrons per molecule. The solution was refrigerated at −20° C. and vapour diffusion with ether led to blue crystals of $(C_{16}H_{36}N)_6[W_{18}O_{54}(SeO_3)_2]\cdot 3CH_3CN\cdot H_2O$ overnight. Crystal structure determination clearly showed six TBA+ cations, confirming the composition.

Preparation of $(C_{16}H_{36}N)_6[H_4W_{19}O_{62}]$ was carried out according to literature methods (G.-L. Lomg et al., 2006, 4798).

Figure 25:
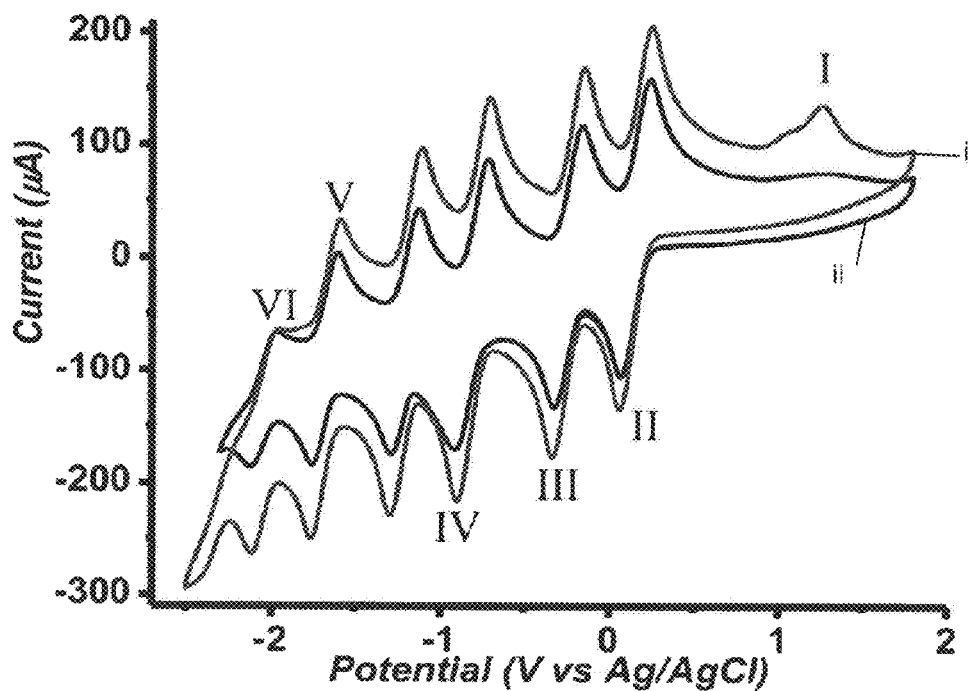
FIG. 25 shows the cyclic voltammogram (second cycle of potential) obtained for solid $[W_{18}O_{54}(SeO_3)_2]^{4-}$ in contact with 0.1 M $TBAPF_6$ solution at a GCE (diameter=1.5 mm) with scan rate=200 mV $s^{-1}$ on and scanning range of −2.9 V to 1.5 V (red line labelled i) or −2.7 V to 1.5 V (black line labelled ii). The voltammograms show change in current (μA) with change in voltage (V, with respect to Ag/AgCl reference electrode)
Figure 26:
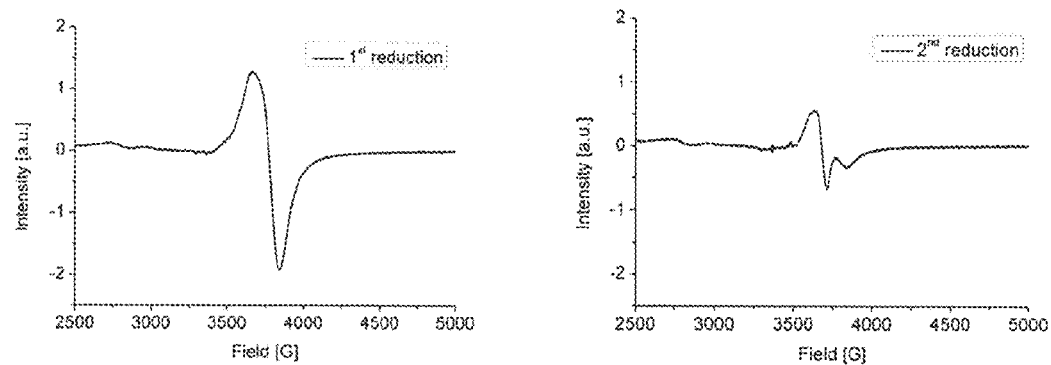
FIG. 26 shows EPR spectra of the first (left) and second (right) reduction of $[W_{18}O_{54}(SeO_3)_2]^{4-}$, showing change in intensity (a.u.) with change in field (G).

Preliminary investigations showed that species $(TBA)_4[W_{18}O_{54}(SeO_3)_2]$ was hardly soluble in the commonly used $CH_3CN$ (0.1 M $Bu_4NBF_4$). Therefore, 0.1 M $Hex_4N\ BF_4$ or $Hex_4N\ PF_6$ were employed as the electrolyte in $CH_3CN$, allowing the POMs to be easily studied at the 0.1 mM concentration level. FIGS. 24 and 25 display cyclic voltammograms obtained of $[W_{18}O_{54}(SeO_3)_2]^{4-}$ in $CH_3CN$. Results are summarized in Table 7.

López et al., 2012) that adopts a drift diffusion transport formalism and includes quantum corrections by means of the density-gradient approach, essential for the accurate modelling of deca-nanometer devices (A. Lewis et al., 2004). The capabilities of the simulator were extended to allow the incorporation of arbitrary fixed charge distribution in the gate oxide, to model the storage media of the flash memory cell.

The electrode array samples were fabricated with conventional nanofabrication methods. A thermal oxide was grown on a highly doped (0.025 Ohm-cm) single crystal silicon substrate. Electron-beam lithography followed by lift-off of a 5/35 nm layer of Ti/Pt defining the electrode patterns. To define the gate contact, photolithography was performed followed by etching of the gate oxide in hydrofluoric acid and a lift-off of a 200 nm Al layer providing an Ohmic contact to the silicon below. Finally, the devices were annealed in a furnace at 500° C. for 30 minutes to remove trapped charges in the oxide. To deposit the POM thin films, the samples were simply immersed in a solution of POM in acetonitrile for 5 minutes, and subsequently dried in a stream of nitrogen. The concentration was 2.5 mg/ml. The electrical data was collected on a Cascade Microtech Attoguard shielded probe station using Kelvin probes and an Agilent B1500A semiconductor parameter analyser.

Bulkelectrolysis and Coulometry:

Experiments were carried out using a CHI 600D computer-controlled electroanalytical system in the potentiostat mode. The bulk electrolysis H-cell contained a Pt net electrode and a Pt wire which served as the working and counter electrodes respectively. The working electrode and counter electrode were separated by a glass frit. The reference electrode (Ag/AgCl) was positioned as close as possible to the working electrode in order to maximize the uniformity of potential over its surface (see also section above).

$[W_{18}O_{54}(SeO_3)_2]^{2-}$: Coulometry (at 2.3V vs Ag/AgCl) indicated the transfer of 1.8(2) electrons per molecule. The electrolysis was carried out in 0.1 M THA $BF_4$ in $CH_3CN$.

TABLE 7

Potentials ($E_f^0$) derived from voltammetry of $(C_{16}H_{36}N)_4[W_{18}O_{54}(SeO_3)_2]\cdot 2CH_3CN$ 0.2 mM in 0.1M THA $PF_6$ solution in $CH_3CN$ at a GCE (diameter = 1.5 mm). Scan rate 100 $mVs^{-1}$. For a reversible process $\Delta E_p$ in mV is given.

| Species | Redox process | $E_f^0$ (V vs Ag/AgCl) | $\Delta E_p$ (mV) |
|---|---|---|---|
| $[W_{18}O_{54}(SeO_3)_2]^{4-}$ | $[W_{18}O_{54}(SeO_3)_2]^{2-/4-}$ | 0.922 | — |
| | $[W_{18}O_{54}(SeO_3)_2]^{5-/4-}$ | 0.098 | 84 |
| | $[W_{18}O_{54}(SeO_3)_2]^{6-/5-}$ | −0.297 | 84 |
| | $[W_{18}O_{54}(SeO_3)_2]^{7-/6-}$ | −0.852 | 83 |
| | $[W_{18}O_{54}(SeO_3)_2]^{8-/7-}$ | −1.244 | 86 |

All quantum chemical calculations were performed at the density functional theory (DFT) level. Accurate geometry optimizations were performed by using the hybrid functional B3LYP method as implemented in the TURBOMOLE V6.3.1 3 package (A. Lewis et al., 2004).

For these calculations, the TZVP basis set was used on all atoms. To allow for solvation effects, the conductor-like screening model (COSMO) (A. Schafer et al., 2000, X. López et al., 2012) method was used with ionic radii of the atoms, which define the dimensions of the cavity surrounding the molecule, are chosen to be (in Å) 1.26 for W, 1.52 for O, 0.5 for Se.

The 3D numerical simulations of the flash-cell were performed with the commercial simulator GARAND (X.

$[W_{18}O_{54}(SeO_3)_2]^{5-}$: Coulometry (at −0.1V vs Ag/AgCl) indicated the transfer of 0.97(5) electrons per molecule. The electrolysis was carried out in 0.1 M TBA $BF_4$ in $CH_3CN$.

$[W_{18}O_{54}(SeO_3)_2]^{6-}$: Coulometry (at −0.5V vs Ag/AgCl) indicated the transfer of 1.95(5) electrons per molecule. The electrolysis was carried out in 0.1 M TBA $BF_4$ in $CH_3CN$.

REFERENCES

The following references are incorporated by reference herein:

ADF 2008. 01, SCM, Theoretical Chemistry, Vrije Universiteit, Amsterdam, The Netherlands (http://www.scm.com)

International Roadmap for Semiconductors (ITRS) 2012 edition http://www.itrs.net
Memory Strategies International; www.memorystrategies.com: 3D Vertical NAND Flash Memory, July 2013
S. M. Amoroso et al., IEDM 2010, Tech Digest, 22.6.1
S. M. Amoroso et al., IEEE Trans. Electron Devices, 2011, 58/7, 1864
T. M. Anderson et al., Science 2004, 306, 2074
A. Asenov et al., IEEE Trans. Electron Devices 2001, 48/4, 722
A. Aviram and M. Eatner, Chem. Phys. Lett., 1974, 29, 277
A. D. Becke, J. Chem. Phys. 1986, 84, 4524
A. D. Becke, Phys. Rev. A., 1988, 38, 3098
V. Bonfiglio and G. Iannaccone, Solid State Electronics, 2013, 84, 127
B. B. Bourlinos et al., J. Am. Chem. Soc., 2004, 126, 15358
A. J. Bridgeman and G. Cavigliasso, J. Phys, Chem. A 2003, 107, 6613
J. Cano et al., Comments Inorg. Chem. 1998, 20, 27
B. Carole et al., Dalton Trans. 2007, 4599
P.-C. Chen et al., IEEE Trans. Nanotechnology, 2008, 7, 668
R. C. Clark and J. S. Reid, Acta. Cryst. A., 1995, 51, 887
E. Coronado and C. J. Gomez-Garcia, Chem. Rev., 1998, 98, 273
E. Coronado et al., Angew. Chem. Int. Ed., 2004, 43, 3022
L. Cronin et al., Angew. Chem. Int. Ed. 2002, 41, 2805
L. Cronin, *The Potential of Pentagonal Building Blocks in Inorganic Chemistry Highlights*, Wiley-VCH, Weinheim, 2002, pp. 113-121
L. Cronin in *Comprehensive Coordination Chemistry II*, vol. 7, 2004, Elsevier, pp. 1-57
C. Dawson, Acta Crystallogr. Sect. B. 1953, 6, 113
C. M. Douvas et al., Nano, 2008, 2, 733
S. Faas et al., Chem. Phys. Lett. 1995, 246, 632
L. J. Farrugia, J. Appl. Cryst., 1999, 32, 837
N. Fay et al., Inorg. Chem. 2007, 46, 3502
J. A. Fernández et al., J. Am. Chem. Soc. 2007, 129, 12244
D. Fleming et al., Nature Nano. 2008, 3, 229
D. H. Flood et al., Science, 2004, 306, 2055
L. Forbes, U.S. Pat. No. 5,852,306
R. H. Fowler and L. Nordheim, Proc. R. Soc. Lond. A, 1928, 119, 173
L. Fleming et al., Nat. Nanotechnol., 2008, 3, 289
B. Fleury et al., Thin Solid Film, 2011, 519, 3732
K. Gallacher et al., Appl. Phys. Letts. 2012, 101, 211101
C. Gallon et al., IEEE Trans. Electron Devices, 2004, 51, 1254
J. E. Green et al., Nature 2007, 445, 414
S. P. Harmalker et al., J. Am. Chem. Soc. 1983, 105, 4286
R. Herbst-lrmer and G. M. Sheldrick, Acta Crystallogr. Sect. B., 1998, 54, 443
D. L. Hill, Chem. Rev., 1998, 98, 1
A. Joachim et al., Nature 2000, 408, 541
B. E. Katsoulis, Chem. Rev. 1998, 98, 359
E. Klamt and G. J. Schüürmann, Chem. Soc., Perkin Trans. 2. 1993, 799
U. K. Klaning and K. Sehested, J. Phys. Chem.-US, 1986, 90, 5460
B. Kumar et al., IEEE Trans. Electron Devices 2006, 53/4, 698
J. Lee et al., IEEE Electron Device Letters, 2002, 23/5, 264
J. Lehmann et al., Nat. Nanotechnol., 2007, 2, 312
F. Lewis et al., J. Chem. Ed. 2004, 81, 596
P. A. Lewis et al., J. Am. Chem. Soc., 2005, 127, 17421
H. Li, et al., J. Am. Chem. Soc. 2011, 133, 9423
S. Liu et al., Adv. Mater. 2002, 14, 225
C. L. Long et al., Angew. Chem. Int. Ed. 2004, 43, 1817
D.-L. Long et al., Angew. Chem. Int. Ed., 2005, 44, 3415
D.-L. Long et al., Dalton Trans., 2005, 50, 1372
D.-L. Long and L. Cronin, Chem. Eur. J. 2006, 12, 3698
D.-L. Long et al., Angew. Chem. 2006, 45, 4798
D.-L. Long et al., Angew. Chem. 2006, 118, 4916
D.-L. Long et al., Chem. Soc. Rev., 2007, 36, 105
D.-L. Long et al., Angew. Chem. Int. Ed., 2008, 47, 4384
D.-L. Long et al., Angew. Chem. Int. Ed., 2010, 49, 1736
X. López et al., J. Am. Chem. Soc. 2001, 123, 9571
X. López et al., J. Am. Chem. Soc. 2002, 124, 12574
X. López et al., Chem. Soc. Rev. 2003, 32, 297
X. López et al., Inorg. Chem. 2003, 42, 2634
X. López et al., J. Comput. Chem. 2004, 25, 1542
X. López et al., Inorg. Chem. 2006, 45, 6467
X. López et al., Dalton Trans. 2006, 9, 1162
X. López et al., Chem. Soc. Rev. 2012, 41, 7537
C.-Y. Lu et al., Microelectronics Engineering 2008, 86, 283
J. M. Maestre et al., J. Am. Chem. Soc. 2001, 123, 3749
S. Markov et al., IEEE Trans. Electron Devices 2011, 58/8, 2385
G. W. A. Mariotti et al., Inorg. Chem. 2007, 46, 2530
I.-M. Mbomekalle et al., Inorg. Chem. 2010, 49, 7001
E. McGregor et al., Inorg. Chem. 2012, 51, 9017
J. R. Milligan et al., Int. J. Radiat. Biol., 2002, 78, 359
M. Mirza et al., J. J. Vac. Sci. Technol. B., 2012, 30, 06FF02-1
H. Müller et al., Angew. Chem. Int. Ed. 1995, 34, 2122
A. Müller et al., Angew. Chem. Int. Ed. 1998, 37, 3359
A. Müller et al., Nature, 1999, 397, 48A. Müller et al., Angew. Chem. Int. Ed. 2002, 41, 1162
A. Müller et al., Angew. Chem. Int. Ed. 2003, 42, 5039
A. Müller and S. Roy in *The Chemistry of Nanomaterials: Synthesis, Properties and Applications*, 2004, Wiley-VCH, Weinheim
B. Musumeci et al., Nano, 2011, 5, 12, 9992
R. Neumann et al., Chem. Rev. 1998, 98, 199
F. Papaconstantinou, Chem. Soc. Rev. 1989, 18, 1
J. P. Perdew, Phys. Rev. B, 1986, 33, 8822 (Erratum: 34, 7406)
J. M. Poblet et al., Chem. Soc. Rev. 2003, 32, 297
S. Polarz et al., Adv. Mater. 2000, 12, 1503
M. T. Pope in *Comprehensive Coordination Chemistry III*, vol. 3, 1987, pp. 1023-1058
M. T. Pope and A. Müller, Angew. Chem. Int. Ed., 1991, 30, 34.
I. Prados and M. T. Pope, Inorg. Chem. 1976, 15, 2547
I. Prat et al., Nat. Chem., 2011, 3, 788
T. Pro et al., IEEE Trans. Nanotechnology 2009, 8/2, 204
C. C. Pye and T. Ziegler, Theor. Chem. Acc. 1999, 101, 396
D. Ritchie et al., Chem. Communc. 2007, 468
G. Roy et al., IEEE Trans. Electron Devices 2006, 53/12, 3063
E. Ruiz et al., Coord. Chem. Rev. 2005, 249, 2649
T. Rither et al., J. Am. Chem. Soc. 2003, 125, 10133
M. Sadakane and E. Steckhan, Chem. Rev., 1998, 98, 219
M.-L. Seol et al., ACS Nano, 2012, 6, 183
J. Shaw et al., IEEE Trans. Electron Devices 2009, 56/8, 1729
K. Shaw et al., IEEE Trans. Electron Devices, 2011, 58/3, 826
J. Shaw et al., IEEE Trans. Electron Devices, 2012, 59, 1189
J. G. Simmons, J. Appl. Phys, 1963, 34, 1793
R. Strandberg, Acta Chem. Scand. Ser. A 1975, 29a, 350
K.-D. Suh et al., IEEE Journal of Solid-State Circuits 1995, 30/11, 1149
L. Swart et al., J. Com. Chem., 2001, 22, 79

S. Sze and K. K. Ng, "Physics of Semiconductor Devices, Wiley, New York, 2007
S. J. Tans et al., Nature, 1998, 393, 49
F. te Velde et al., Comput. Chem. 2001, 22, 931
S. Tiwari et al., IEEE Intl. Electon Devices Meeting 1995, 521
O. Treutler and R. Ahlrichs, J. Chem. Phys., 1995, 102, 346
R. Tsunashima et al., Phys. Chem. Chem. Phys., 2011, 13, 7295
G. M. Varga Jr. et al., Inorg. Chem. 1970, 9, 662
H. Velde et al., J. Comput. Chem., 2001, 22, 931
M. Vilà-Nadal et al., Dalton Trans., 2012, 41, 2264
L. Vilà-Nadal et al., Angew. Chem. Int. Ed., 2013, 52, 9695
L. Vilà-Nadal et al., Chem. Eur. J., 2013, 19, 16502S. H. Vosko et al, Can. J. Phys. 1980, 58, 1200
L. Wang et al., Inorganic Chemistry Communications, 2013, 35, 122
A. M. Way et al., Inorg Chem. 1997, 36, 4227
J. F. Wells, in *Structural Inorganic Chemistry*, 1st ed., 1945, p. 344
N. White et al., IEEE Trans. Comp., Packaging Manufacturing Tech.-Part A 1998, 20/2, 190
I. Xie et al., Chem. Commun. 2008, 576
T. Yamase, Chem. Rev. 1998, 98, 307
L. Yan et al., J. Am. Chem. Soc. 2008, 130, 8223
J. Yan et al., Angew. Chem. Int. Ed. 2009, 48, 4376
K. Zhang et al., Inorg. Chem. 2004, 43, 8263
F.-Q. Zhang et al., Inorg. Chem. 2011, 50, 4967
H. Zhu et al., Appl. Phys. Lett, 2013, 103, 53102

What is claimed is:

1. A polyoxometalate compound for use in a memory device, wherein the polyoxometalate is capable of at least one of the group selected from providing at least one electron, accepting at least one electron, and providing and accepting at least one electron, the polyoxometalate compound having a formula $[M_{18}O_{54}(SeO_3)_2]^{4-}$, where j is selected from the group consisting of 3 and 4, and M is selected from the group consisting of W and Mo, wherein optionally the formula may be $[W_{18}O_{54}(SeO_3)_2]$ and this may further optionally may be the α-form.

2. A memory device comprising a polyoxometalate compound of claim 1.

3. The memory device according to claim 2, wherein the memory device has a floating gate and the floating gate comprises the polyoxometalate.

4. The memory device according to claim 2, which is selected from the group consisting of a non-volatile molecular memory device, a flash memory device, a write-once-read-once memory device, a NAND memory device, a planar flash memory device such as at least one of a 2z generation planar flash memory device and a 1x generation planar flash memory device, and a 3D flash memory device.

5. The memory device according to claim 2, having a plurality of polyoxometalates which may be one of the group consisting of (i) all the same; and (ii) not all the same; and optionally the plurality of polyoxometalates may be arranged in a manner selected from a plurality of layers and a regular lateral distribution.

6. The memory device according to claim 2, wherein the polyoxometalate is capable of at least one of the group consisting of providing, accepting, and providing and accepting at least two electrons, such as at least four electrons.

7. The memory device according to claim 2, wherein the polyoxometalate has at least one of the group consisting of:

(i) at least one of the group consisting of a reduction potential, an oxidation potential, and a reduction and oxidation potential of between −2,500 mV and −250 mV;
(ii) at least one of the group consisting of a first oxidation potential, a first reduction potential, and a first oxidation and first reduction potential at between −1,800 to −800 mV;
(iii) at least one of a second oxidation potential, a second reduction potential, and a second oxidation and second reduction potential of between −1,700 to −300 mV;
(iv) at least one of first- and second- reduction potentials, first- and second- oxidation potentials, and first- and second- reduction and oxidation potentials separated by between 1,000 to 1,200 mV;
(v) a reduction energy of between $-1.28 \times 10^{-18}$ and $-1.6 \times 10^{-19}$ J (between −8 and −1 eV); and
(vi) a gap between the energies of the highest occupied molecular orbital and lowest unoccupied molecular orbital of between $8 \times 10^{-20}$ and $1.6 \times 10^{-19}$ J (between 0.5 and 1 eV).

8. The memory device according to claim 2, wherein the polyoxometalate has a structure selected from the group consisting of a Wells-Dawson structure, a Lindqvist structure, a Strandberg structure, an Anderson structure, an Allman-Waugh structure, a Weakley-Yamase structure, a Dexter structure, and a Keggin structure, such as a Wells-Dawson structure.

9. The memory device according to claim 2, wherein the polyoxometalate comprises a cage and at least one guest, and each guest has at least one selected from the group consisting of:

(i) at most 10 atoms, such as four atoms;
(ii) at least two different types of atom; and
(iii) at least one selenium heteroatom.

10. The memory device according to claim 9, wherein at least one of the cage and each guest is independently capable of at least one selected from the group consisting of providing, accepting, and providing and accepting at least one electron, such as two electrons, under a potential of between −2,500 mV and 1,500 mV.

11. The memory device according to claim 2, wherein the polyoxometalate shows a UV absorption having a maximum at around 600 to 800 nm.

12. The memory device according to claim 2, comprising a floating gate and a control gate, wherein the control gate is insulated from the floating gate, and the memory device optionally comprises at least one selected from:

(i) a substrate, a source and a drain on the substrate, and an insulating layer on the substrate and separating the substrate from the floating gate; and
(ii) an insulating layer between the floating gate and the control gate.

13. The memory device according to claim 2 which is comprised in an electronic device, and optionally wherein there are a plurality of memory devices according to claim 1 comprised in the electronic device, and when there is a plurality of memory devices, they are optionally electrically connected.

14. A method of using the memory device of claim 2, including at least one step selected from the group consisting of:

(i) a step of providing to the polyoxometalate at least one electron to provide a polyoxometalate in a reduced state; and (ii) a step of accepting from the polyoxometalate at least one electron to provide a polyoxometalate in an oxidised state.

15. The method according to claim 14, comprising at least one of:
(i) the polyoxometalate has a cage structure, and the method comprises reducing the cage;
(ii) the polyoxometalate has a cage structure, and the method comprises oxidising the cage;
(iii) the polyoxometalate has a cage structure and at least one guest, and the method comprises reducing the at least one guest;
(iv) the polyoxometalate has a cage structure and at least one guest, and the method comprises oxidising the at least one guest;
(v) the polyoxometalate has a cage structure and at least one guest, and the method comprises the steps of reducing the cage and subsequently reducing the at least one guest;
(vi) the polyoxometalate has a cage structure and at least one guest, and the method comprises the steps of reducing the cage and subsequently oxidising the at least one guest;
(vii) the polyoxometalate has a cage structure and at least one guest, and the method comprises the steps of oxidising the cage and subsequently reducing the at least one guest;
(viii) the polyoxometalate has a cage structure and at least one guest, and the method comprises the steps of oxidising the cage and subsequently oxidising the at least one guest;
(ix) the polyoxometalate has a cage structure and at least one guest, and the method comprises the steps of reducing the at least one guest and subsequently reducing the cage;
(x) the polyoxometalate has a cage structure and at least one guest, and the method comprises the steps of reducing the at least one guest and subsequently oxidising the cage;
(xi) the polyoxometalate has a cage structure and at least one guest, and the method comprises the steps of oxidising the at least one guest and subsequently reducing the cage;
(xii) the polyoxometalate has a cage structure and at least one guest, and the method comprises the steps of oxidising the at least one guest and subsequently oxidising the cage.

16. The method according to claim 14, comprising at least one of the group consisting of
(i) further reducing a reduced polyoxometalate; and
(ii) further oxidising an oxidised polyoxometalate;
to provide at least one of a multiply reduced polyoxometalate and a multiply oxidised polyoxometalate; and optionally wherein the polyoxometalate has a cage structure and at least one guest and at least one of the following apply:
(i) the step of further reducing a reduced polyoxometalate includes reducing the cage;
(ii) the step of further oxidising an oxidised polyoxometalate includes oxidising the cage;
(iii) the step of further reducing a reduced polyoxometalate includes reducing the at least one guest;
(iv) the step of further oxidising an oxidised polyoxometalate includes oxidising the at least one guest.

17. The method according to claim 14, comprising the step of subsequently returning the polyoxometalate to a previous oxidation state.

18. A memory device comprising a polyoxometalate, wherein the polyoxometalate is capable of at least one of the group selected from providing at least one electron, accepting at least one electron, and providing and accepting at least one electron; and wherein the polyoxometalate has at least one selected from the group of
(i) a reduction energy of between $-1.28 \times 10^{-18}$ and $-1.6 \times 10^{-19}$ J (between $-8$ and $-1$ eV); and
(ii) a gap between the energies of the highest occupied molecular orbital and lowest unoccupied molecular orbital of between $8 \times 10^{-20}$ and $1.6 \times 10^{-19}$ J (between 0.5 and 1 eV);
(iii) the polyoxometalate comprises a cage and one or more guests, each guest having at least one heteroatom, such as a selenium heteroatom.

\* \* \* \* \*